(12) United States Patent
Narahara et al.

(10) Patent No.: US 8,888,913 B2
(45) Date of Patent: Nov. 18, 2014

(54) METHOD OF MANUFACTURING EPITAXIAL SILICON WAFER AND APPARATUS THEREFOR

(75) Inventors: Kazuhiro Narahara, Nagasaki (JP); Hirotaka Kato, Nagasaki (JP); Koichiro Hayashida, Nagasaki (JP)

(73) Assignee: Sumco Techxiv Corporation, Kanagawa (JP)

( * ) Notice: Subject to any disclaimer, the term of this patent is extended or adjusted under 35 U.S.C. 154(b) by 230 days.

(21) Appl. No.: 13/206,310

(22) Filed: Aug. 9, 2011

(65) Prior Publication Data
US 2012/0015454 A1 Jan. 19, 2012

Related U.S. Application Data

(62) Division of application No. 11/731,815, filed on Mar. 30, 2007, now Pat. No. 8,021,484.

(30) Foreign Application Priority Data

Mar. 30, 2006 (JP) .................................... 2006-95717
Mar. 30, 2006 (JP) .................................... 2006-95718

(51) Int. Cl.
*C30B 21/02* (2006.01)
*C30B 23/06* (2006.01)
*C23C 16/458* (2006.01)
*C30B 25/12* (2006.01)
*C23C 16/24* (2006.01)

(52) U.S. Cl.
CPC .............. *C23C 16/24* (2013.01); *C30B 23/063* (2013.01); *C23C 16/4586* (2013.01); *C23C 16/4585* (2013.01); *C30B 25/12* (2013.01)
USPC .................... 117/86; 117/90; 117/91; 117/94; 117/95

(58) Field of Classification Search
USPC ..................................... 117/86, 90, 91, 94, 95
See application file for complete search history.

(56) References Cited

U.S. PATENT DOCUMENTS 6,063,196 A * 5/2000 Li et al. .......................... 118/712
6,200,872 B1 3/2001 Yamada
(Continued)

FOREIGN PATENT DOCUMENTS

JP 04-367238 12/1992
JP 11-168106 6/1999
(Continued)

OTHER PUBLICATIONS

Office Action mailed Aug. 23, 2011 in related Japanese Patent Application No. 2007-094132.
(Continued)

*Primary Examiner* — Bob M Kunemund
(74) *Attorney, Agent, or Firm* — Alston & Bird LLP

(57) ABSTRACT

A method of forming an epitaxial layer to increase flatness of an epitaxial silicon wafer is provided. In particular, a method of controlling the epitaxial layer thickness in a peripheral part of the wafer is provided. An apparatus for manufacturing an epitaxial wafer by growing an epitaxial layer with reaction of a semiconductor wafer and a source gas in a reaction furnace comprising: a pocket in which the semiconductor wafer is placed; a susceptor fixing the semiconductor; orientation-dependent control means dependent on a crystal orientation of the semiconductor wafer and/or orientation-independent control means independent from the crystal orientation of the semiconductor wafer, wherein the apparatus may improve flatness in a peripheral part of the epitaxial layer.

21 Claims, 41 Drawing Sheets

(56) References Cited

U.S. PATENT DOCUMENTS

| | | |
|---|---|---|
| 6,277,193 B1 | 8/2001 | Sadamitsu et al. |
| 6,277,501 B1 | 8/2001 | Fujikawa |
| 7,182,809 B2 | 2/2007 | Haga et al. |
| 2007/0169683 A1 | 7/2007 | Haga et al. |
| 2008/0131605 A1 | 6/2008 | Nasu et al. |

FOREIGN PATENT DOCUMENTS

| | | |
|---|---|---|
| JP | 11-274162 | 10/1999 |
| JP | A-2001-302395 | 10/2001 |
| JP | 2002-020200 | 1/2002 |
| JP | 2004-119446 | 4/2004 |
| JP | 2005-244127 | 9/2005 |
| JP | A-2005-353665 | 12/2005 |
| JP | 2001-253797 | 9/2011 |
| WO | WO 98/05063 | 2/1998 |
| WO | WO 98/25299 | 6/1998 |
| WO | WO 03/000962 | 1/2003 |

OTHER PUBLICATIONS

Search Report of related Taiwanese Patent Application No. 096111287.

Office Action dated Sep. 6, 2010 of related Taiwanese Patent Application No. 096111287.

File History from U.S. Appl. No. 11/793,155 (Total pp. 227).

* cited by examiner

Periodicity of crystal orientation of (100) silicon wafer

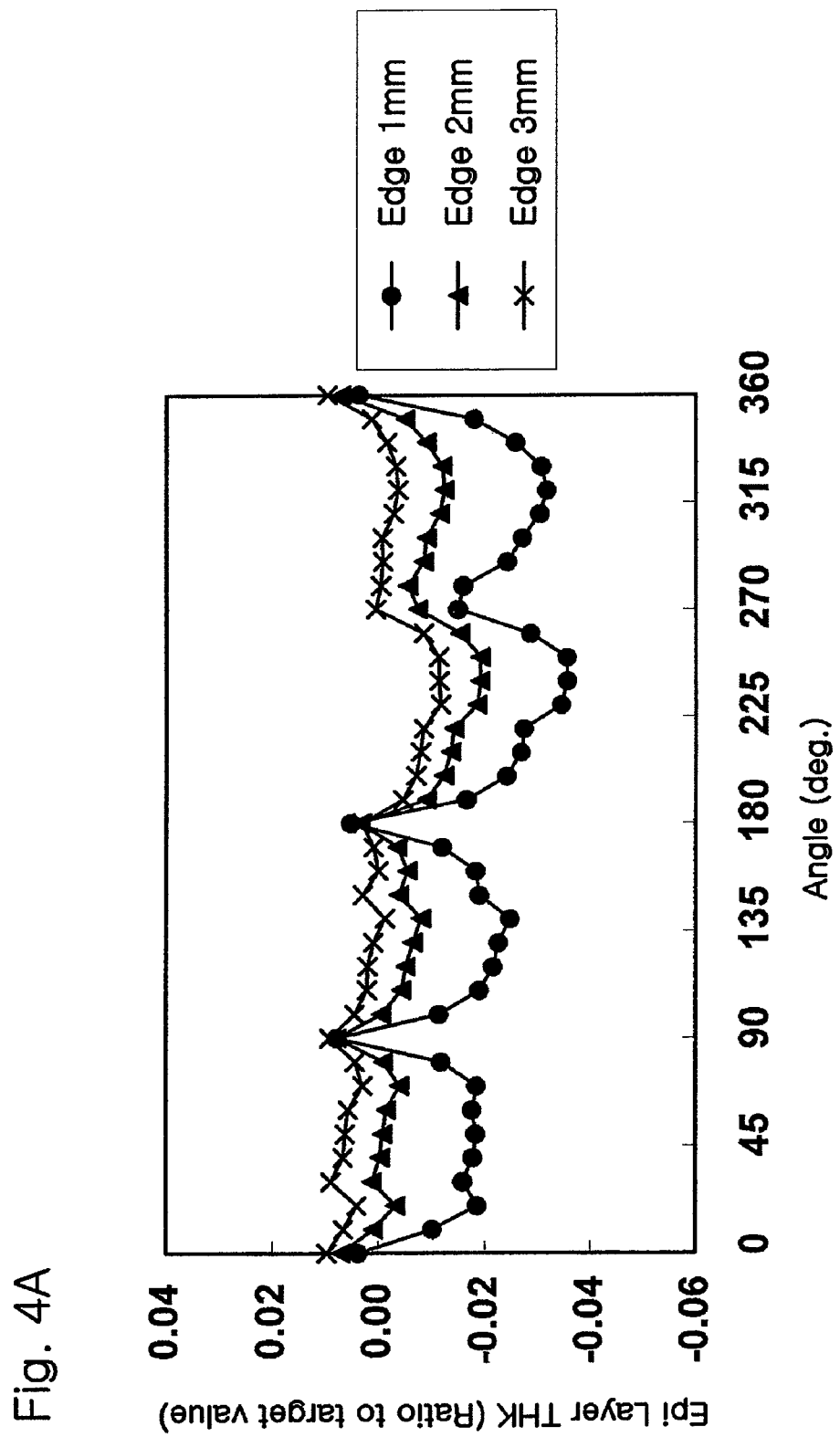

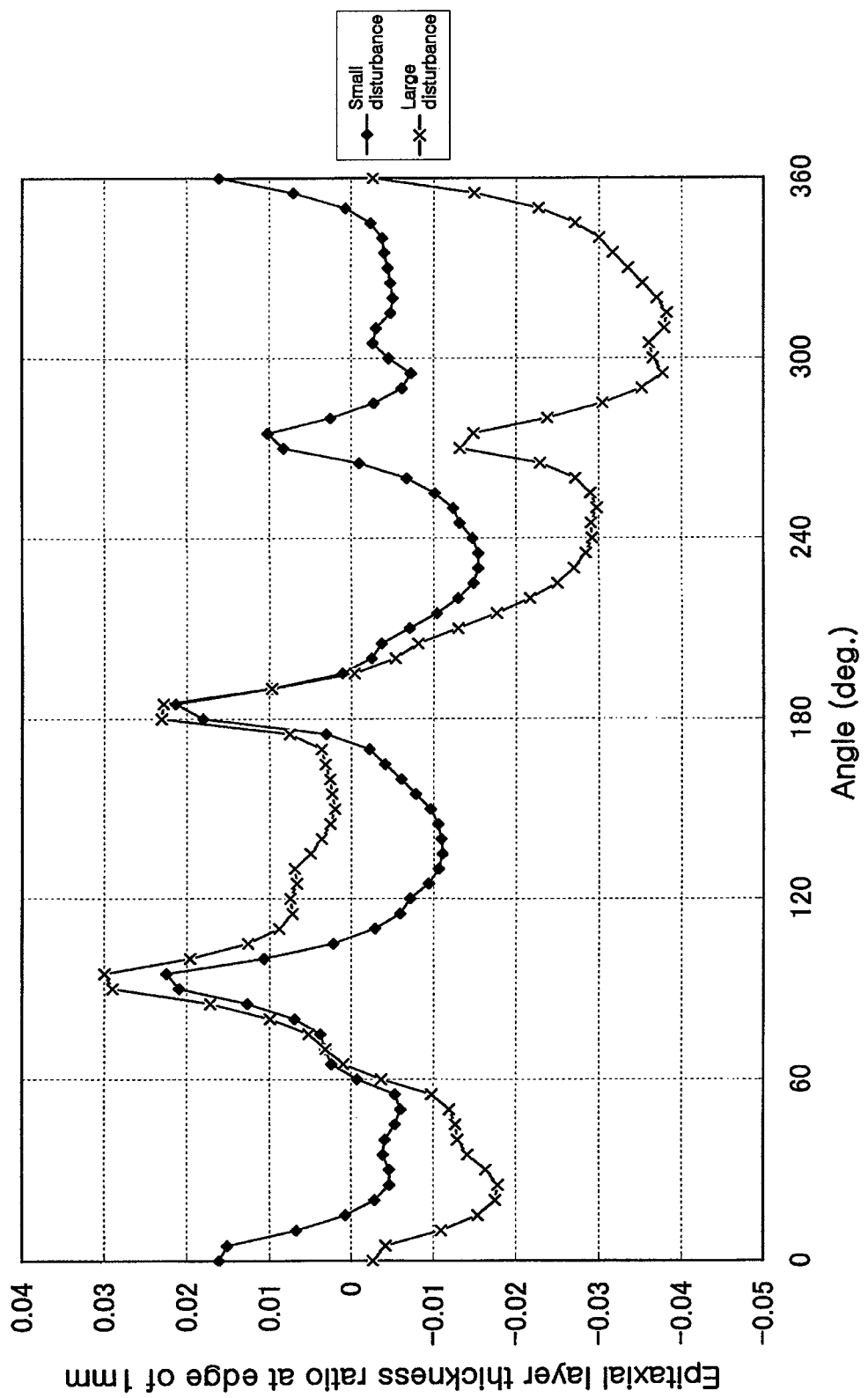

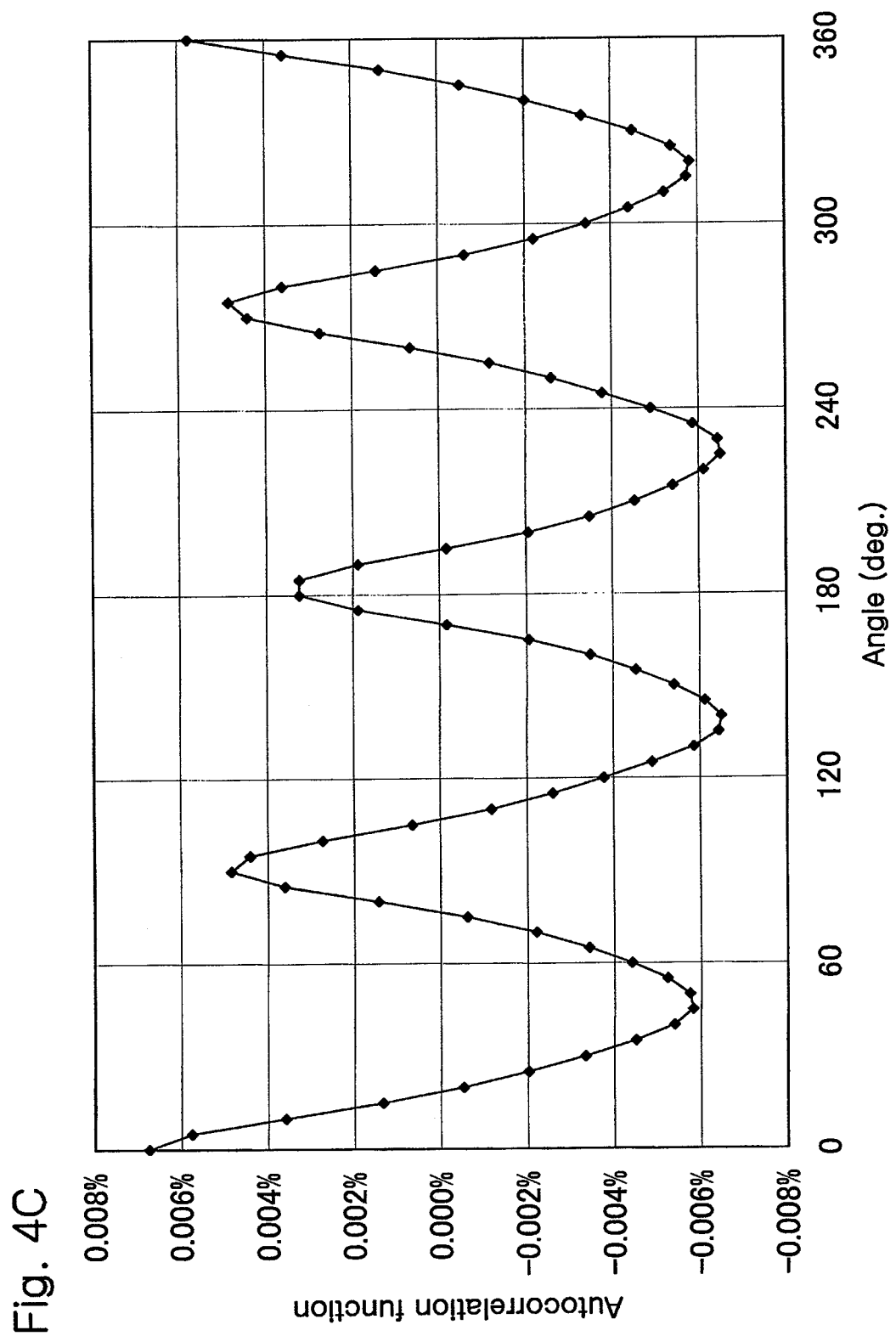

Relation between distribution of epitaxial layer thickness of angle periodicity and epitaxial growth condition Epitaxial layer thickness distribution at edge of the grown wafer with TCS concentration of 2.3% and in high temperature Thickness distribution of angle periodicity of the grown product at low temperature susceptor for thickness distribution reduction of angle periodicity for (110) silicon wafer Thickness distribution of angle periodicity

METHOD OF MANUFACTURING EPITAXIAL SILICON WAFER AND APPARATUS THEREFOR

CROSS REFERENCE TO RELATED APPLICATIONS

This application is a division of U.S. patent application Ser. No. 11/731,815 filed Mar. 30, 2007 now U.S. Pat. No. 8,021,484, which is hereby incorporated herein in its entirety by reference and is based upon and claims the benefits of priorities from Japanese Patent Application Nos. 2006-95717 and 2006-95718 filed on Mar. 30, 2006, the entire contents of which are incorporated herein by reference.

FIELD OF THE INVENTION

The present invention relates to a method and apparatus for manufacturing an epitaxial wafer, and more specifically relates to the method and apparatus for manufacturing an epitaxial wafer with high flatness.

BACKGROUND

In general, the epitaxial silicon wafer has excellent characteristics such that neither defects arising from oxygen nor Grown-in defects (including COP) introduced during single crystal ingot growth are included in a surface epitaxial layer thereof where the device is made.

In recent years, epitaxial silicon wafers are being used for high-performance devices such as MPUs and flash memories and high-performance power devices such as MOS FETs and IGBTs. On the other hand, high flatness is considered particularly important for improvement of semiconductor substrate quality and for preparation of a microfabrication pattern in accordance with higher integration.

As for the epitaxial growth in a wafer in which high flatness is required, improvement in layer thickness uniformity is pursued by single wafer processing. Moreover, layer thickness uniformization is further attempted by controlling the flow of gas for epitaxial growth by a partition and the like (for example, Japanese Unexamined Patent Application Publication No. 2005-353665).

However, it is likely that the edge part of a silicon single crystal wafer to serve as a substrate shows an abrupt change in the thickness of the formed epitaxial layer and hence it is difficult to secure the flatness in the edge part.

Moreover, since it is likely that the vicinity of the edge part (or the outer circumferential part) of a semiconductor wafer (for example, a silicon single crystal wafer) to serve as a substrate shows an abrupt change in the thickness of the formed epitaxial layer due to various factors, and it is difficult to achieve the layer thickness uniformity only by the uniformization of the flow of gas for epitaxial growth.

Therefore, a number of methods of optimizing epitaxial growth conditions to reduce the unevenness in the distribution of the layer thickness have been proposed, but it is hard to say that they are good enough. Since a flattening process after the epitaxial growth cannot be performed when the grown wafer is found to have unsatisfactory flatness is obtained. Therefore, such wafer is deemed to be defective so as to become a waste.

For example, a method of manufacturing an epitaxial silicon wafer is proposed in which a substrate satisfying a desired flatness is sent to a predictive process of simulating the substrate flatness after epitaxial growth, the substrate determined to satisfy the substrate flatness after the layer formation as the objective is sent to the subsequent epitaxial growth process, and the substrate determined not to satisfy the substrate flatness is sent to the flattening process again (for example, Japanese Unexamined Patent Application Publication No. 2005-353665, Japanese Unexamined Patent Application Publication No. 2001-302395).

However, Japanese Unexamined Patent Application Publication No. 2001-302395 does not disclose concretely a method of simulating film formation in the epitaxial growth. In general, simulation of the layer formation is not necessarily easy since various factors interact with each other. Therefore, it is very difficult, by using the method of Japanese Unexamined Patent Application Publication No. 2005-353665, to perform the simulation in order to predict the flatness of the epitaxial silicon wafer on which the epitaxial layer is formed.

SUMMARY OF THE INVENTION

In consideration of the aforementioned, an apparatus and a method for forming an epitaxial layer to improve uniformization of the thickness of an epitaxial silicon wafer and, in particular, an apparatus and a method for controlling the epitaxial layer thickness of a wafer edge part may be provided.

According to the present invention, the epitaxial layer thickness of the wafer edge part may be controlled and uniformized. This invention was made only after it was found that it was not sufficient just to uniformize the flow of gas for the conventional epitaxial growth. That is, the present invention has a background that there are demands for uniformizing epitaxial layer thickness even in the edge part which is cut off conventionally in order to make the useable area of the epitaxial wafer wider. Even if thickness is uniform in the inner part of a wafer, a huge change such as sharp reduction and the like of the epitaxial layer thickness at the outer circumferential part and its vicinity may be caused in accordance with a huge change of the shape (for example a large change of thickness such as chamfered edge). The flat area of the wafer may be made wider by shifting a point of the change in the epitaxial layer thickness (thickness including the substrate) toward more outer circumferential side as far as possible. It was also found that the epitaxial layer thickness in the wafer edge part increases or decreases periodically with respect to the crystal orientation. If this increase and decrease of the thickness would be reduced, the flat area of the wafer could be made larger. Here, the periodic increase and decrease are caused by different formation rates of the epitaxial layer according to the crystal orientation. Therefore, it is not sufficient just to uniformize the gas flow as a whole, but it is preferable to perform more precise control based on the crystal orientation.

The epitaxial layer thickness in the useful wafer edge part as mentioned above may be controlled by using, independently or combinedly as appropriate, an orientation-dependent control method or orientation-dependent control means which changes along the circumferential direction of the outer circumference of the wafer, or an orientation-independent control method or orientation-independent control means which is independent of the circumferential direction of the outer circumference of the wafer. Further, the epitaxial layer thickness of this wafer edge part may be controlled by changing a peripheral member such as a wafer substrate and a susceptor; environmental condition such as a flow rate and concentration and temperature of a raw material gas such as trichlorosilane; or a combination thereof.

The above-mentioned orientation-dependent control method or orientation-dependent control means includes, for example, according to the crystal orientation, periodically changing or what is periodically changed in, the configuration and/or structure, other properties, or the like of the susceptor fixed uniquely to the crystal orientation by fixing the semiconductor wafer substrate to the susceptor. On the other hand, the orientation-independent control method or orientation-independent control means includes, for example, controlling or what is controlled in, the structure and/or shape of the susceptor and the environmental conditions from the crystal orientation.

The further features, characteristics, and various advantages of the present invention will be apparent with reference to the attached drawings and the following preferable embodiment.

BRIEF DESCRIPTION OF THE DRAWINGS

FIG. 4A is a graph in which thickness of an epitaxial wafer is developed and plotted against angle.

FIG. 4B is a graph in which thickness of another epitaxial wafer is developed and plotted against angle.

FIG. 4C is a graph in which autocorrelation function of layer thickness of an epitaxial wafer with small outside disturbance of angle periodicity is plotted against angle.

DETAILED DESCRIPTION

Figure 1:
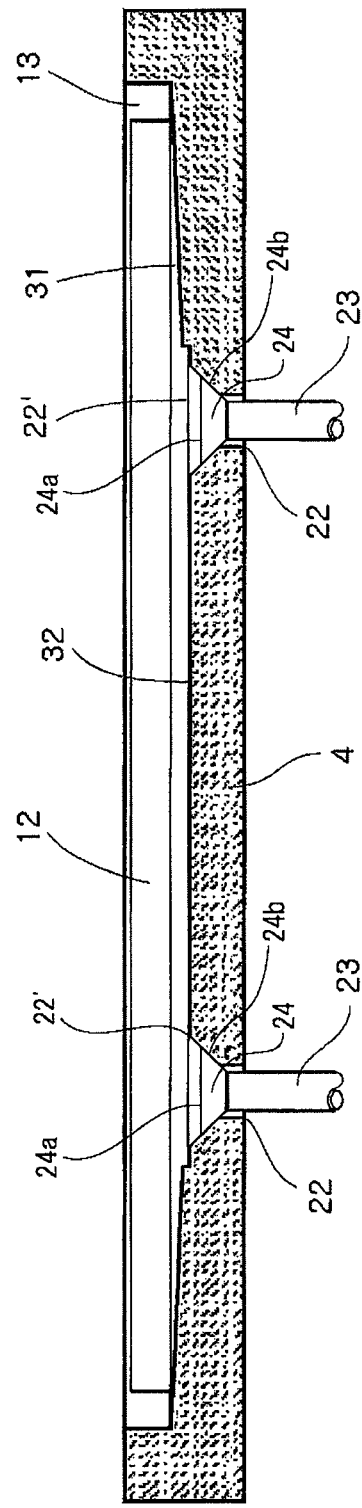
FIG. 1 is a longitudinal cross section view illustrating in general an epitaxial wafer manufacturing device according to the present application.

In the following, the embodiments according to the present invention are described in more detail with reference to the drawings. Like reference numerals refer to like elements, and overlapping description is omitted.

FIG. 1 is a drawing schematically showing a longitudinal cross section of a susceptor 4. The bottom of a pocket 13 which is an opening of the susceptor 4 comprises a shelf part and a tapered face as explained in the following. For example, in an apparatus used for growing an epitaxial layer on a wafer having a diameter of 300 mm, a disk member with a diameter of 350 to 400 mm and a thickness of 3 to 6 mm is used as the susceptor 4.

The pocket 13 of a circular recess is formed 20 to 40 mm inner toward the center from the outer circumference of the top face of the susceptor 4 such that the pocket receives a semiconductor wafer 12 which serves as a substrate and a tapered face 31 is provided on the bottom thereof. The tapered face 31 is gently inclined.

A shelf part 32 which is formed in another circular recess is further provided inside of the tapered face 31 toward the center. This shelf part 32 is a circular flat face provided at slightly lower than the tapered face 31, and is a horizontal face parallel to the top face of the susceptor 4.

Three through-holes 22 are provided in the shelf part 32 although only two of them are shown in FIG. 1 for convenience of explanation. The upper part of each through-hole 22 forms a countersink hole 22' which is expanding and opening upward. Lift pins 23 for wafer support are inserted into the three through-holes 22, respectively. The bore diameter of the through-holes 22 is made larger than the diameter of the lift pins 23 so that the lift pins 23 do not come in contact with the through-hole walls when the lift pins move up and down relative to the susceptor 4.

The lift pins 23 is composed of quartz, carbon C, silicon carbide SiC, or the like. Each of the lift pins 23 has a shape of a pillar or a cylinder, and is provided with a head 24 having a tapered face 24*b* at a lower outer circumference so as to fit the countersink hole 22'. The taper angle of the tapered face 24*b* of this head 24 matches the taper angle of the tapered face of the countersink hole 22'.

The top part 24*a* of the head 24 has a conical shape having an obtuse vertex angle, and prevents generation of scratches on the rear surface of the wafer by the lift pins 23 by making very small a contact surface at the time of supporting the wafer rear surface. Each of the lift pins 23 engages with the inner wall of the countersink hole 22' of the susceptor 4 at its head 24, and is suspended perpendicularly by self weight in the state the lift pin 23 has descended. In this state, the upper part 24*a* of the head 24 does not protrude from the upper surface of the shelf part 32.

Figure 2:
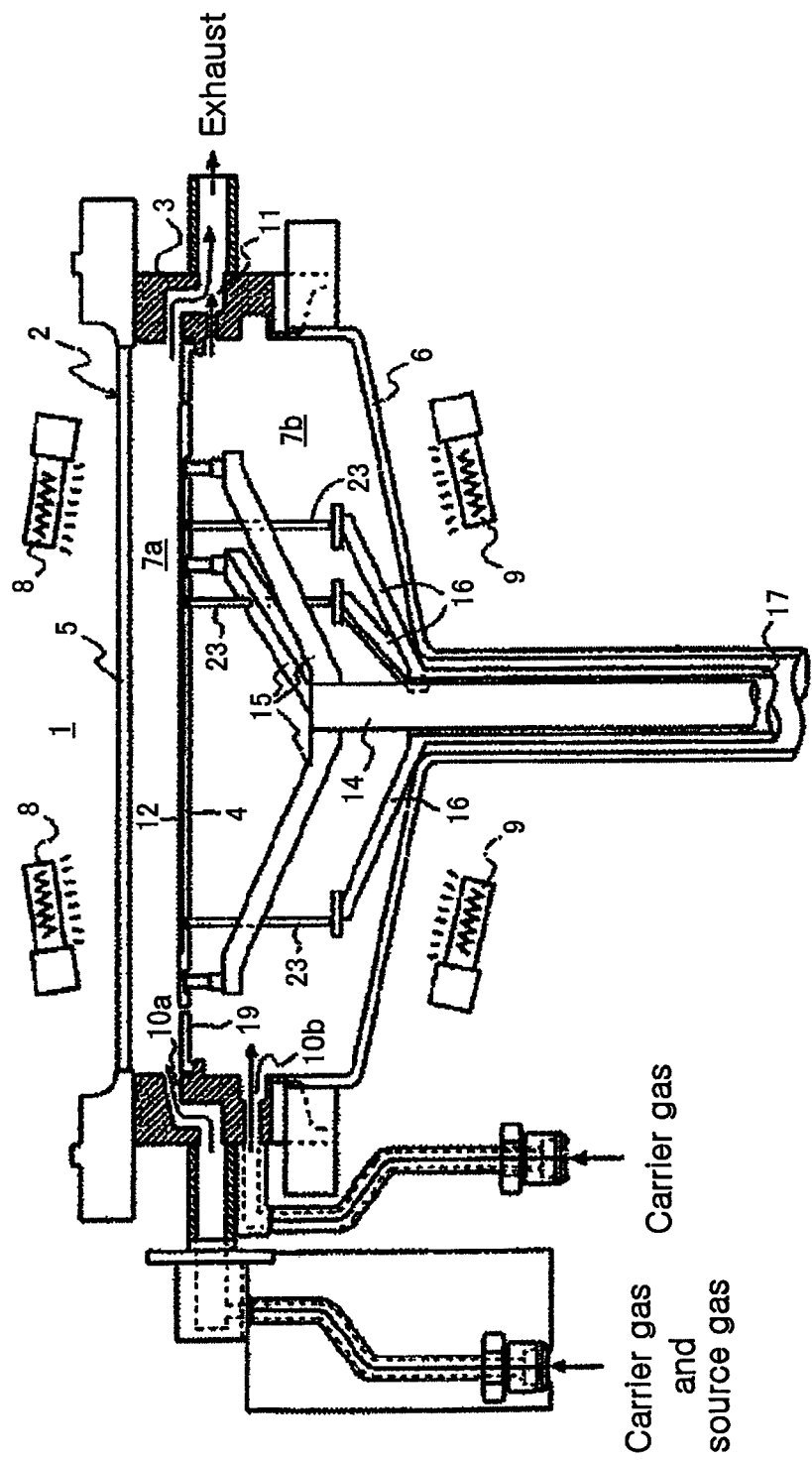
FIG. 2 is a longitudinal cross section view illustrating in general a susceptor.

FIG. 2 is a longitudinal cross section schematically showing the structure of an epitaxial wafer manufacturing apparatus 1 where the susceptor 4 and the like of FIG. 1 is used. In this epitaxial wafer manufacturing apparatus of single wafer type, the susceptor 4 (wafer support table) which supports only one wafer horizontally is generally provided in a processing chamber 2. In order to transport a wafer 12 onto the susceptor 4, a lift mechanism for moving the wafer 12 up and down relative to the susceptor 4 is provided. The lift mechanism has a plurality of lift pins 23 which extend by penetrating the susceptor 4. The wafer 12 is placed on the upper end of these lift pins 23, and is raised or lowered by moving the lift pins 23 up and down relative to the susceptor 4. By using such a lift mechanism, the wafer 12 which has been placed on the hand of a transport arm and transported into the chamber 2 can be transferred onto the susceptor 4 or, on the contrary, the wafer 12 can be transferred from the susceptor 4 to the hand.

In order to grow an epitaxial layer, it is necessary to heat the wafer 12 supported on the susceptor 4 to high temperature. For this purpose, a number of heat sources 8 and 9 such as halogen lamps (infrared lamps) and the like are arranged to the upper and lower sides of the processing chamber 2 to heat the susceptor 4 and wafer 12.

The susceptor 4 is produced by applying a coating layer of silicon carbide SiC to a substrate of carbon C, and serves as a uniformizing disc for keeping the entire wafer 12 in the uniform temperature when the wafer 12 is being heated. As shown in FIG. 1, a pocket 13 which is somewhat larger than the wafer 12 and is a recess about 1 to 2 mm deep is formed on the upper surface of the susceptor 4 in order to store a silicon wafer, for example. The bottom face of this pocket 13 has a tapered face so that the pocket 13 comes in contact only with the outer circumferential part of the semiconductor wafer 12, thereby reducing the face contact of the bottom face and wafer 12 to the utmost. An epitaxial layer essentially consisting of a silicon thin film grows on the surface of the wafer 12 by accommodating the wafer 12 in this recess and holding the susceptor 4 at predetermined temperature in a carrier gas including raw material gases. The raw material gases refer to a silicon source gas and dopant gas.

It is common to use a chlorosilane-based gas such as trichlorosilane $SiHCl_3$ or dichlorosilane $SiH_2Cl_2$ for the silicon source gas, and diborane (P-type) or phosphine (N-type) for the dopant gas. These gases are introduced into the chamber with hydrogen $H_2$, which serves as a carrier gas.

The chamber 2 is formed by pressing a cylindrical base ring 3 from the upper and lower sides with a disc-like top window 5 and a lower saucer-like window 6, and an internal closed space forms a reactor. Translucent quartz is used for the top window 5 and lower window 6 so that light from heat sources may not be interrupted. The reactor formed in the chamber 2 is roughly divided into a top chamber 7*a* which is a space above the wafer 12, and a lower chamber 7*b* which is a space below the wafer 12.

Further, heat sources 8 and 9 which heat the reactor are provided to the upper and lower sides of the chamber 2. In the present embodiment, the upper and lower heat sources 8 and 9 are respectively composed of a plurality of halogen lamps (infrared lamps).

The chamber 2 includes the susceptor 4 which supports the wafer 12 in the upper part. When seen from the upper side, the susceptor 4 looks like a disk, and the diameter thereof is larger than the wafer 12. The pocket 13 which is a circular concave opening for storing the wafer 12 is formed on the upper face of the susceptor 4. The susceptor 4 is produced by applying a coating layer of silicon carbide SiC to a substrate of carbon C, and serves as a uniformizing disc for keeping the entire wafer 12 in the uniform temperature when the wafer 12 is heated. Therefore, the susceptor 4 has a thickness and thermal capacity several times those of the wafer 12. Moreover, the susceptor 4 stays generally at temperature higher than the temperature of the wafer 12.

The susceptor 4 rotates around a vertical axis as a center of rotation in a surface parallel to the plate surface of the wafer 12 during an epitaxial layer growth treating operation so that a uniform epitaxial layer may be formed on the upper face of the wafer 12. The center of the pocket 13 provided to the susceptor 4 coincides naturally with the center of rotation of the susceptor 4.

Below the susceptor 4, a cylindrical pillar-like or cylindrical susceptor support shaft 14 to serve as the rotating axis of the susceptor 4 is arranged perpendicularly, and at the upper part of the susceptor support shaft 14, three susceptor arms 15 which support the susceptor 4 horizontally are provided. The three susceptor arms 15 are radially arranged so that the arms form an angle of 120° when the arms 15 are seen from the upper part, and upward projecting portions provided at the tip of respective susceptor arms 15 support the susceptor 4 by abutting with the lower surface of the susceptor 4.

The susceptor support shaft 14 is vertically arranged at a location where the shaft axial center and the disk center of the susceptor 4 coincide, and the susceptor 4 rotates by rotation of the susceptor support shaft 14. The rotation of the susceptor support shaft 14 is activated by a rotation drive mechanism which is not shown. The susceptor support shaft 14 and susceptor arm 15 are formed of translucent quartz so that light from the lower heat source 9 may not be interrupted.

(Measurement of Layer Thickness Distribution)

Figure 3A:
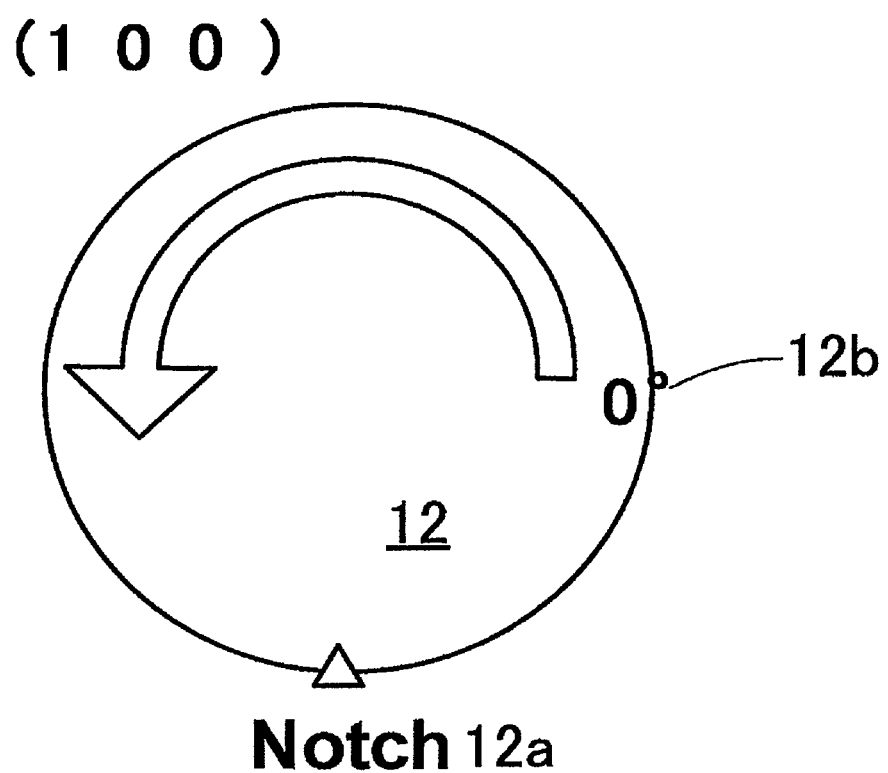
FIG. 3A is a plan view of a semiconductor wafer.
Figure 3B:
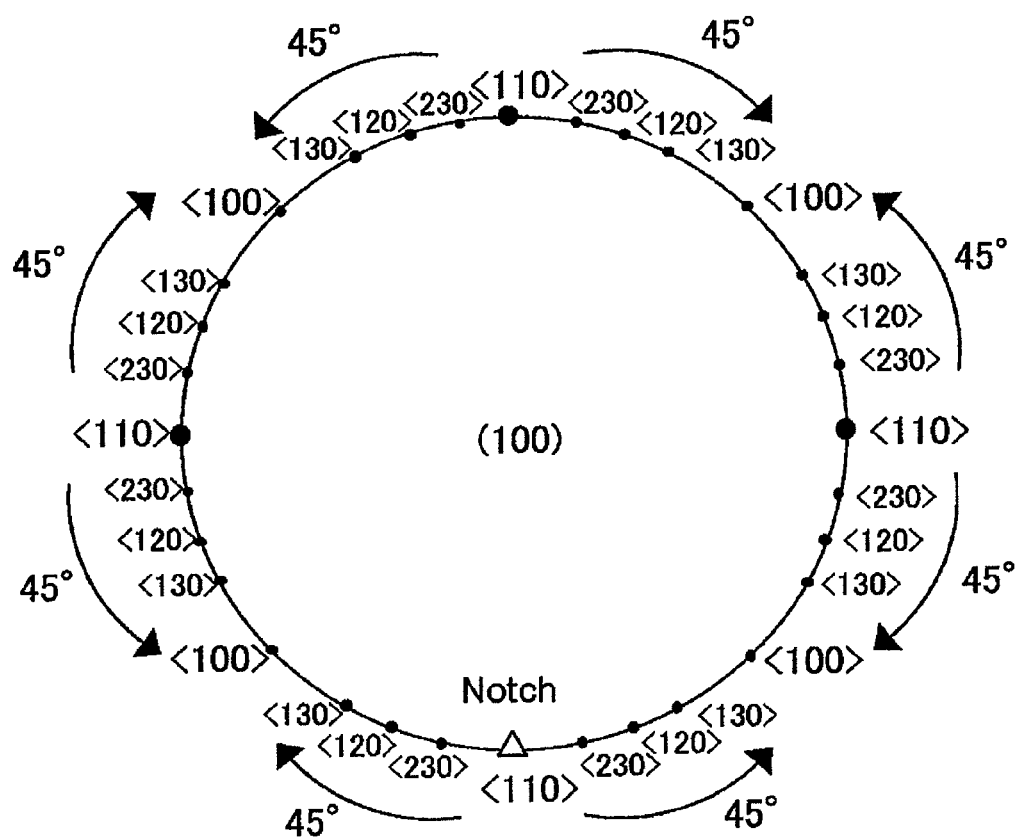
FIG. 3B is a view showing a crystal orientation of the semiconductor wafer.

FIGS. 3A and 3B are the top views of a semiconductor wafer (silicon single crystal wafer) 12 to serve as the substrate of an epitaxial wafer. The semiconductor wafer 12 is set to a susceptor so that an epitaxial layer formation face (100) is directed upward. In order to explicitly show the crystal orientation in the epitaxial layer formation face, a notch 12a is stamped. When the crystal orientation is designated in the present description, layer thickness distribution is presented in terms of crystal orientation and the like by assuming an original point 12b to be 0 degree and using angles up to 360 degrees counterclockwise, as shown in the top view of this semiconductor wafer 12. FIG. 3B is a diagram showing the crystal orientation designated by the Miller indices of the same wafer. This diagram shows that mirror-symmetric crystal orientation is repeated every 45 degrees starting from 0 degree, and crystal orientation is repeated with a 90 degree cycle. Thus it is expected that crystal orientation-dependent layer thickness distribution is repeated with a 90 degree cycle and a change having a mirror symmetry is repeated every 45 degrees.

FIG. 4A shows a graph in which a change of epitaxial layer formation thickness from an average layer thickness in terms of a ratio to a layer thickness target value is plotted as a function of the angle of FIG. 3 (likewise in similar graphs to be described hereinafter). The vertical axis represents the epitaxial layer formation thickness and the horizontal axis represents the angle of FIG. 3. In the figure, black circles show epitaxial layer formation thickness at locations 1 mm inward from the outer circumference, black triangles show epitaxial layer formation thickness at locations 2 mm inward from the outer circumference, and crosses show epitaxial layer formation thickness at locations 3 mm inward from the outer circumference, all as a function of the angles of FIG. 3A.

This epitaxial layer was formed by fixing the semiconductor wafer 12 as shown in FIG. 3A to a regular susceptor in an epitaxial wafer manufacturing apparatus of single wafer type shown in FIG. 2. Since a general type susceptor normally used for the apparatus of FIG. 2 was also used in this case, the structure and/or shape and the like in the vicinity of the inner circumferential face 13b of the opening of a pocket 13 does not change with a cycle of about 90 degrees, but stayed practically uniform from 0 to 360 degrees.

The diagram shows that the thickness has maxima at 0 degree (360 degrees), 90 degrees, 180 degrees, and 270 degrees, and valleys at 45 degrees, 135 degrees, 230 degrees and 315 degrees. The influence of crystal orientation on a layer formation rate is evident. In particular, in the plot with black circles which represent data close to the outer circumference, this effect is large, and it turns out that the influence becomes larger toward the outer circumference. Consequently, the uniformity of epitaxial layer thickness distribution of a wafer edge part deteriorates due to layer thickness variation with angular periodicity. Estimation of this degree of variation of the epitaxial layer thickness distribution using the next formula (formula 1) shows that the variation in the layer thickness distribution of the location 1 mm apart from the outer circumference is Δt=2.01%.

$$\Delta t = \frac{(\text{Max} - \text{Min})}{(\text{Max} + \text{Min})} \quad \text{(Formula 1)}$$

FIG. 4B shows a plot of the thickness of the formed epitaxial layer at a location 1 mm apart from the outer circumference toward the inside, in the same way as in FIG. 4A. Black circles show a case where disturbance without angular periodicity is small, and crosses show a case where disturbance without angular periodicity is large. Similar to FIG. 4A, the vertical axis shows deviation of epitaxial layer thickness from the target value by taking a ratio to the layer thickness target value. That is, a thickness ratio of 0 means that the layer thickness is identical to the target thickness, and a thickness ratio of +0.02 means that the layer thickness is thicker than the target thickness by 0.02 as a ratio to the target thickness. Similarly to FIG. 4A, a graph plotted by black circles shows that thickness has maxima at 0 degree (360 degrees), 90 degrees, 180 degrees and 270 degrees and valleys at 45 degrees, 135 degrees, 230 degrees and 315 degrees. The influence of crystal orientation on the layer formation rate is evident. On the other hand, a graph plotted by crosses shows similar maxima, but a slow decline from 0 to 360 degrees is also shown. In order to analyze periodicity in such a plot, the following regular autocorrelation function (formula 2) is used.

$$R(\tau) = \int_{-\infty}^{\infty} x(t) \cdot x(t+\tau) \, dt \quad \text{(Formula 2)}$$

Formula (2) is used in the continuous system of signals. When a discrete system in which signals are sampled is considered, the next Formula (3) is used.

$$R(k) = \frac{1}{N} \sum_{n=0}^{N-1} x(n) \cdot x(n+k), \quad \text{(Formula 3)}$$

$$\{k = 0, 1, 2, \ldots, N-1\}$$

Figure 4D:
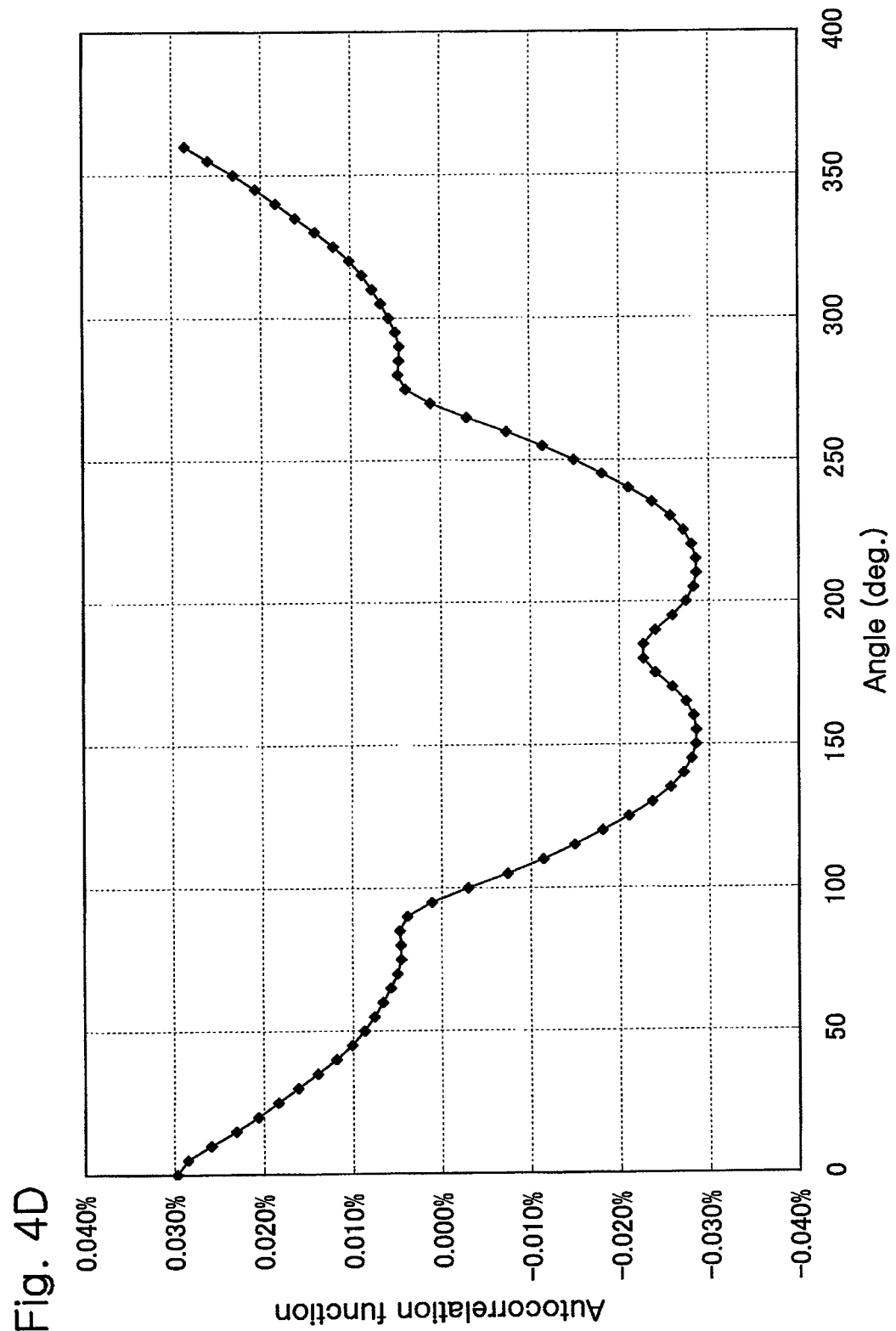
FIG. 4D is a graph in which autocorrelation function of layer thickness of an epitaxial wafer with large outside disturbance of angle periodicity is plotted against angle.

In this case, the layer thickness distribution in the circumferential direction can be expressed with a periodic function which returns to an original value at 360 degrees, numerical processing using an original measurement value at 360 degrees can be performed. Values of thus determined correlation function are plotted as a function of the angle in FIG. 4C (small disturbance without angular periodicity), and FIG. 4D (large disturbance without angular periodicity). In these graphs, the horizontal axis stands for the angle, and the vertical axis shows the relative value obtained by taking a certain value as a reference. That is, a value of 0% is identical with the certain value taken as the reference, and a value of −0.002% is smaller than the value by 0.002%. These graphs show that maxima appear every 90 degrees and layer thickness distribution is changing with a 90 degree cycle. Comparison of FIGS. 4C and 4D shows that the amplitude in FIG. 4C is considerably larger.

Considering that the layer thickness distribution shows a change of 45 degree symmetry as mentioned above, the data of FIG. 4B is re-arranged. That is, the data from 0 to 45 degrees is left as it is, and the data from 45 to 90 degrees is made to correspond to reversed data from 45 degrees to 0 degrees, the data from 90 degrees to 135 degrees is made to correspond to the data from 0 to 45 degrees, the data from 135 degrees to 180 degrees is made to correspond to the reversed data from 45 degrees to 0 degrees, the data from 180 degrees to 225 degrees is made to correspond to the data from 0 to 45 degrees, the data from 225 degrees to 270 degrees is made to correspond to the reversed data from 45 degrees to 0 degrees, the data from 270 degrees to 315 degrees is made to correspond to the data from 0 to 45 degrees, and the data from 315 degrees to 360 degrees is made to correspond to the reversed data from 45 degrees to 0 degree. In the graph in which such data are plotted, homothetic curves may be drawn as they can be moved in parallel up and down to overlap with each other, and a group of curves representing data where disturbance without angular periodicity is large shows larger variation in the upper and lower directions.

Figure 4E:
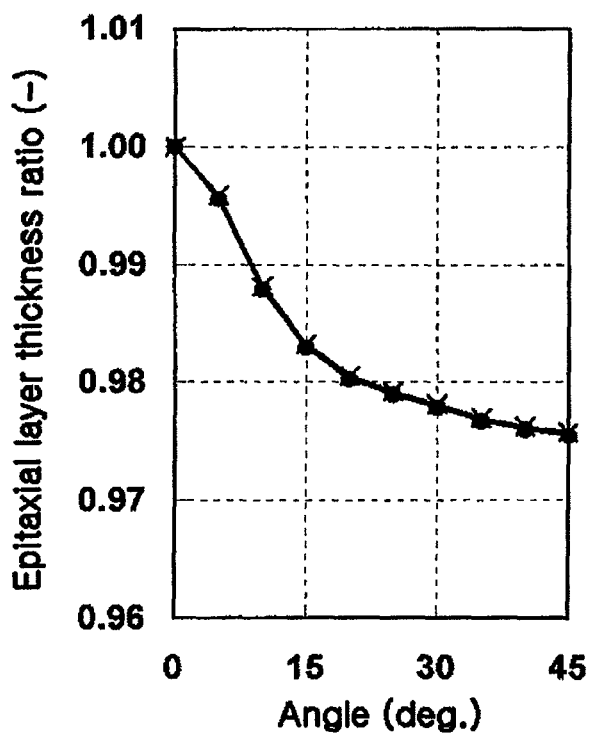
FIG. 4E is a graph in which average distribution of layer thickness obtained by a folding method of 45-degree.

When the arithmetic mean (or arithmetic average) of the thicknesses which correspond to thicknesses of 0 to 45 degrees is calculated for data which has small disturbance without angular periodicity, and data which is subject to large disturbance without angular periodicity and the mean value is plotted in a range of 0 to 45 degrees, the data which is subject to small disturbance without angular periodicity and the data which is subject to large disturbance without angular periodicity yield homothetic curves as they can be shifted upward and downward to overlap with each other. When both sets of data are normalized using the layer thickness at 0 degree as a normalization factor and the layer thickness ratios are plotted in a range of 0 to 45 degrees, a graph shown in FIG. 4E is obtained. This figure shows that the plotted data which is subject to small disturbance without angular periodicity and the plotted data which is subject to large disturbance without angular periodicity roughly overlap with each other. Thus, it is made clear that disturbance without angular periodicity is practically independent of the disturbance with angular periodicity. Moreover, it is expected that the variation in layer thickness distribution can be reduced if the disturbance with angular periodicity can be removed or canceled.

Figure 4F:
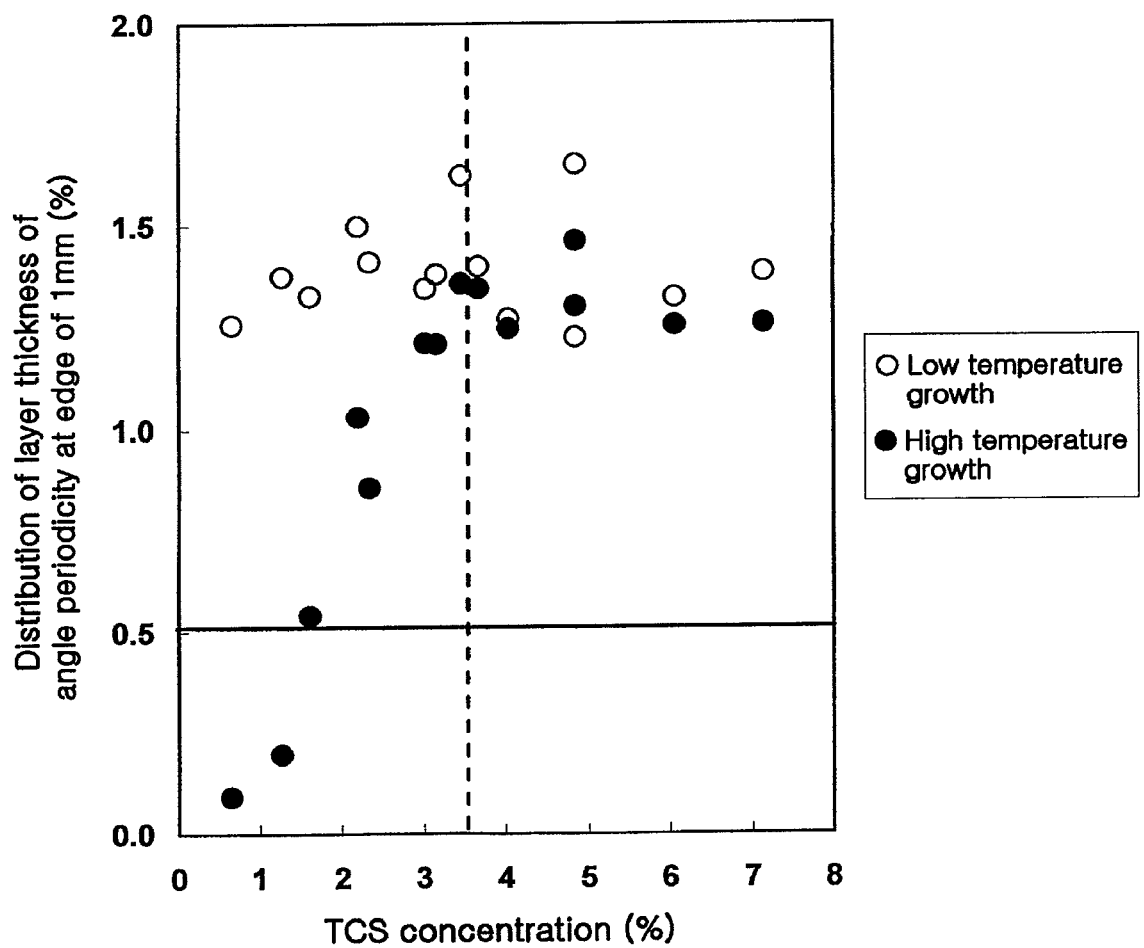
FIG. 4F is a graph in which static dispersion of distribution of layer thickness of grown epitaxial wafers in different temperatures.

Next, the variation in the layer thickness distribution of epitaxial wafers which were prepared by changing trichlorosilane concentration and temperature conditions was examined by using the same apparatus provided with a susceptor having no angular periodicity. FIG. 4F shows the variation of layer thickness distribution with angular periodicity of the edge part (1 mm from the edge part) when epitaxial growth is conducted by changing trichlorosilane concentration at high temperature and low temperature. This diagram shows that, in the high temperature growth, variation becomes smaller and a flat and preferable epitaxial wafer is prepared when trichlorosilane concentration is equal to or smaller than 3.5%, more preferably equal to or smaller than 2%. Since the temperature in epitaxial growth contributes to layer thickness distribution with angular periodicity, it is not particularly necessary to take baking temperature and the like into consideration. Here, epitaxial growth temperature is kept practically constant. The temperature of the wafer central portion read with a pyrometer, for example, can be used for this epitaxial growth temperature. Although the temperature which contributes to the layer thickness distribution with angular periodicity is considered to be the temperature of the edge part, there is little temperature difference between the wafer central portion and the edge part, and the temperature of the central portion may be used in place of the temperature of the edge part. On the other hand, the concentration of trichlorosilane (TCS) is the concentration of the trichlorosilane in a gas which is flowing in the upper part of a heat ring and the susceptor 4, and is calculated from the flow rates of a source gas (when diluted in advance with a gas such as hydrogen, the dilution is to be taken into account) and a carrier gas (for example, the flow rate of each gas per 1 minute. Specifically, slm (standard liter/min), which is a unit showing the flow rate in terms of liter per minute at 1 atm and 0° C.). Since it is assumed here that the carrier gas flowing in the lower part (10b of FIG. 2) generally does not affect trichlorosilane concentration, the carrier gas needs not to be considered when determining trichlorosilane concentration, but may be considered when the carrier gas substantially affects the trichlorosilane concentration in a gas flowing in the upper part of the susceptor 4. As described above, the present method makes the angular periodicity of the layer thickness distribution of the resulting epitaxial wafer extremely small although the means without any angular periodicity is used.

Figure 4G:
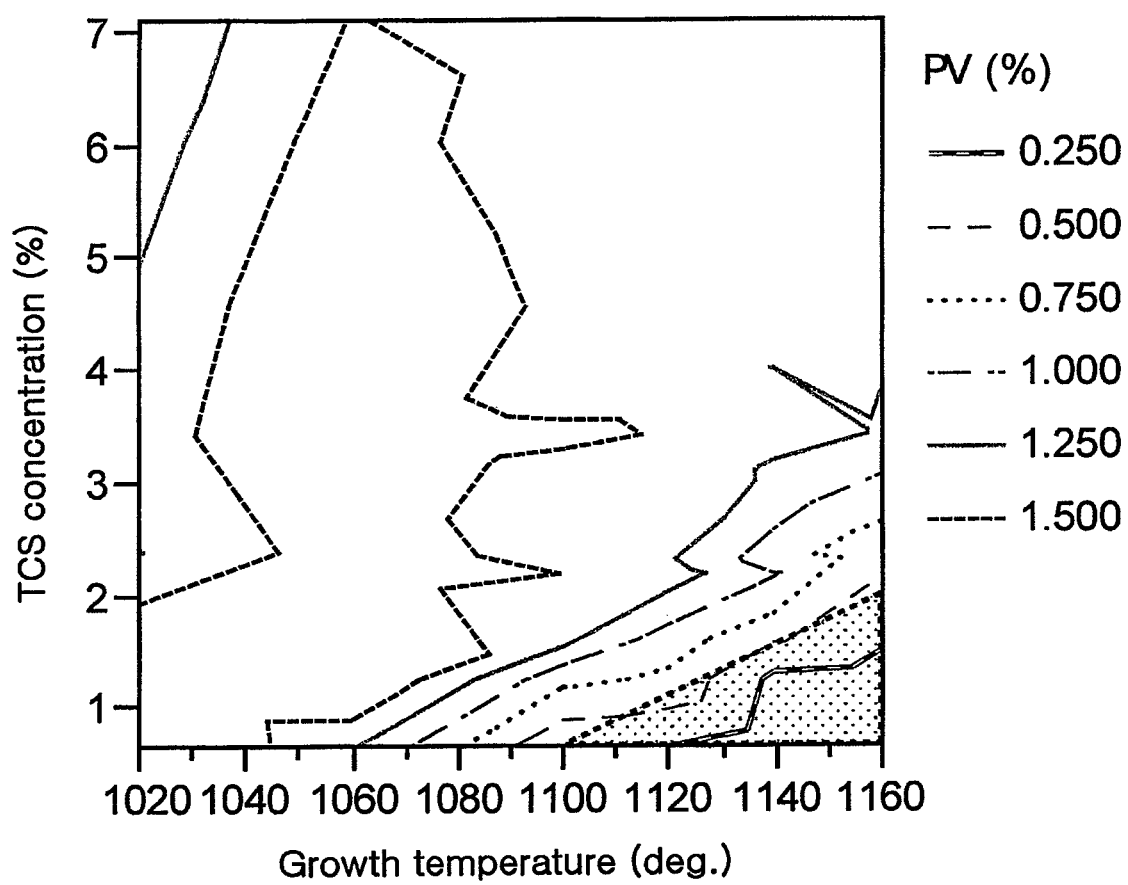
FIG. 4G shows a contour map of static dispersion of distribution of layer thickness of grown epitaxial wafers in different temperatures against epitaxial temperature and trichlorosilane concentration.

FIG. 4G relates to epitaxial wafers which were prepared by changing the trichlorosilane concentration and temperature conditions and using the same apparatus provided with the susceptor having no angular periodicity. Here, a map describing the contour lines of variation in layer thickness distribution with angular periodicity is shown as a function of trichlorosilane concentration and temperature. In this diagram, the variation in layer thickness distribution with angular periodicity becomes smaller in approaching the lower right part. Therefore, the trichlorosilane concentration and temperature conditions in a triangle which is drawn on the lower right corner of the diagram and demarcated with a dashed line are preferred. The area within this triangle can be expressed with the following formula, wherein C (%) represents trichlorosilane concentration and T represents temperature (° C.).

$$C \geq 0.63$$

$$T \leq 1160$$

$$C \leq 0.0228 \times T - 24.45 \quad \text{(Formula 4)}$$

This graph is made with results of the product prepared by the same apparatus provided with the susceptor having no angular periodicity. When a special susceptor is used as an orientation-dependent control means, however, another diagram will be drawn as a function of a concentration condition and a temperature condition. With such a diagram, the optimum manufacturing condition can be obtained on each device condition by suitably combining the concentration condition and the temperature condition.

Next, it is considered to set off differences in epitaxial growth due to the crystal orientation by adopting a means with angular periodicity. For example, in order to reduce the variation in such layer thickness distribution, a susceptor having a structure and/or shape changing with the variation of the layer thickness distribution can be used. In such a susceptor, specifically, the structure and/or shape in the vicinity of the inner circumferential face 13b of a pocket opening part change by a cycle of 90 degrees. More specifically, it is explained with reference to FIGS. 5 to 12.

Figure 5:
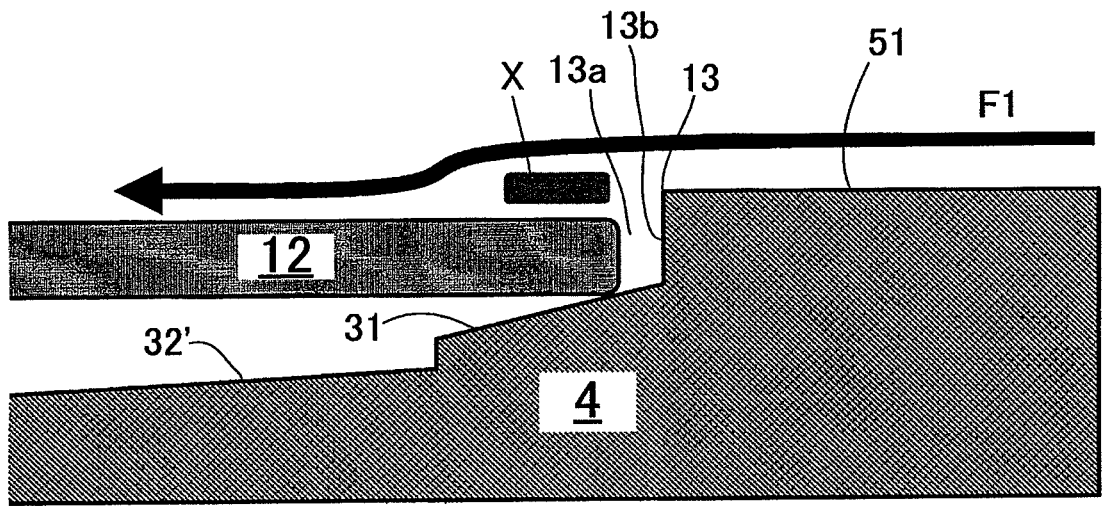
FIG. 5 is a partially enlarged cross section view of portion of a susceptor where depth of spot facing is deep.
Figure 6:
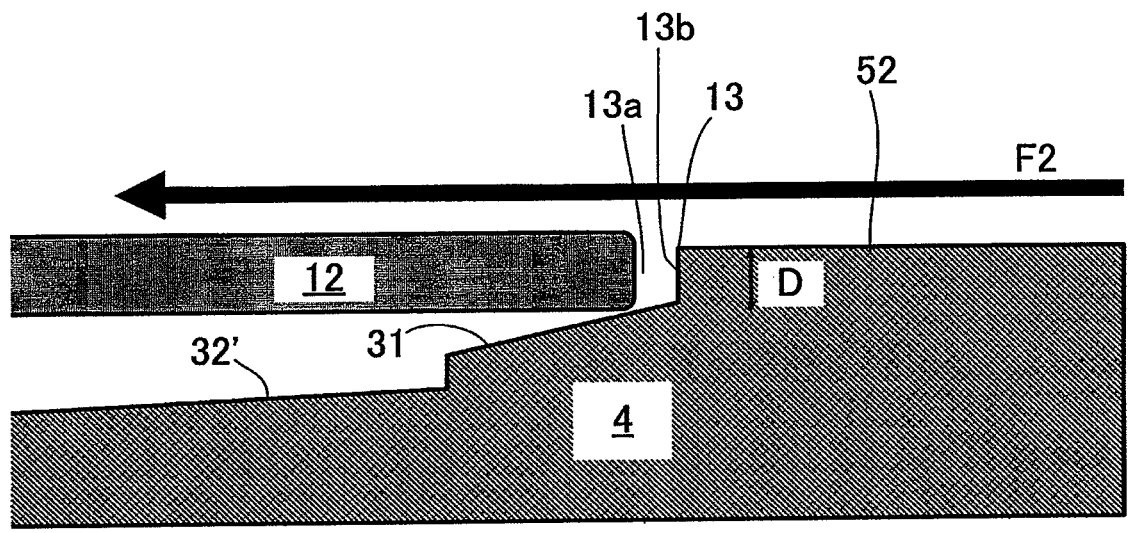
FIG. 6 is a partially enlarged cross section view of portion of the susceptor where depth of spot facing is shallow.

FIGS. 5 and 6 show the shape in the vicinity of the inner circumferential face 13*b* of the opening of a susceptor in which only the spot facing depth of a pocket is changed within the same susceptor. FIG. 5 shows a partial enlarged cross section view at about 0 degree (360 degrees), 90 degrees, 180 degrees, and 270 degrees and FIG. 6 shows a partial enlarged cross section view at about 45 degrees, 135 degrees, 225 degrees, and 315 degrees. In both cases, a semiconductor wafer 12 is held so as to avoid face contact to the tapered face 31 of a susceptor 4, and is arranged in a pocket 13 with a gap space 13*a*.

When the spot facing depth D of the susceptor becomes shallower, a silicon source gas will be smoothly supplied to a wafer edge part, and the epitaxial layer growth rate at the edge part becomes larger. When the spot facing depth of the susceptor becomes larger, a reverse phenomenon is seen and the growth rate becomes smaller. The position (height) of holding this semiconductor wafer 12 stays identical for the susceptor 4. Hence, in order to change the spot facing depth of the pocket 13, the location of the upper surfaces 51 and 52 of a member in the vicinity of the opening of the pocket is to be changed. That is, in FIG. 5, the upper surface of semiconductor wafer 12 is located at a position lower than the upper surface 51 of the member in the vicinity of the opening of the susceptor 4, and the flow of a raw material gas (or source gas) shown by an arrow F1 is considered to bend roughly at a spot beyond the gap 13*a*. Therefore, it is considered that flow stagnation X arises and the volume of gas supply in a circumference part decreases by a small amount.

In FIG. 6, on the other hand, the upper surface of a semiconductor wafer 12 is located at a position practically coplanar with the upper surface 51 of a member in the vicinity of the opening of a susceptor 4. Thus, it is assumed that flow stagnation X does not takes place, a raw material gas flows smoothly (F2) and an epitaxial layer formation rate is accelerated sufficiently. In this instance, spot facing depth D may be substantially equal to or smaller than the thickness of the semiconductor wafer 12. Such a height ratio can be suitably determined according to layer thickness distribution at the time of actually forming an epitaxial layer. In general, when the variation in the layer thickness distribution is larger, the height ratio is also made larger. The spot facing depth is preferably changed in a range of ±0.5 mm of thickness in consideration of the thickness of the semiconductor wafer 12. The state of FIG. 5 may change to the state of FIG. 6 in a curve and/or linearly. A shift from the state of FIG. 5 to the state of FIG. 6 (or 6 to 5) is preferably made in a monotonically decreasing (or monotonically increasing) way.

Figure 7:
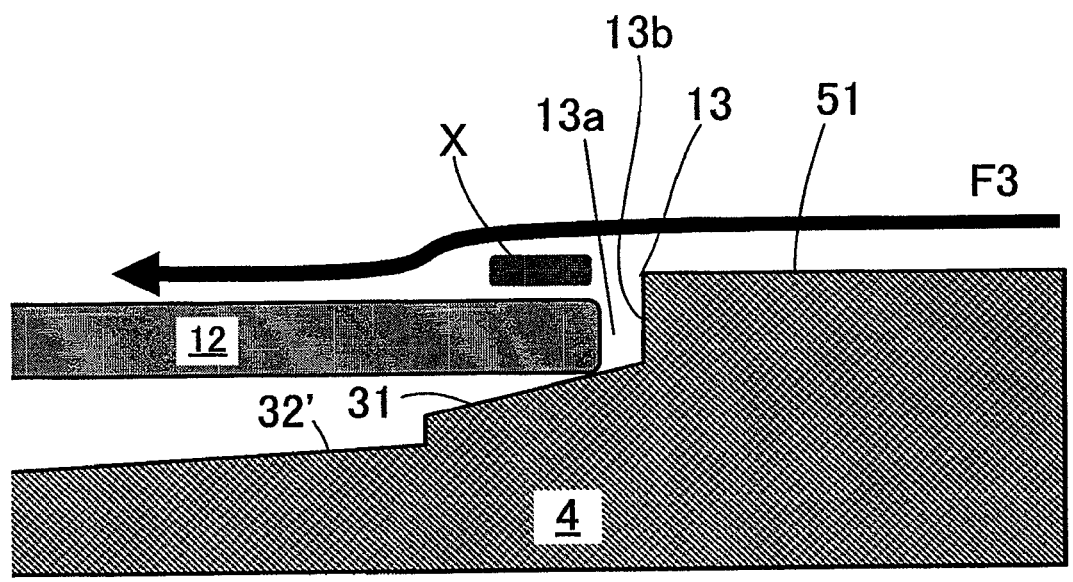
FIG. 7 is a partially enlarged cross section view of portion of the susceptor where pocket width is large.
Figure 8:
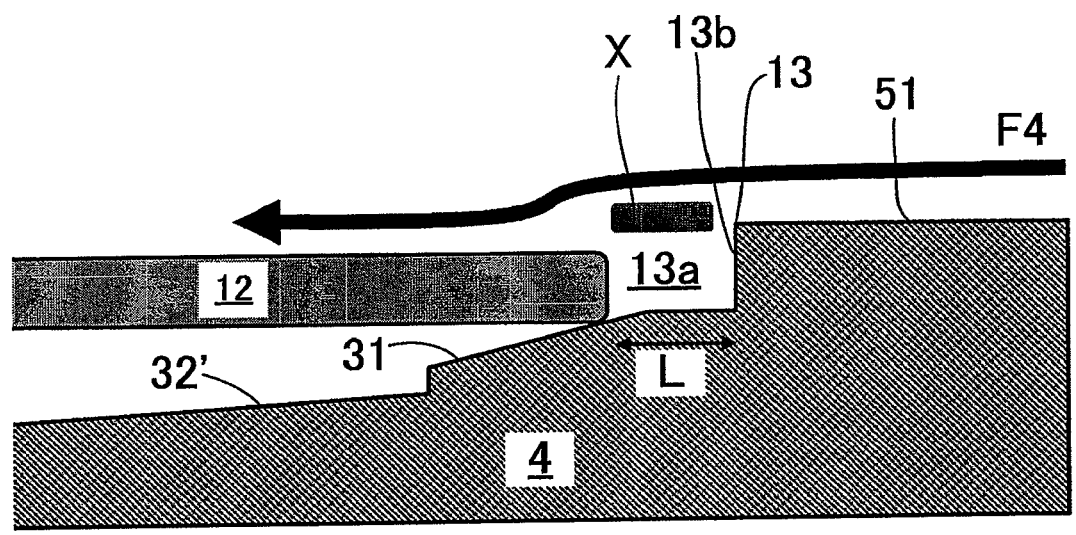
FIG. 8 is a partially enlarged cross section view of portion of susceptor where pocket width is small.

FIGS. 7 and 8 show the shape in the vicinity of the inner face 13*b* of the opening of a susceptor, wherein only the width of a pocket 13 is changed within the same susceptor. FIG. 7 shows a partial enlarged cross section view at around 0 degree (360 degrees), 90 degrees, 180 degrees, and 270 degrees, and FIG. 8 shows a partial enlarged cross section view around 45 degrees, 135 degrees, 225 degrees and 315 degrees. In both cases, a semiconductor wafer 12 is held so as to avoid face contact to the tapered face 31 of a susceptor 4 and is arranged in a pocket 13 with a gap space 13*a*. When the pocket width of the susceptor becomes larger, a silicon source gas is smoothly supplied to a wafer edge part, and the epitaxial layer growth rate of the edge part becomes larger. When the pocket width of the susceptor becomes smaller, a reverse phenomenon is seen and the growth rate becomes smaller. Since this semiconductor wafer 12 has a substantially round shape (disk shape), the interval L of the gap 13*a* changes when the pocket width is changed. Therefore, it is plausible that the flow of a raw material gas (or source gas) shown by an arrow F3 reaches the upper surface of the semiconductor wafer 12 after passing over the outer circumferential part of the semiconductor wafer 12 (FIG. 7). On the other hand, it is plausible that the flow of the raw material gas (or source gas) shown by an arrow F4 reaches the upper surface of semiconductor wafer 12 at a location beyond the gap apace 13*a* which opens by an interval of L (FIG. 8). That is, the region of stagnation X deviates from the semiconductor wafer 12.

Such a pocket width ratio can be suitably determined according to layer thickness distribution at the time of actually forming an epitaxial layer. In general, when the variation in the layer thickness distribution is larger, the width ratio is also made larger. The pocket width is preferably changed in a range of +1 to 10 mm of the diameter of the semiconductor wafer 12. The state of FIG. 7 may change to the state of FIG. 8 in a curved manner and/or a linear manner. A shift from the state of FIG. 7 to the state of FIG. 8 (or 8 to 7) is preferably made in a monotonically decreasing (or increasing) way.

Figure 9:
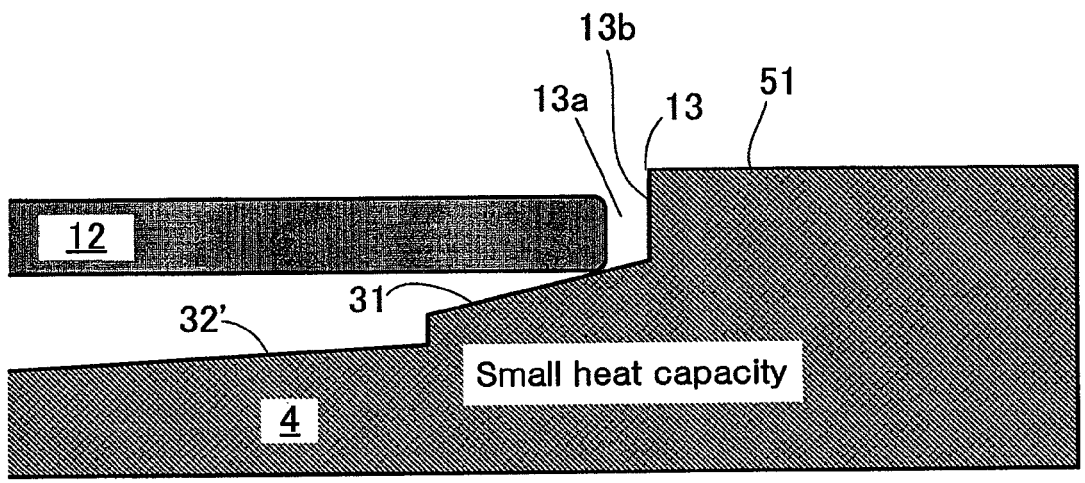
FIG. 9 is a partially enlarged cross section view of portion of the susceptor where thickness thereof is small.
Figure 10:
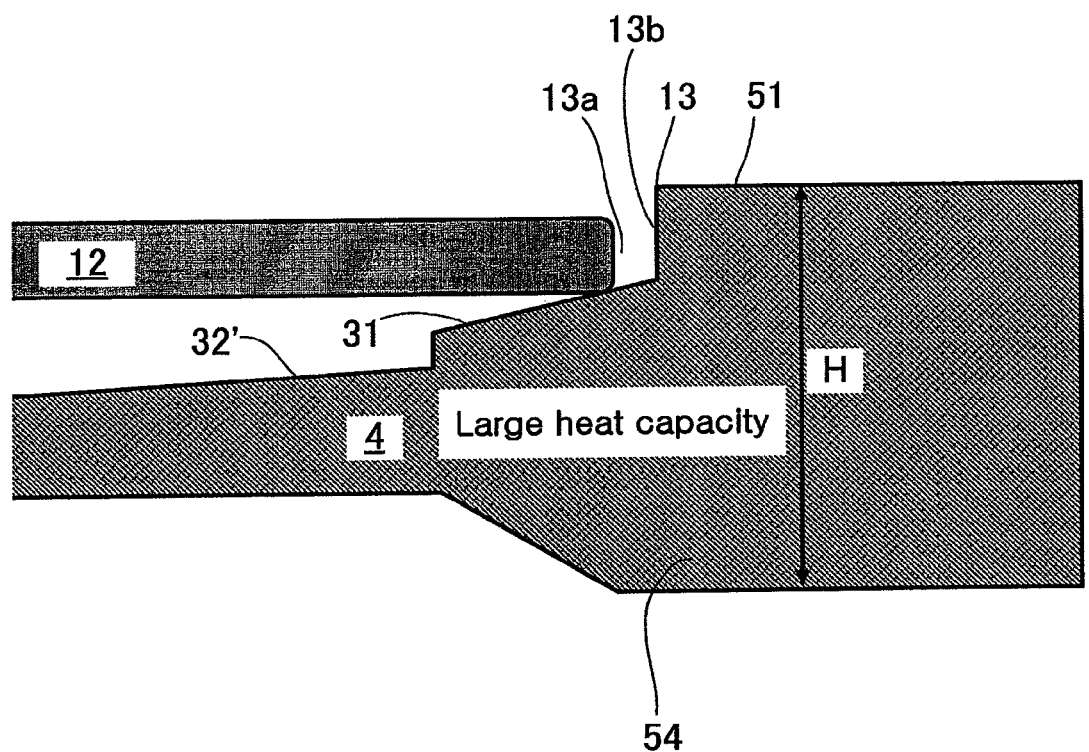
FIG. 10 is a partially enlarged cross section view of portion of the susceptor where thickness thereof is large.

FIGS. 9 and 10 show the shape in the vicinity of an opening, wherein only thickness within the same susceptor is changed to change thermal capacity. FIG. 9 shows a partial enlarged cross section around 0 degree (360 degrees), 90 degrees, 180 degrees, or 270 degrees and FIG. 10 shows a partial enlarged cross section view around 45 degrees, 135 degrees, 225 degrees, or 315 degrees. In both cases, a semiconductor wafer 12 is held so as to avoid the face contact with the tapered face 31 of a susceptor 4 and is arranged in a pocket 13 with a gap space 13*a*. When the thickness of the susceptor becomes larger, or when the diameter thereof becomes larger, the thermal capacity of the susceptor in this portion increases, and an epitaxial layer growth rate becomes larger. When the thickness of the susceptor becomes smaller, or when the diameter thereof becomes smaller, a reverse phenomenon is seen, and the growth rate becomes smaller. Since this semiconductor wafer 12 has a substantially round shape (disk shape), the shape of the radial direction in the vicinity of the opening of the susceptor 4 is also uniform. However, when, as shown in FIG. 10, height H is made larger by about 20% compared with that of FIG. 9, thermal capacity will also become larger according to the thickening. Since the shape of the flow path of a raw material gas (or source gas) does not change, raw material supply is independent of crystal orientation. However, it may be utilized that the rate of epitaxial layer formation becomes larger when the heat capacity is larger.

Such differences in the thermal capacity is smoothened to some extent even if the susceptor 4 is a single block on the whole and the shape thereof is abruptly changed linearly. Thus such a structure is an effective means when a gentle shift is required.

Figure 11:
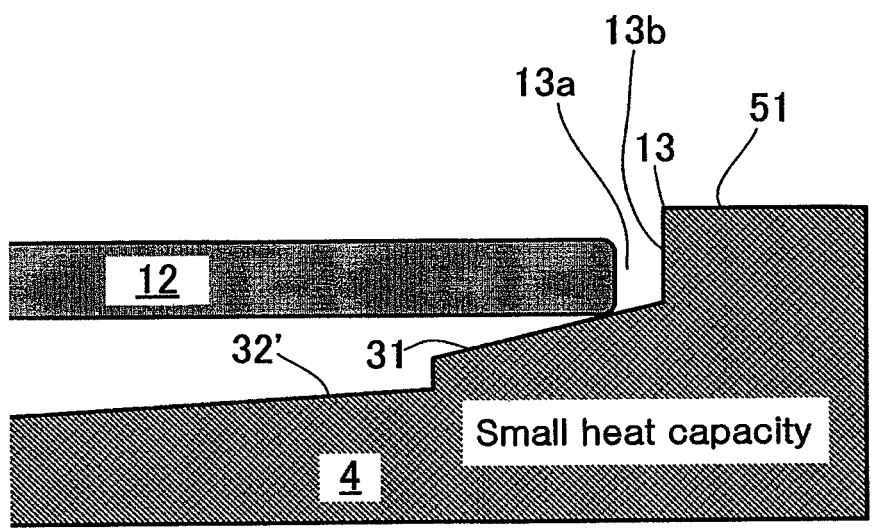
FIG. 11 is a partially enlarged cross section view of portion of the susceptor where a diameter thereof is small.
Figure 12:
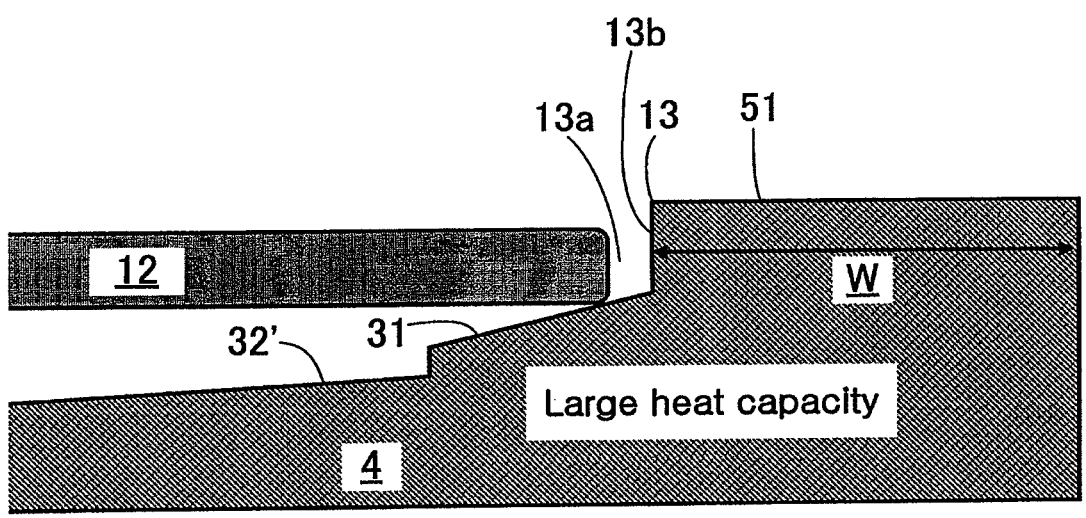
FIG. 12 is a partially enlarged cross section view of portion of the susceptor where a diameter thereof is large.

FIGS. 11 and 12 show the shape in the vicinity of the opening of a susceptor of another type in which thermal capacity is changed. FIG. 11 shows a partial enlarged cross section view at about 0 degree (360 degrees), 90 degrees, 180 degrees, or 270 degrees and FIG. 6 shows a partial enlarged cross section view at about 45 degrees, 135 degrees, 225 degrees, or 315 degrees. In both cases, a semiconductor wafer 12 is held so as to avoid the face contact with the tapered face 31 of a susceptor 4 and is arranged in the pocket 13 with a gap space 13*a*. Since this semiconductor wafer 12 has a substantially round shape (disk shape), the shape of the radial direction in the vicinity of the opening of the susceptor 4 is also uniform. However, when width W is significantly enlarged as shown in FIG. 12 compared with the width of FIG. 11, the thermal capacity will also become large. Since the susceptor of FIG. 12 has a little longer flow path of a raw material gas (or source gas), reduction of the supply rate caused by flow resistance may also occur simultaneously, but the shape is suitably selected by using experimental results. Since the mechanism is the same as the above-mentioned mechanism, explanation thereof is omitted here.

As mentioned above, the layer thickness distribution of the epitaxial layer of the edge part can be improved by applying, to the susceptor, the above processing which cancels the angular dependence of the growth rate of the epitaxial layer of the wafer edge part. Wafers of various crystal orientations and chamfer shape can be made usable by adjustment of spot facing depth, pocket width, and thermal capacity (depth, width, thickness, an angle of applying processing).

Example 1

Figure 13:
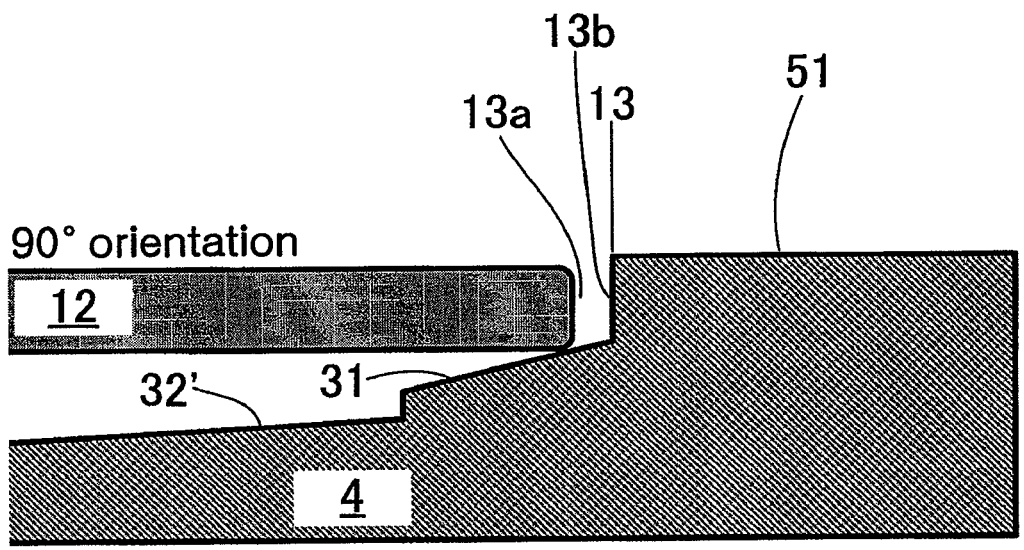
FIG. 13 is a partially enlarged cross section view of portion of the susceptor where depth of spot facing is deep according to Embodiment 1.
Figure 14:
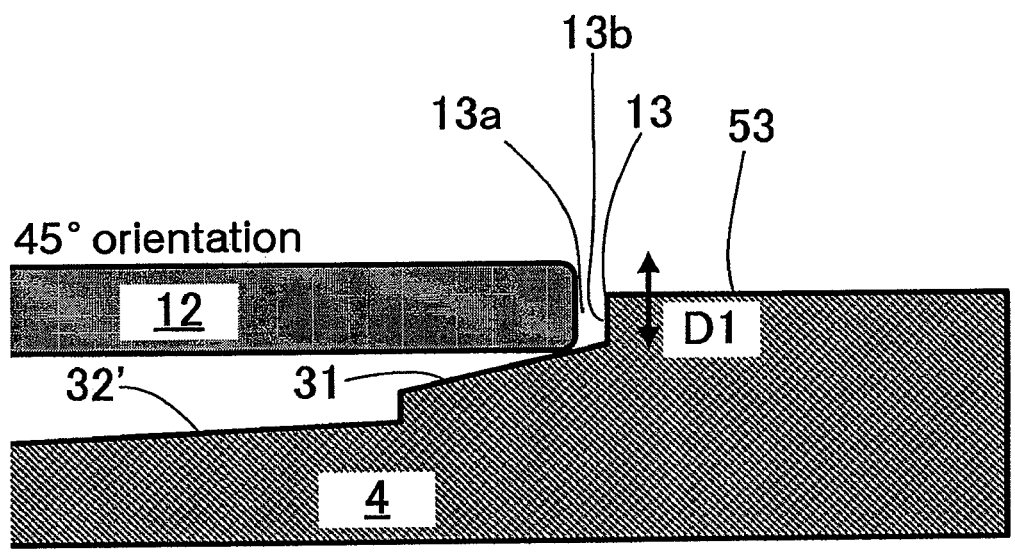
FIG. 14 is a partially enlarged cross section view of portion of the susceptor where depth of spot facing is shallow according to Embodiment 1.
Figure 15:
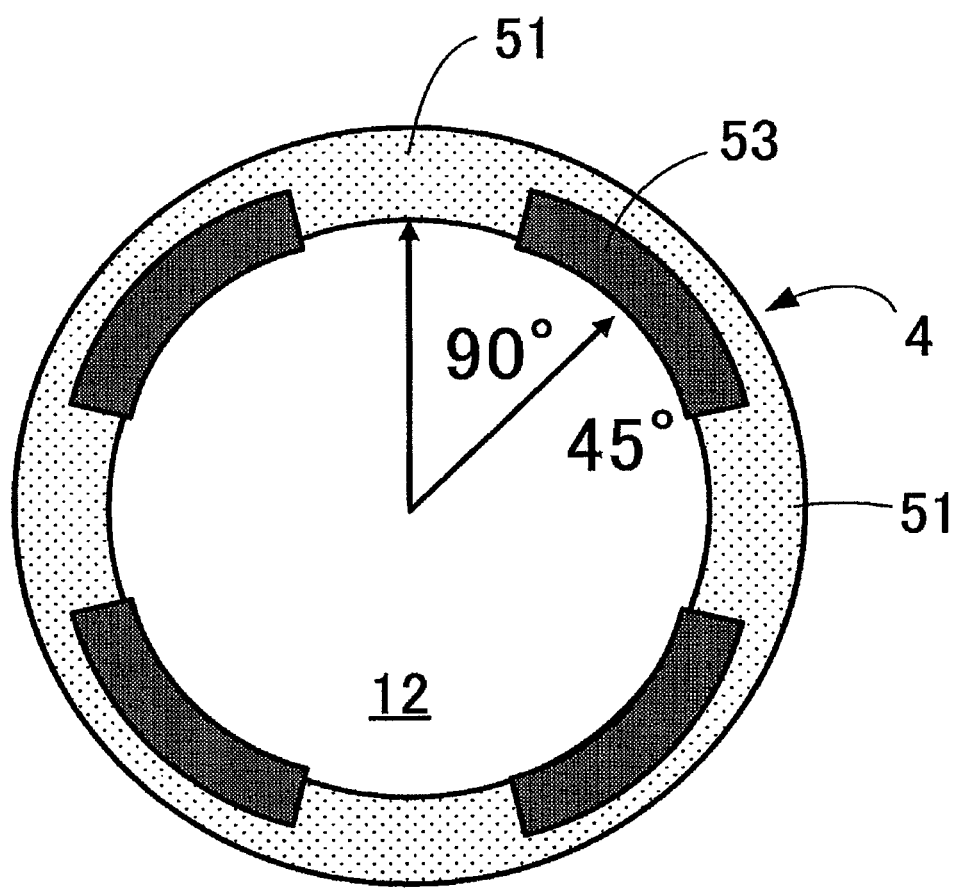
FIG. 15 is a plan view of the susceptor of Embodiment 1.
Figure 16:
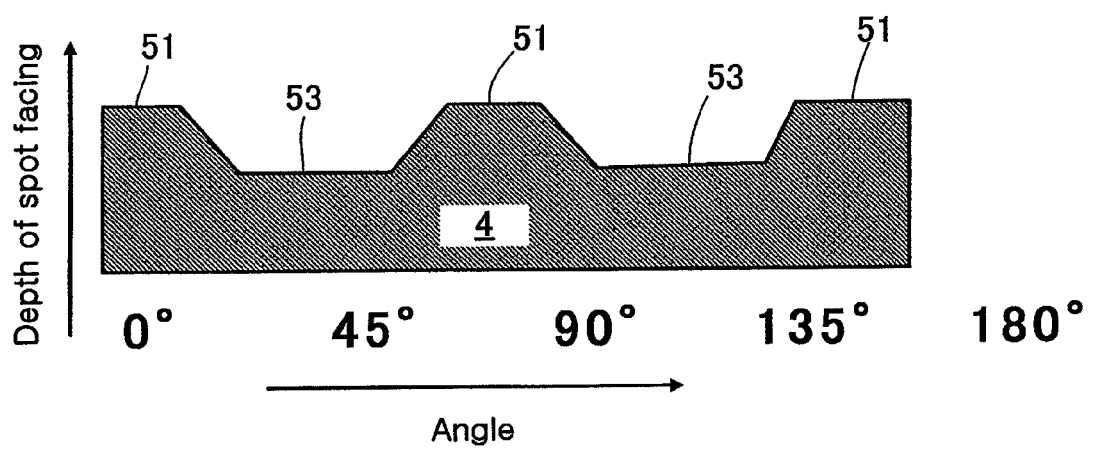
FIG. 16 is a view showing developed depth of spot facing in the susceptor of Embodiment 1.

FIGS. 13 to 17 show layer thickness distribution when an epitaxial layer is formed by changing spot facing depth. Duplicated explanation thereof is omitted because of similarity to FIGS. 5 and 6. FIGS. 13 and 14 show a partial enlarged cross section of a susceptor and the like, and FIG. 15 is a top view of the susceptor 4. FIG. 16 is a graph showing spot facing depth and being developed with respect to the angle. The spot facing depth of the present case is made smaller at shallow parts than the thickness D1 of a semiconductor wafer 12. As shown in FIGS. 15 and 16, the spot facing depth changes with a cycle of about 90 degrees.

Figure 17:
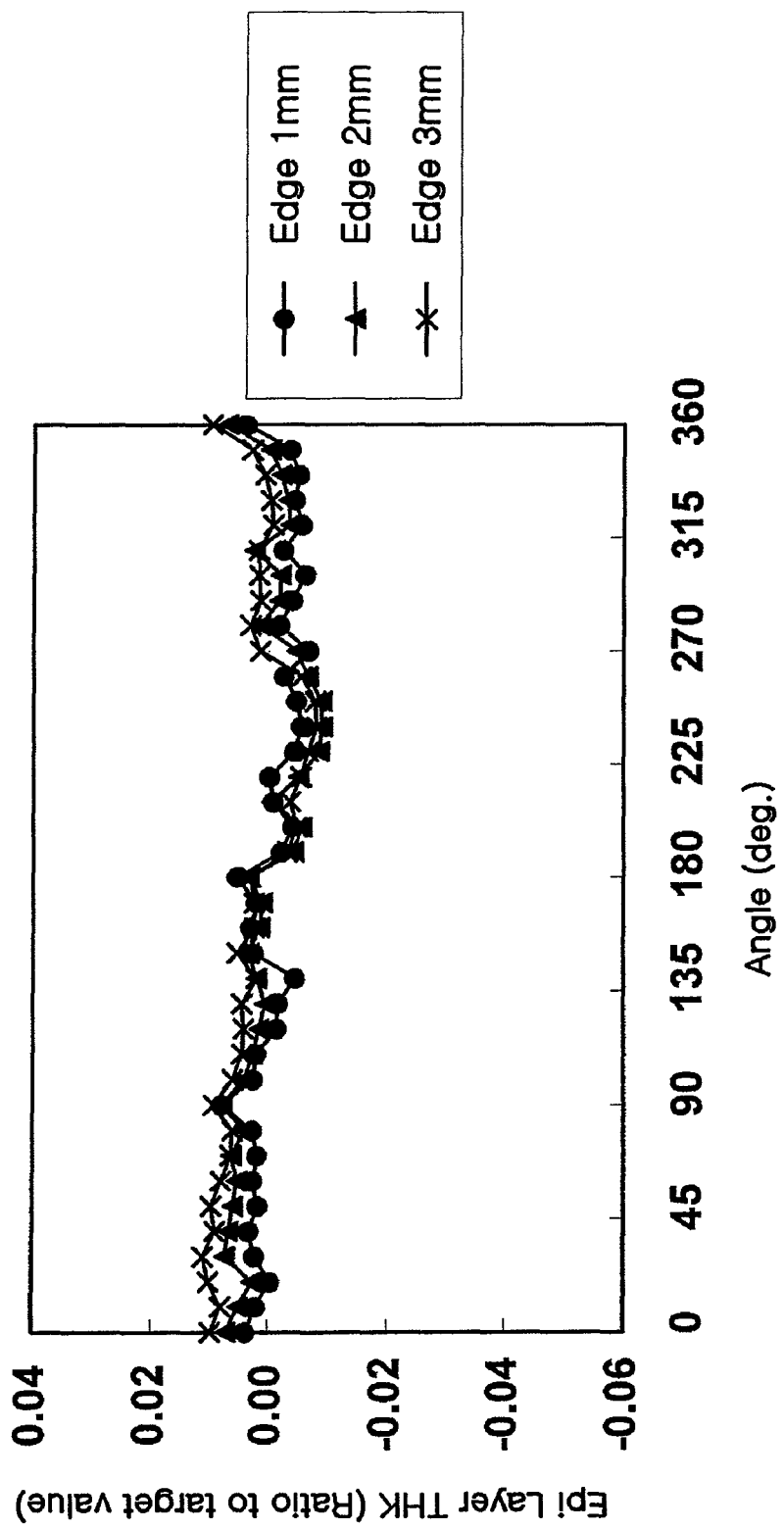
FIG. 17 is a view showing developed distribution of layer thickness of Embodiment 1.

In a (100) substrate (notch direction 0°) which is the semiconductor wafer, the growth rate of the epitaxial layer of an edge part becomes gradually slower as the direction changes from 0° to 45°. The susceptor was machined so as to minimize the spot facing depth of the portion in which the direction of 45° of the wafer is located when the wafer is loaded on the susceptor, and then epitaxial growth was undertaken. FIG. 17 shows that layer thickness variation depending on the crystal orientation decreases considerably. When the layer thickness distribution of a location 1 mm inner from the outer circumference is estimated by using the above formula (formula 1), Δt was found to have been improved from 2.01% to 0.88%.

Example 2

Figure 18:
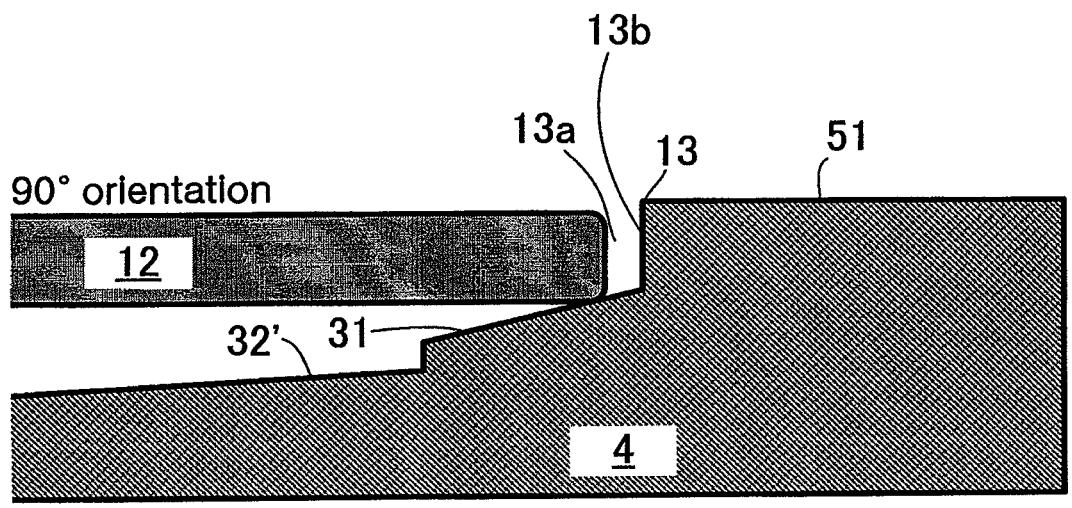
FIG. 18 is a partially enlarged cross section view of portion of the susceptor where pocket width is small according to Embodiment 2.
Figure 19:
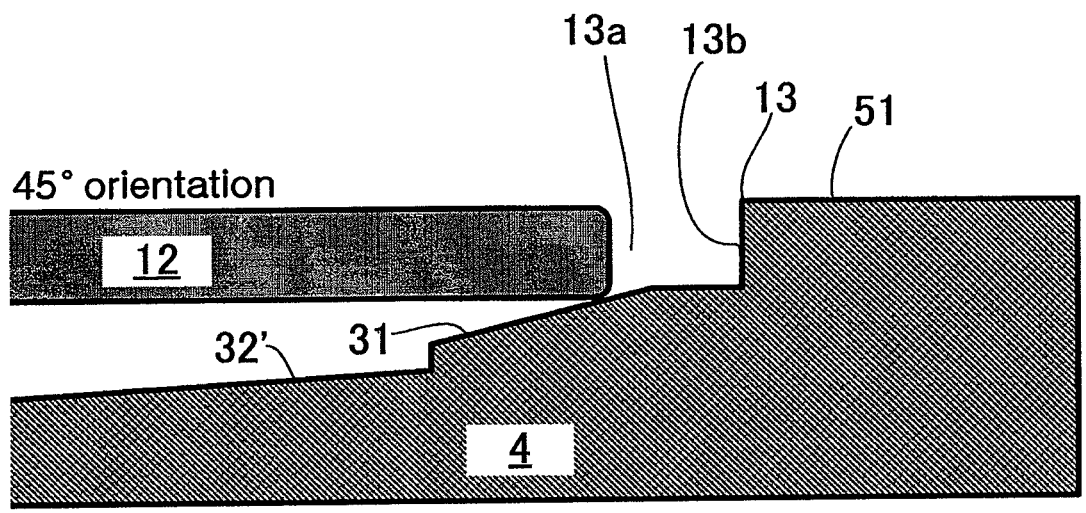
FIG. 19 is a partially enlarged cross section view of portion of the susceptor where pocket width is large according to Embodiment 2.
Figure 20A:
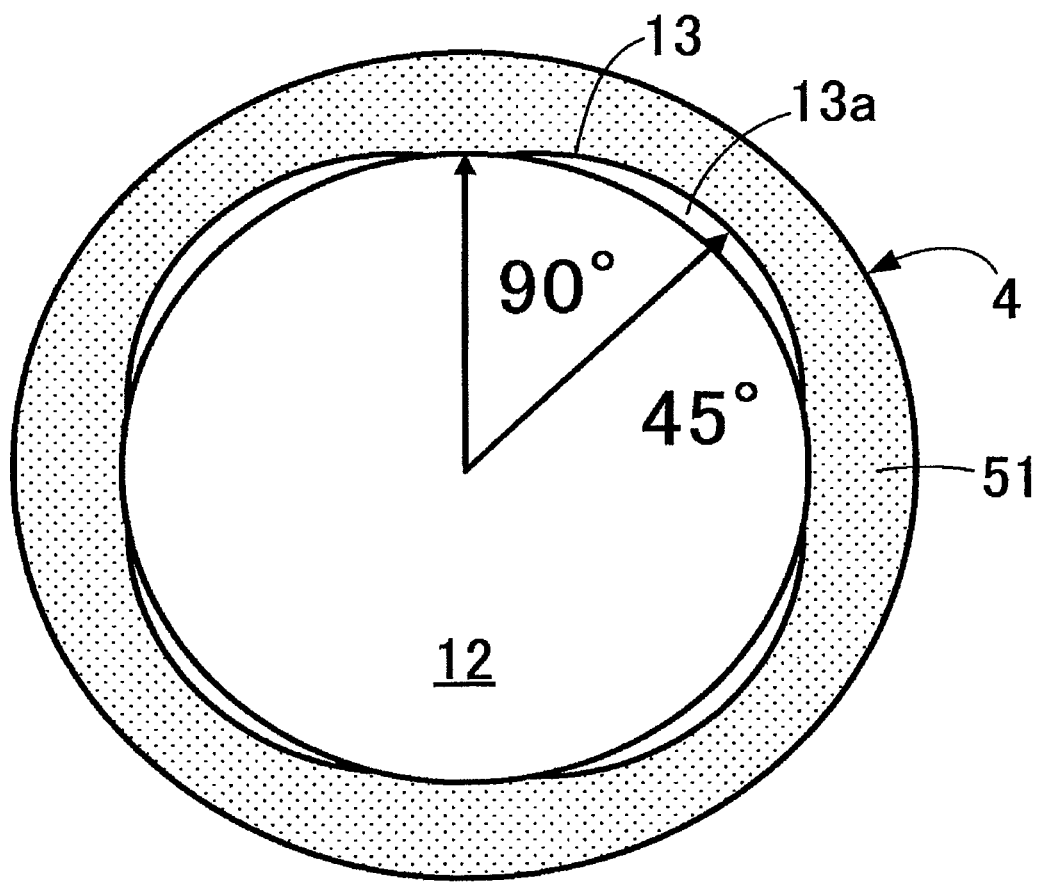
FIG. 20A is a plan view of the susceptor holding the semiconductor wafer of Embodiment 2.
Figure 20B:
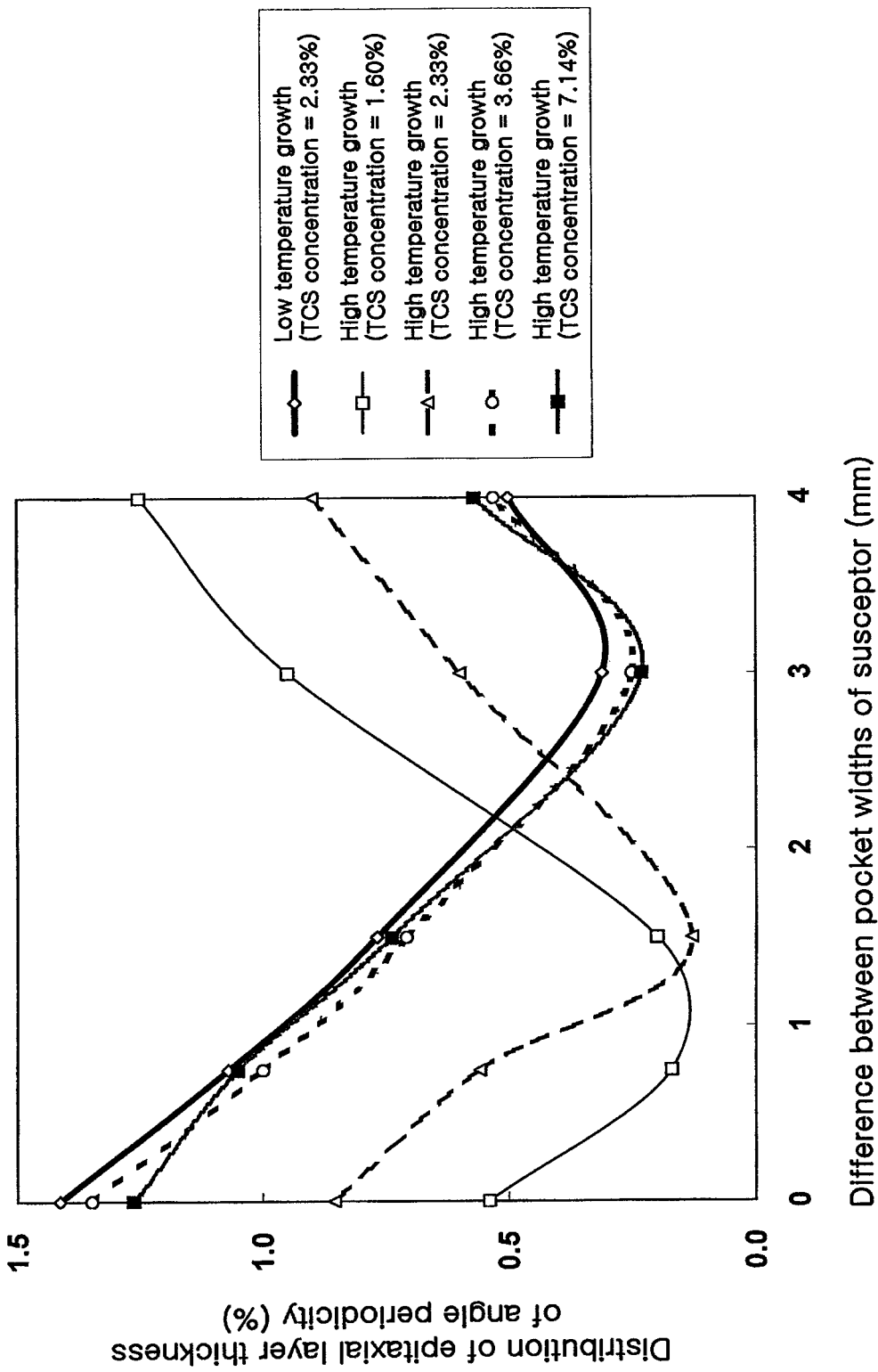
FIG. 20B shows a graph in which static dispersion of layer thickness distribution of epitaxial wafers grown in different trichlorosilane concentrations and temperatures.
Figure 21A:
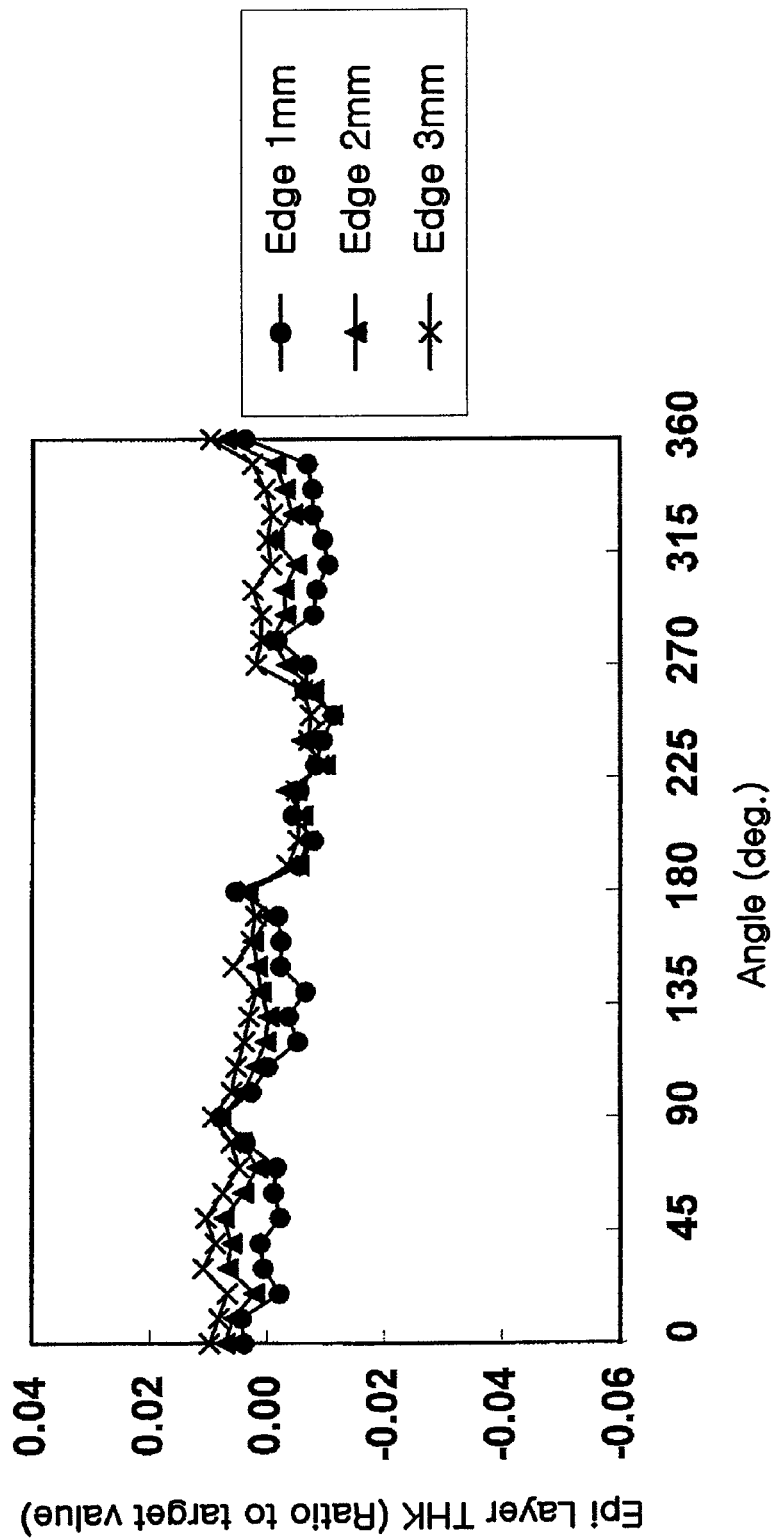
FIG. 21A is a view showing developed distribution of layer thickness of Embodiment 2.

FIGS. 18 to 20A and 21A show layer thickness distribution when an epitaxial layer is formed by changing pocket width. Duplicated explanation is omitted because of similarity to FIGS. 7 and 8. FIGS. 18 and 19 show a partial enlarged cross section view of a susceptor and the like, and FIG. 20 is a top view of the susceptor 4. FIG. 21A is a graph showing the effect of pocket width on layer thickness and being developed with respect to the angle. The pocket width in this experiment is made slightly wider than the radius of a semiconductor wafer 12 at a narrow part, and about 5 mm wider than the above diameter at a wide part. As shown in FIG. 20A, the pocket width changes with a cycle of 90 degrees.

In a (100) substrate (notch direction 0°) which is a semiconductor wafer, the growth rate of the epitaxial layer of an edge part becomes gradually smaller as the direction changes from 0° to 45°. The susceptor was machined so as to maximize the pocket width of the portion in which the direction of 45° of the wafer is located when the wafer is loaded on the susceptor, and then epitaxial growth was undertaken. FIG. 21A shows that layer thickness variation depending on crystal orientation decreases considerably. When the layer thickness distribution of a location 1 mm inner from the outer circumference is estimated by using the above formula (formula 1), Δt was found to have been improved from 2.01% to 0.97%.

Figure 21B:
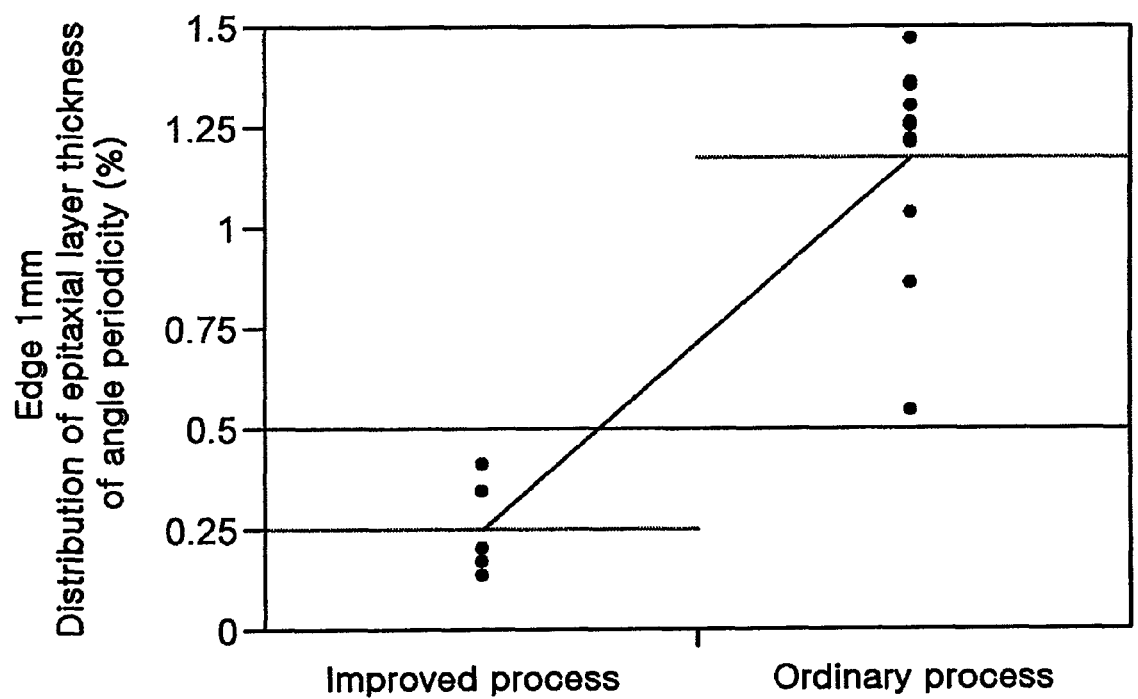
FIG. 21B is a view showing comparison of static dispersions of layer thickness distributions of epitaxial wafers formed by improved process and normal process.

Here, in FIGS. 20A, 20B, and 21B, the relationship between the magnitude of the gap 13a being the difference between the susceptor and the pocket width and the variation of layer thickness distribution with angular periodicity is explained. As shown in FIG. 20A, the pocket width at a location separated counterclockwise by 45° rotation from the reference point is wider than the pocket width at a location separated counterclockwise by 90° rotation. FIG. 20B is obtained by taking the difference of this width on the horizontal axis and the variation in layer thickness distribution with angular periodicity on the vertical axis. In preparation of this epitaxial wafer, data of a wafer grown at low temperature is shown with white rhombi, and other data sets are for wafers grown at high temperature. White squares represent a wafer grown with a trichlorosilane concentration of 1.60%, and white triangles represent a wafer grown with a trichlorosilane concentration of 2.33%. The wafer grown at the low temperature (white rhombi) was subjected to epitaxial formation also at a trichlorosilane concentration of 2.33%. White circles are for 3.66% and black squares are for 7.14%.

In this graph, respective measurement points are plotted. From the plots, a several order approximate expression was derived by the least square method, which approximate expression is then used for connecting plotted points. When the variation in thickness distribution with angular periodicity is observed as a function of a certain optimum susceptor-pocket width difference, every plotted curve shows a minimum at a certain susceptor-pocket width difference, and variation becomes larger when the difference is excessively large or small. For the same concentration, the high temperature growth shows a minimal value of about 0.1% when the pocket width difference is about 1.5 mm. On the other hand, the low temperature growth shows a minimal value of about 0.3% when the pocket width difference is about 3 mm. The above results show that it is easier at higher temperature to adjust the growth rate difference due to crystal orientation without making the pocket width difference large. It is also found that the minimum magnitude of variation is smaller at higher temperature. If growth temperature is fixed at the high temperature, it turns out that the susceptor-pocket width difference becomes smaller when the TCS concentration is lower. However, practically the same susceptor-pocket width difference is preferable when the TCS concentration is 3.66% or more. Once such a diagram is plotted, it is understood how much difference should be provided between the susceptor and the pocket width.

FIG. 21B shows the effect of an improved process and a normal process on variation. As shown in this graph, it is clear that the improved process (raw material concentration and temperature) is required in order to make variation in the layer thickness distribution with angular periodicity 0.5% or smaller.

Figure 21C:
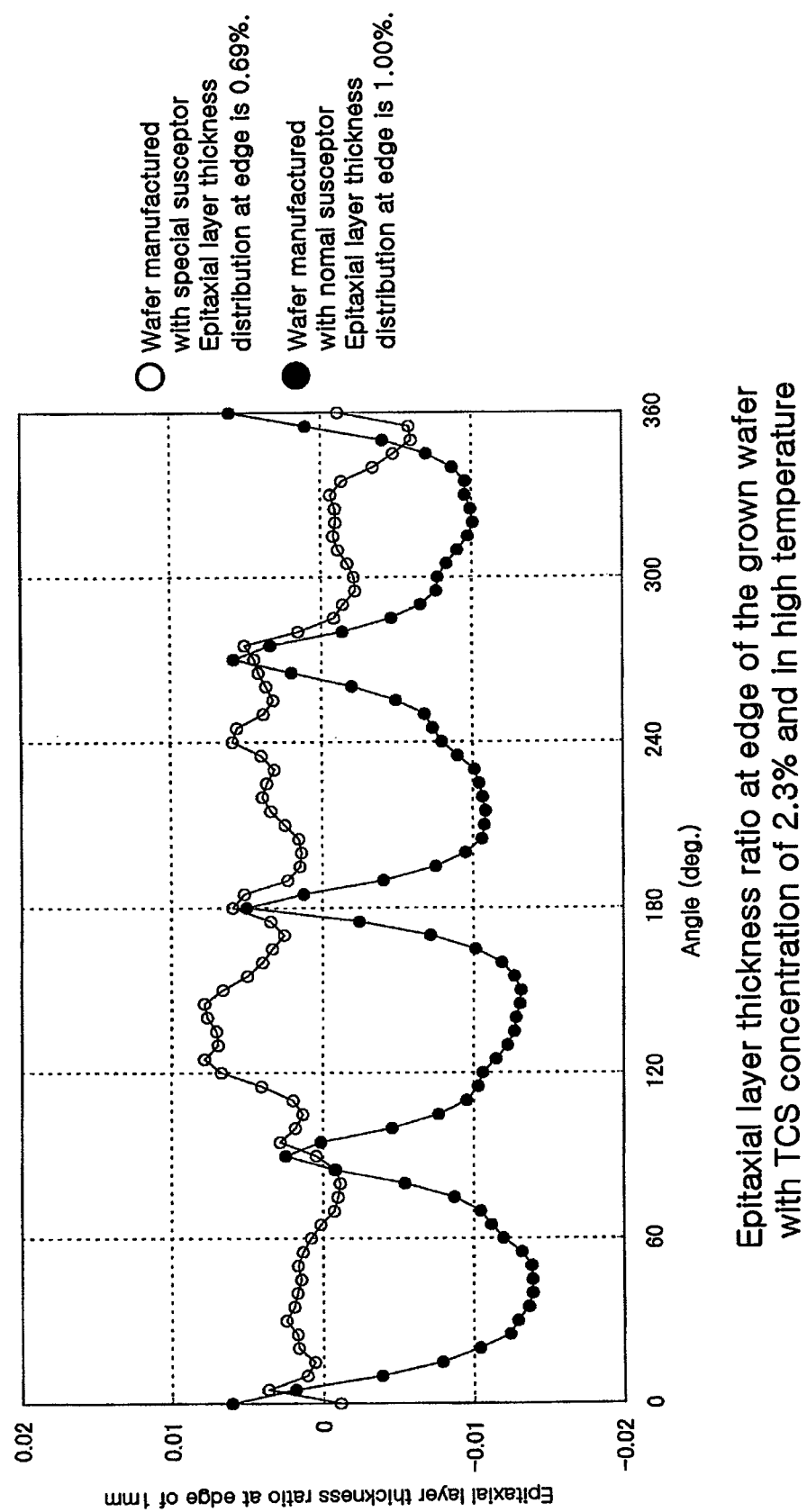
FIG. 21C shows a graph in which layer thicknesses of epitaxial wafers formed in a high temperature and 2.3% of trichlorosilane concentration with normal and special susceptors are developed and plotted against angle.

FIG. 21C shows layer thickness distributions with the angular periodicity as a function of the angle of FIG. 3A when the epitaxial formation is conducted with a normal susceptor and a special susceptor at high temperature and at trichloroethylene concentration of 2.3%. The special susceptor was built by the method mentioned above so that the variation in layer thickness distribution with the angular periodicity is reduced. As shown in this diagram, the layer thickness distribution with angular periodicity changes with a cycle of about 90 degrees when the regular susceptor is used, but such a result is not necessarily obtained for the special susceptor.

Figure 21D:
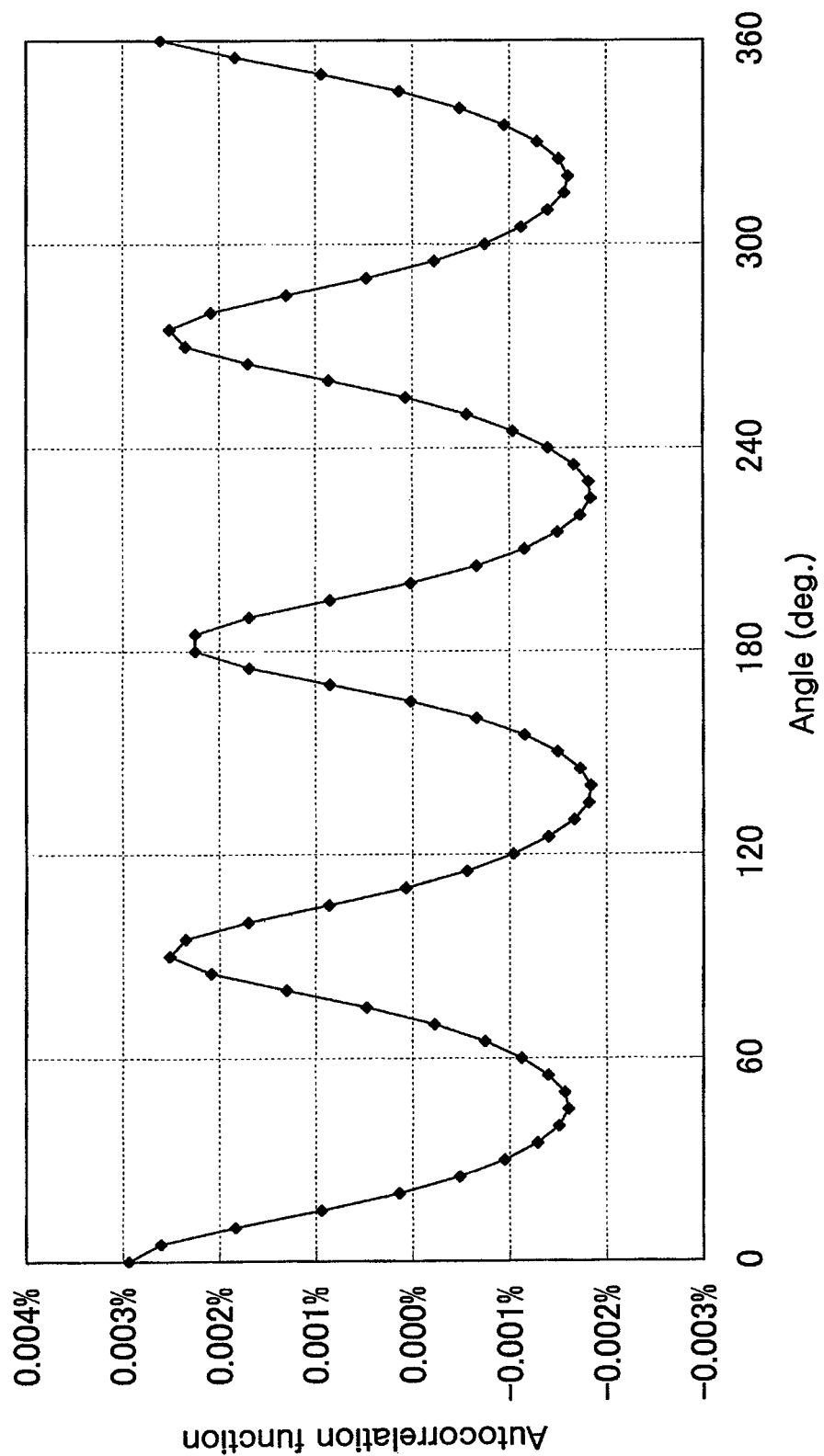
FIG. 21D shows a graph in which autocorrelation function of layer thickness distribution with the normal susceptor shown in FIG. 21C is plotted against angle.
Figure 21E:
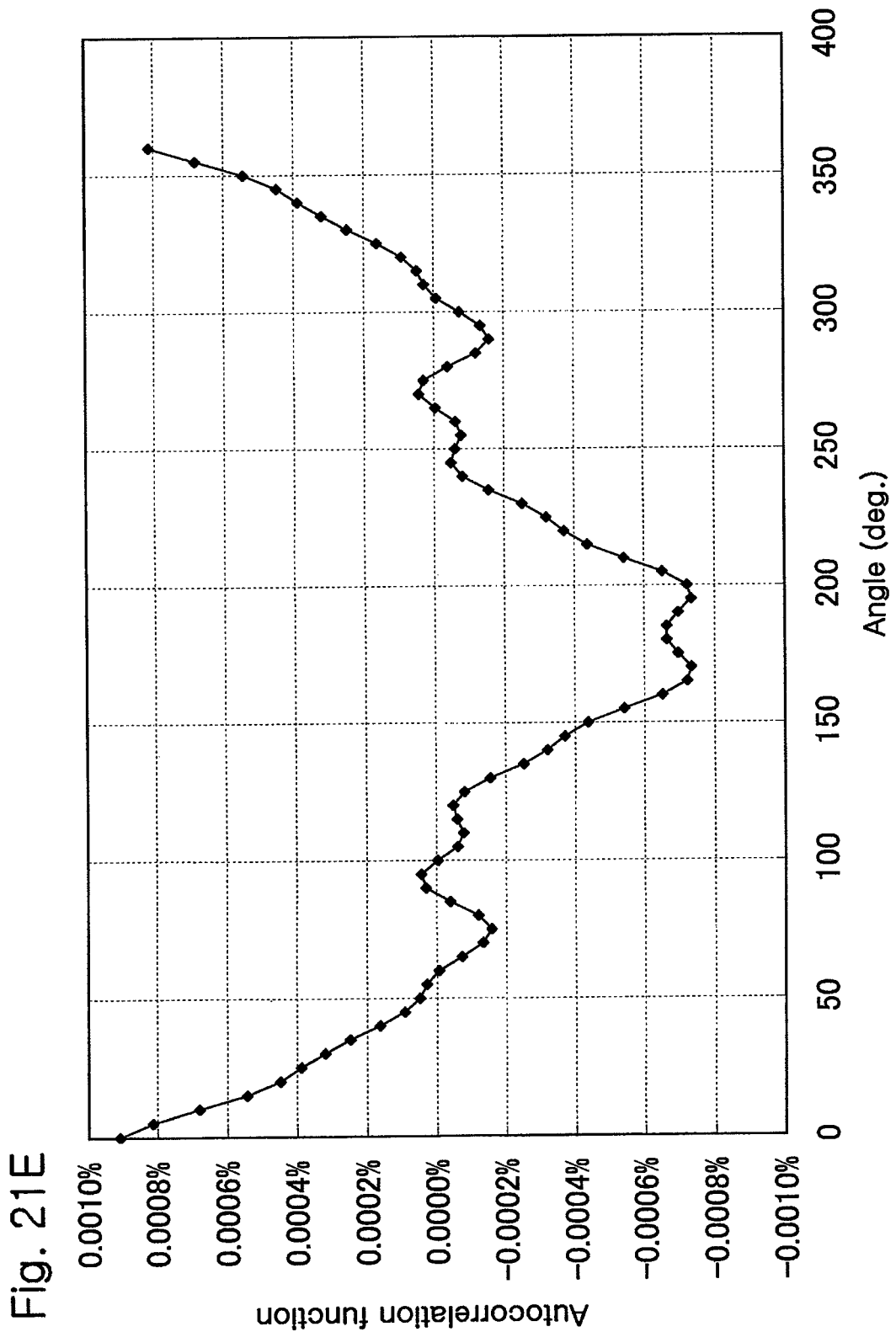
FIG. 21E shows a graph in which autocorrelation function of layer thickness distribution with the special susceptor shown in FIG. 21C is plotted against angle.
Figure 21F:
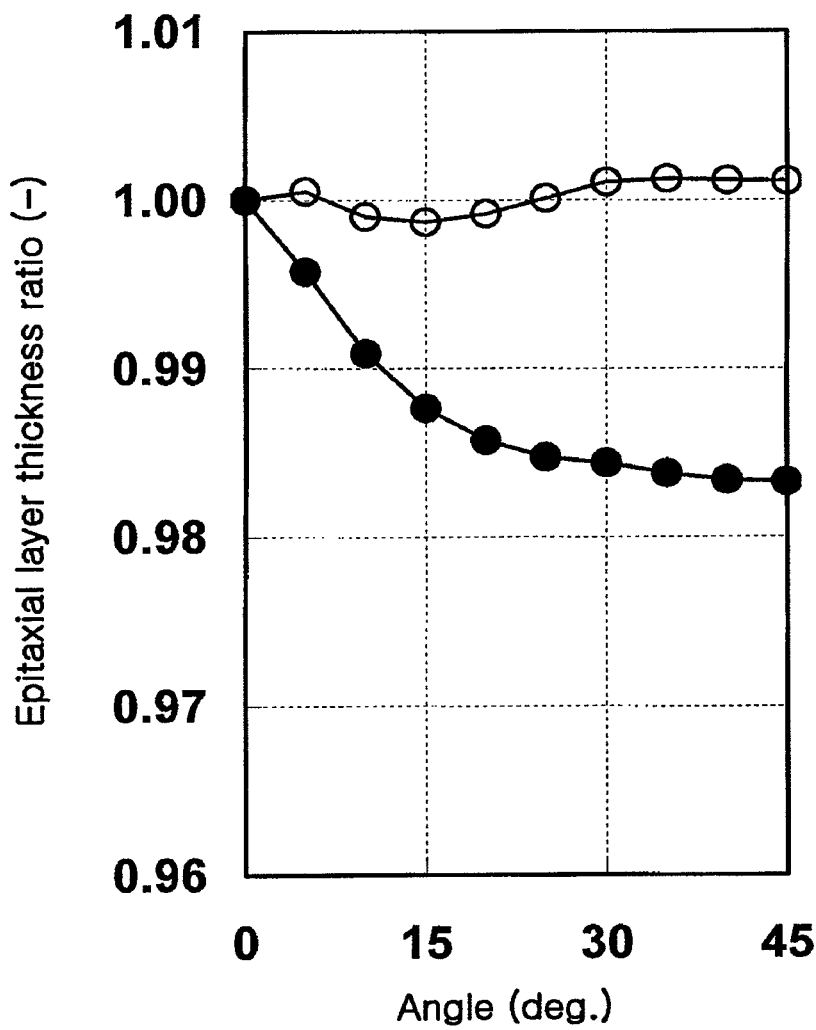
FIG. 21F is a graph in which average distribution of layer thickness obtained by the folding method of 45-degree.
Figure 21G:
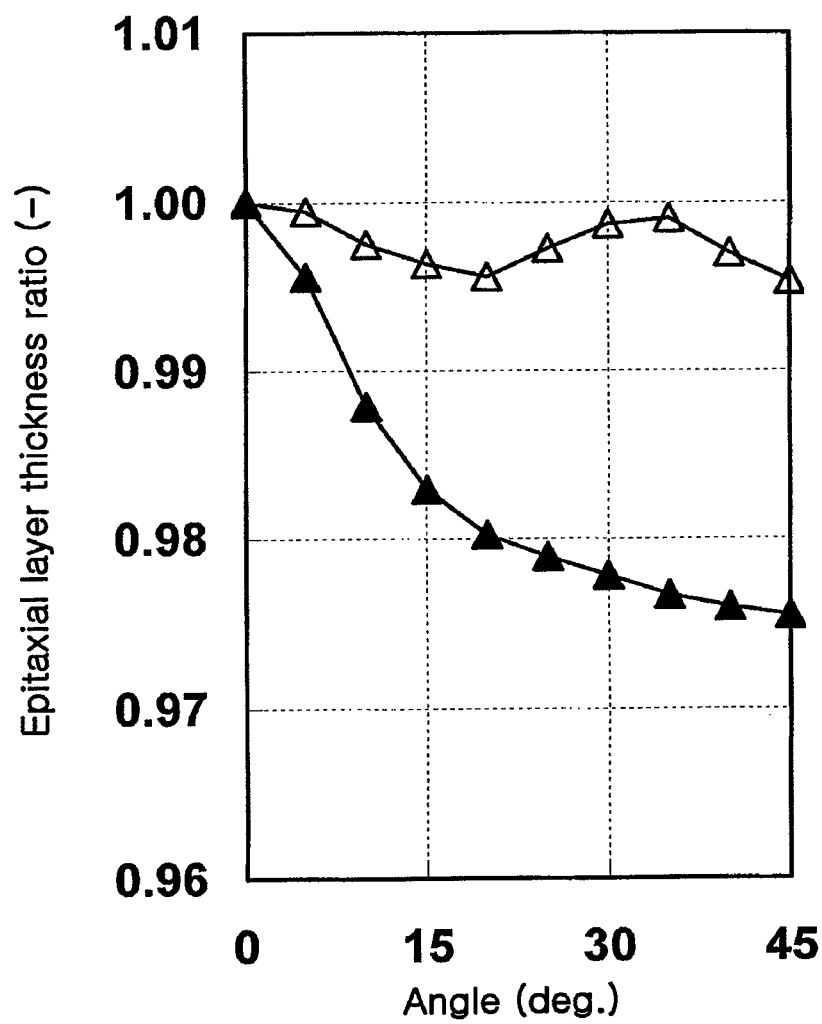
FIG. 21G is a graph in which average distribution of layer thickness of another epitaxial wafer obtained by the folding method of 45-degree.

Each of FIGS. 21D and 21E shows a graph in which an autocorrelation function is plotted as a function of an angle, in a similar manner as in FIGS. 4C and 4D. The normal susceptor clearly shows a periodicity of 90 degrees. In the special susceptor, periodicity cannot be recognized clearly although inconspicuous maxima are seen at every 90 degrees. Further, the rate of change of the autocorrelation function of the special susceptor is considerably smaller than that of the normal susceptor. FIG. 21F shows an average epitaxial layer thickness ratio obtained by the 45-degree fold back which was determined in a similar way as mentioned with respect to FIG. 4E. This graph shows that the variation in layer thickness distribution with angular periodicity is reduced when the special susceptor is used. Further, angular periodicity is inconspicuous, and reduction of this variation means that the difference in the epitaxial formation rate based on crystal orientation has been canceled by using the special susceptor. FIG. 21G shows an average epitaxial layer thickness ratio obtained by the 45-degree fold back when the epitaxial formation is performed at the low temperature. It is seen that, compared with FIG. 21F, the variation of the layer thickness ratio is larger to a certain extent. However, it is also noticed that the variation in layer thickness distribution with angular periodicity is reduced when the special susceptor is used, even in epitaxial formation at the low temperature. The figure further shows that the difference of the epitaxial formation rate based on the crystal orientation has been canceled by using the special susceptor.

Example 3

Figure 22:
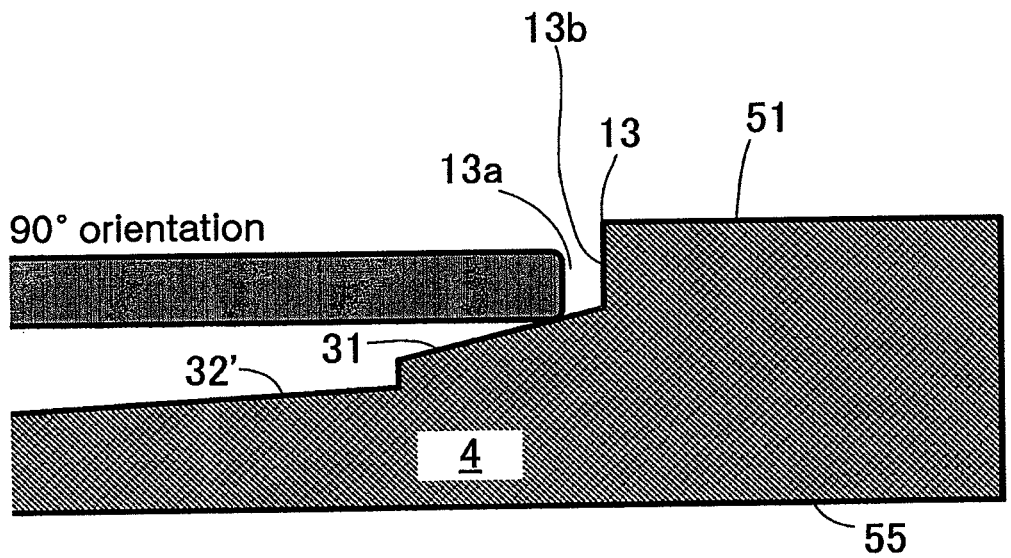
FIG. 22 is a partially enlarged cross section view of portion of the susceptor where thickness thereof is small according to Embodiment 3.
Figure 23:
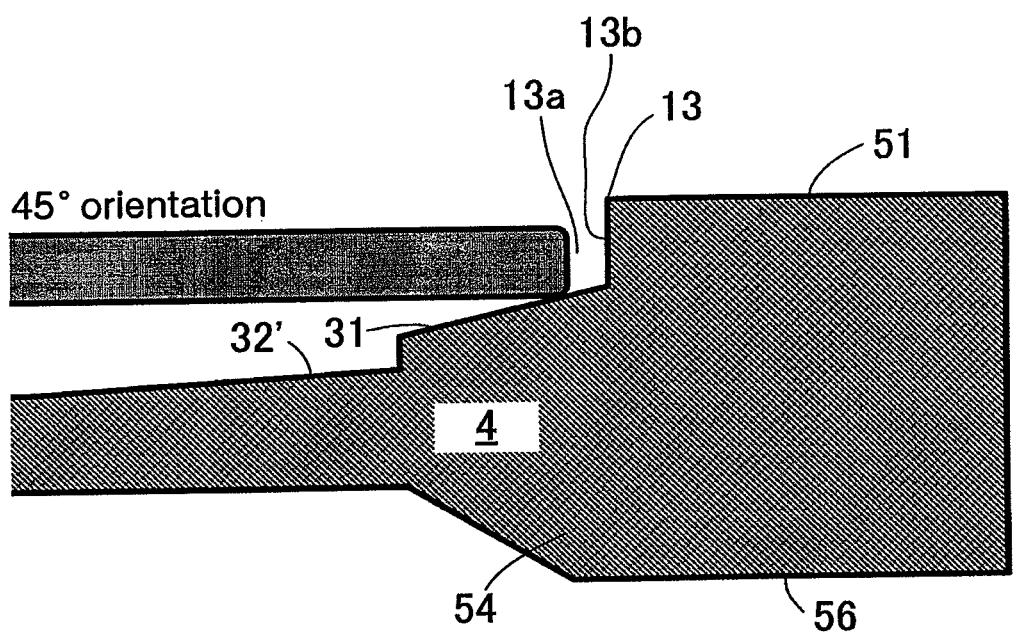
FIG. 23 is a partially enlarged cross section view of portion of the susceptor where thickness thereof is large according to Embodiment 3.
Figure 24:
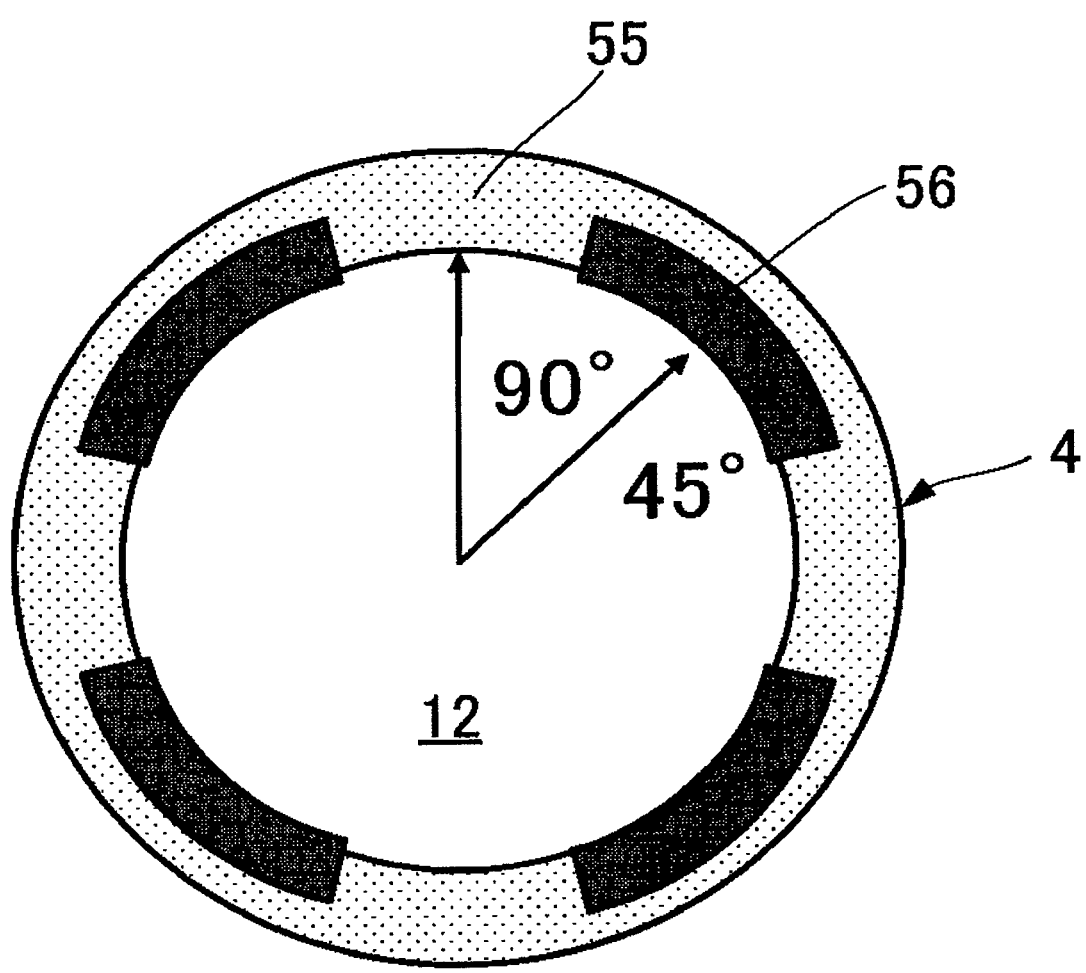
FIG. 24 is a bottom plan view of a susceptor of Embodiment 3.
Figure 25:
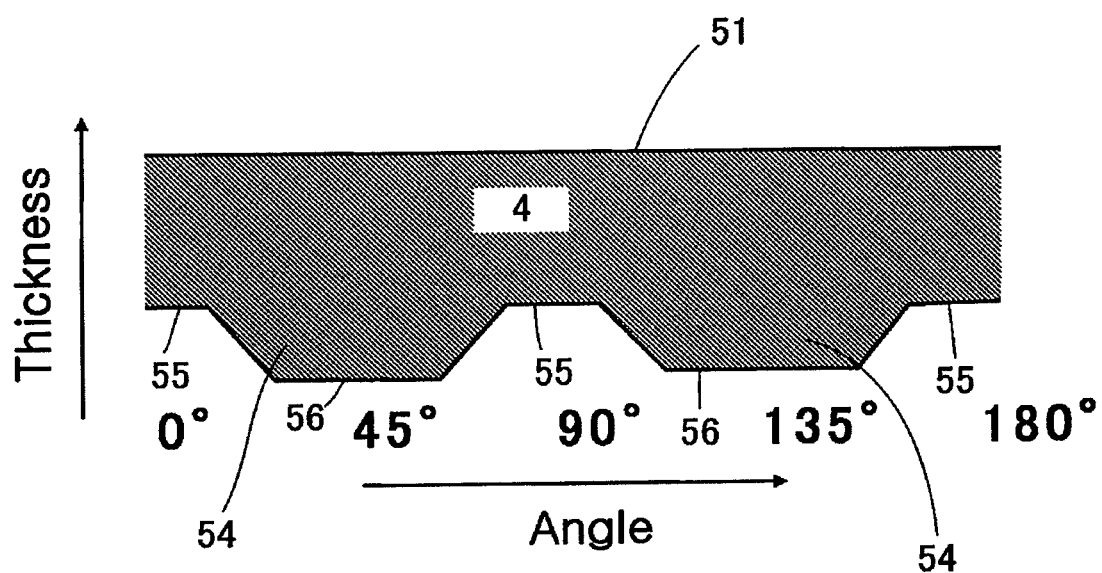
FIG. 25 is a view illustrating developed thickness of the susceptor of Embodiment 3.
Figure 26:
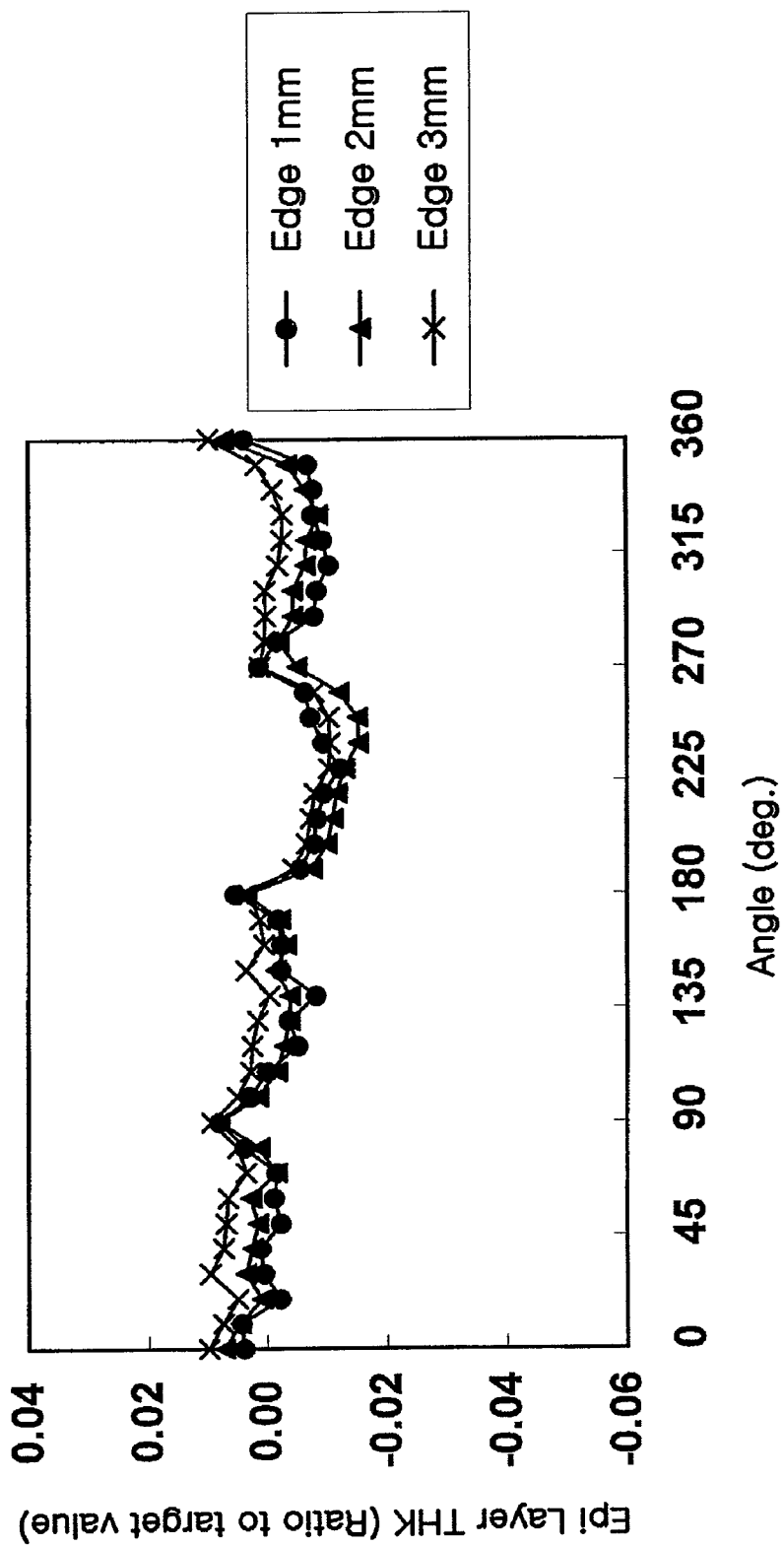
FIG. 26 shows a graph in which layer thickness of Embodiment 3 is developed and plotted.

FIGS. 22 to 26 show layer thickness distribution as an epitaxial layer is formed by changing thermal capacity (partial thickness of susceptor). Duplicated explanation thereof is omitted because of the similarity to FIGS. 9 and 10. FIGS. 22 and 23 show a partial enlarged cross section view of a susceptor and the like, and FIG. 24 is a schematic diagram of the bottom of the susceptor 4. FIG. 25 shows the variation of susceptor thickness developed with respect to the angle. FIG. 26 is a graph showing the effect of susceptor thickness on layer thickness developed with respect to the angle. In this susceptor, the partial thickness of a thick portion is about 20% larger than the partial thickness of a thin portion. As FIGS. 24 and 25 show, the thickness of the susceptor changes with a cycle of about 90 degrees.

In a (100) substrate (notch direction 0°) which is a semiconductor wafer, the growth rate of the epitaxial layer of an edge part becomes gradually smaller as the direction changes from 0° to 45°. The susceptor was machined so as to maximize the thickness of the portion in which the direction of 45° of a wafer is located when the wafer is loaded on the susceptor, and then epitaxial growth was undertaken. FIG. 26 shows that the variation of layer thickness depending on the crystal orientation is decreased considerably. When the layer thickness distribution of a location 1 mm inner from the outer circumference is estimated by using the above formula (formula 1), Δt was found to have been improved from 2.01% to 1.10%.

The flatness of an epitaxial wafer to be manufactured can be improved by combining with the thin and thick portions of the epitaxial layer formation surface of the semiconductor wafer to serve as a substrate.

Figure 27:
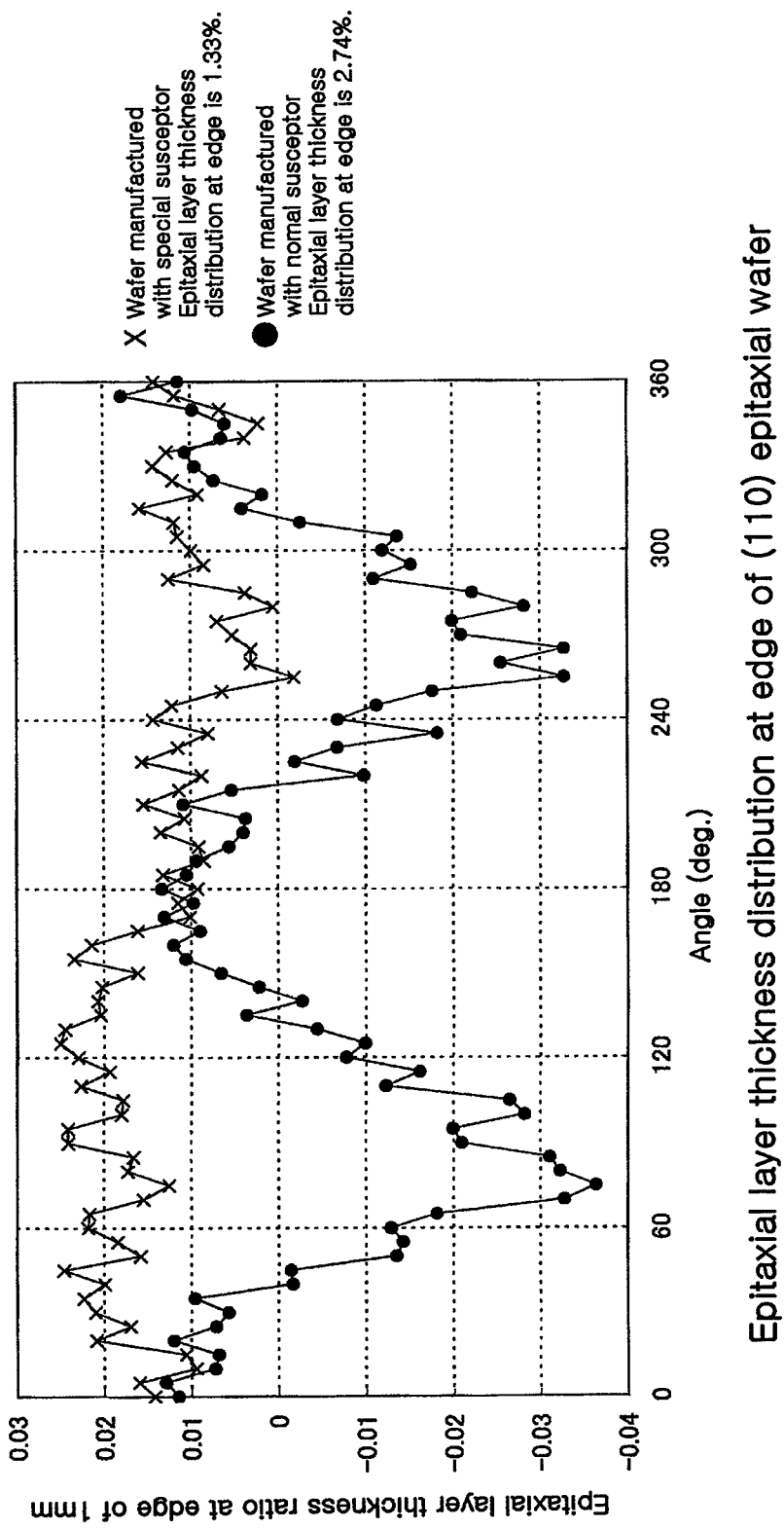
FIG. 27 shows a graph in which formed layer thicknesses on (110) epitaxial silicon wafers with the normal and special susceptors are developed and plotted against angle.

FIG. 27 shows the layer thickness distribution with the angular periodicity as a function of the angle of FIG. 3A when the epitaxial formation is conducted with a silicon wafer substrate having a (110) upper surface and using a regular susceptor and a special susceptor. The special susceptor was prepared by the method mentioned above so that the variation in the layer thickness distribution with angular periodicity is reduced. As shown in this graph, the layer thickness distribution with the angular periodicity changes with a cycle of about 180 degrees when the regular susceptor is used, but such a result is not necessarily obtained for the special susceptor.

Figure 28A:
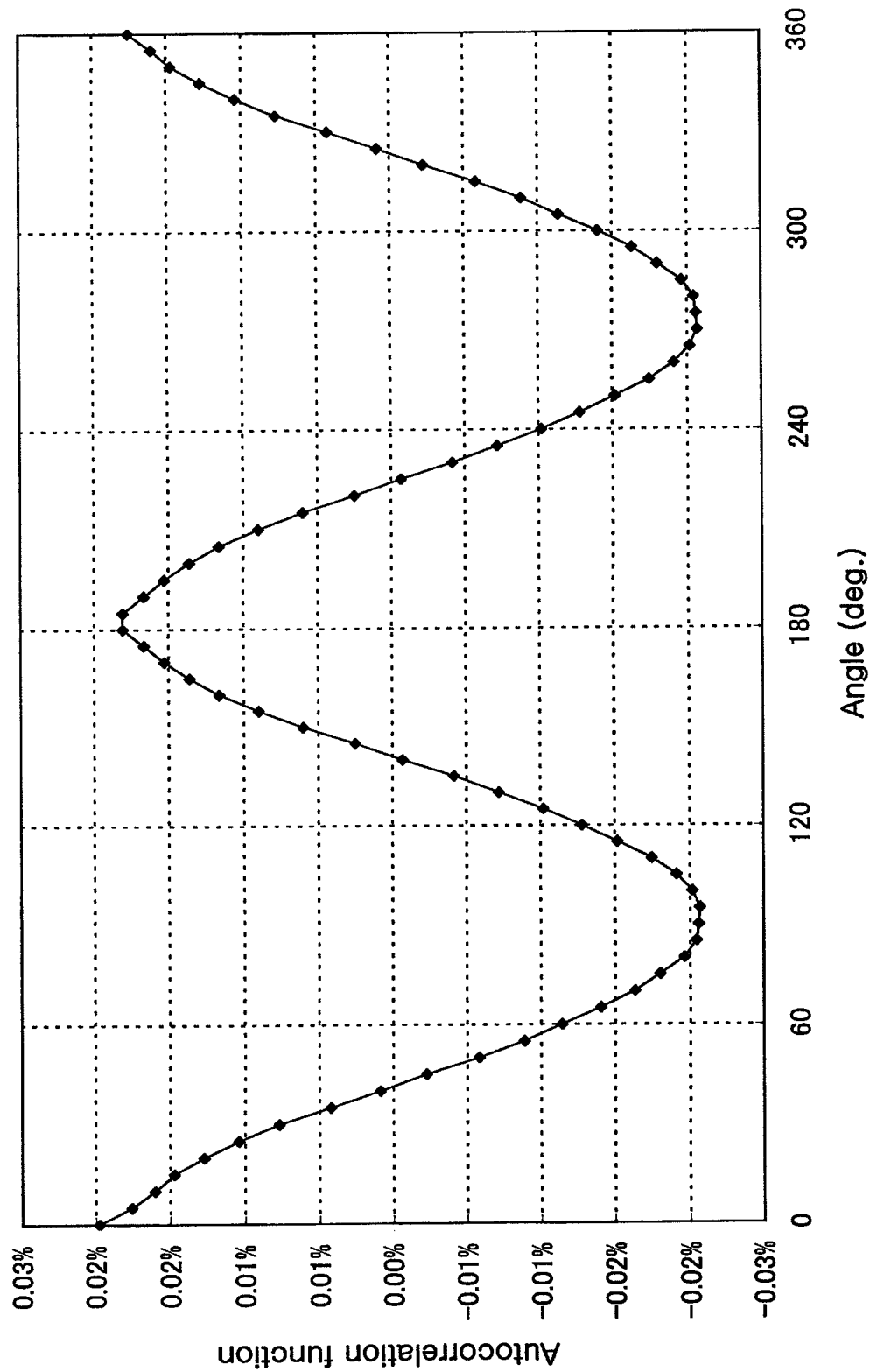
FIG. 28A shows a graph in which autocorrelation function of the thickness distribution with the normal susceptor shown in FIG. 27 is developed and plotted against angle.
Figure 28B:
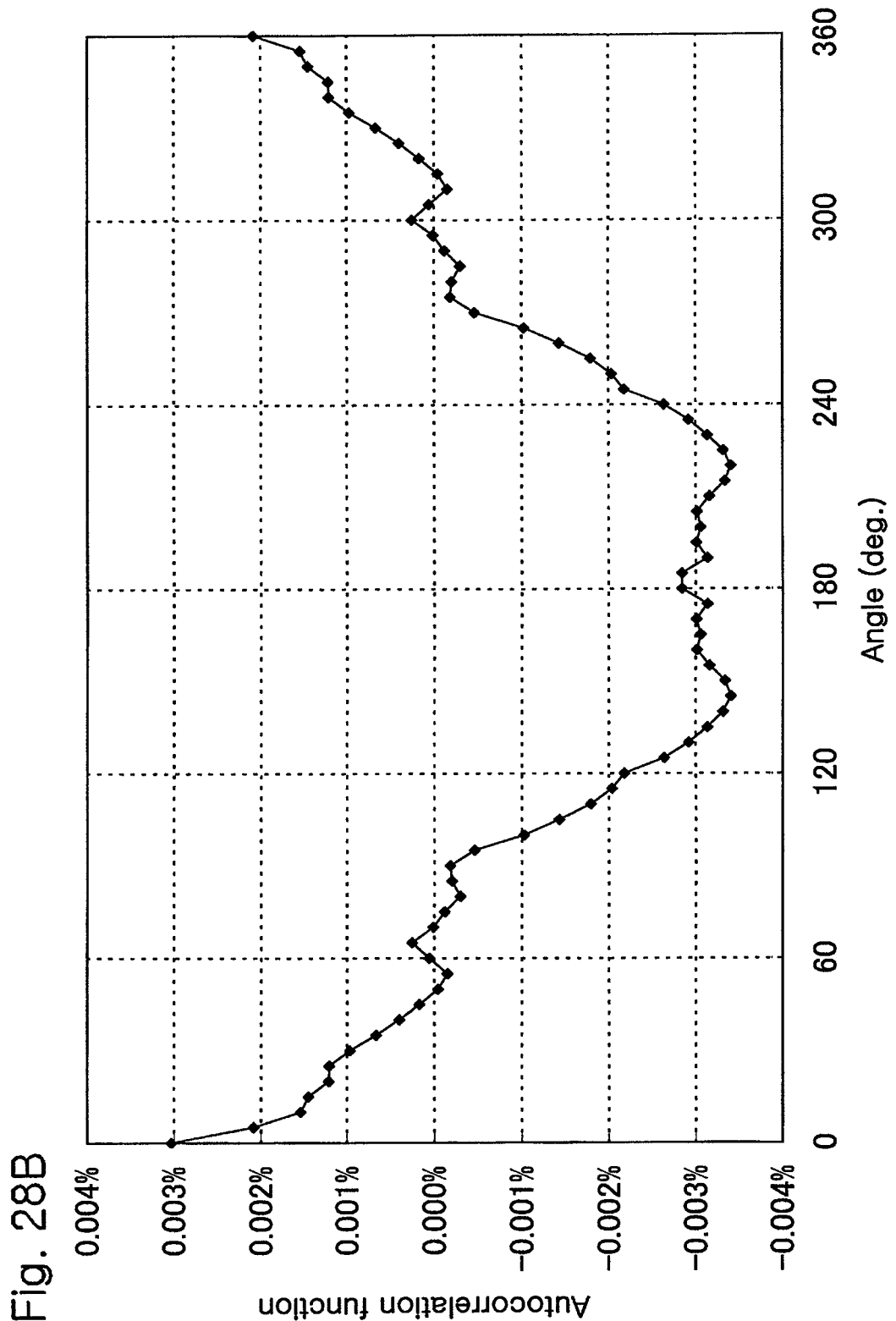
FIG. 28B shows a graph in which autocorrelation function of the thickness distribution with the special susceptor shown in FIG. 27 is developed and plotted against angle.

Each of FIGS. 28A and 28D shows a graph in which each autocorrelation function is plotted as a function of the angle. The plotted data is based on layer thickness distributions obtained when the normal susceptor and special susceptor of FIG. 27 are respectively used in a similar way as described in FIGS. 4C and 4D. The normal susceptor clearly shows a periodicity of 180 degrees. In the special susceptor, the periodicity cannot be recognized clearly although inconspicuous maxima are seen at every 90 degrees. Further, the rate of change of the autocorrelation function of the special susceptor is considerably smaller than that of the normal susceptor.

Figure 29:
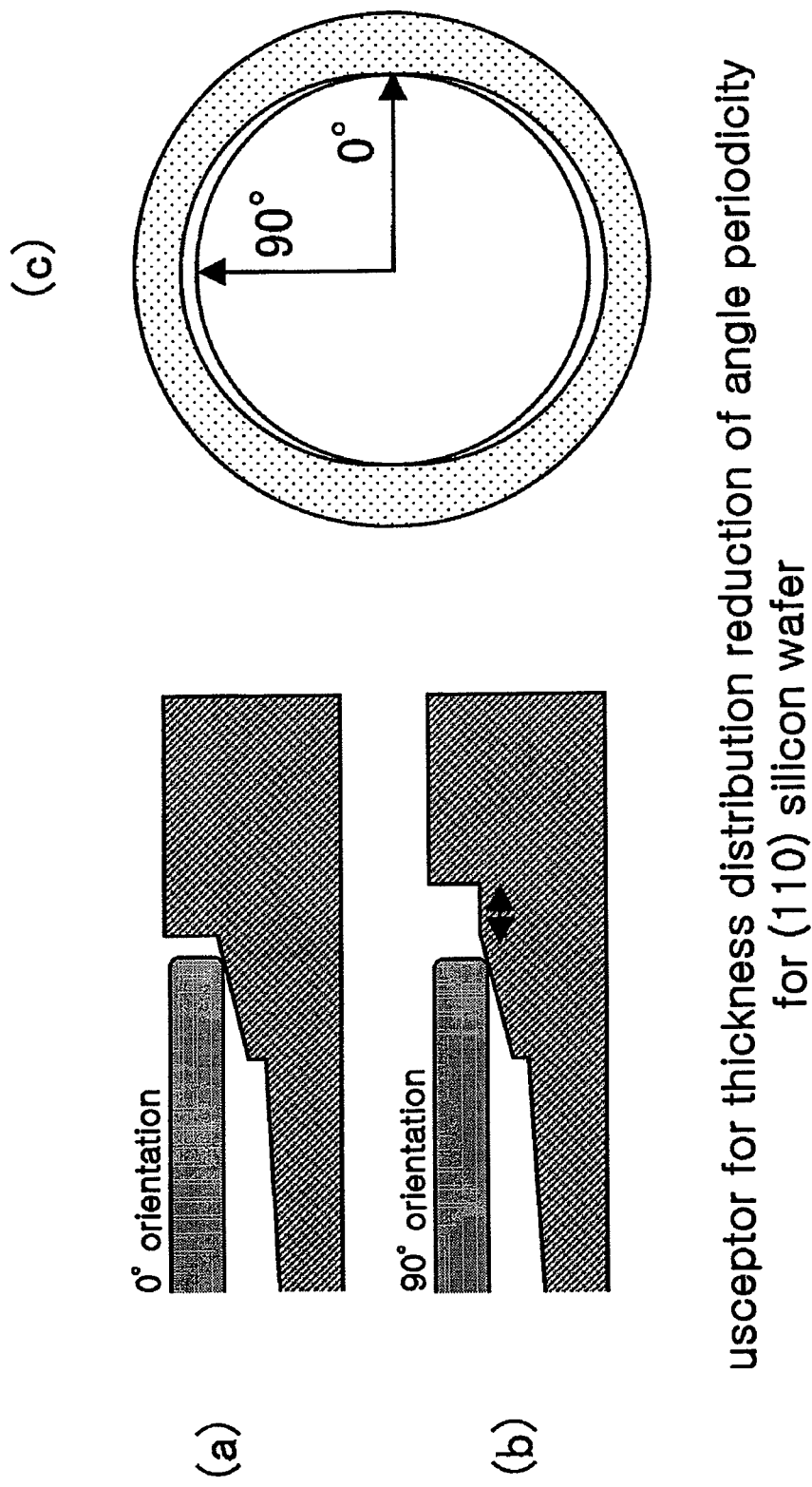
FIG. 29 illustrates a shape of the special susceptor.

Here, the relationship between the silicon wafer substrate and the special susceptor is explained using FIG. 29. FIG. 29 shows a silicon wafer substrate ((a)) placed on the special susceptor of the direction of 0 degree as shown in the top plan view ((c)). FIG. 29 shows a silicon wafer substrate ((b)) placed on the special susceptor of the direction of 90 degrees shown in the top plan view ((c)). As shown in FIG. 29, the gap space is larger in the direction of 90 degrees (or the direction of 270 degrees). Consequently, the epitaxial formation rate in the direction of 90 degrees (or the direction of 270 degrees) is increased.

Figure 30:
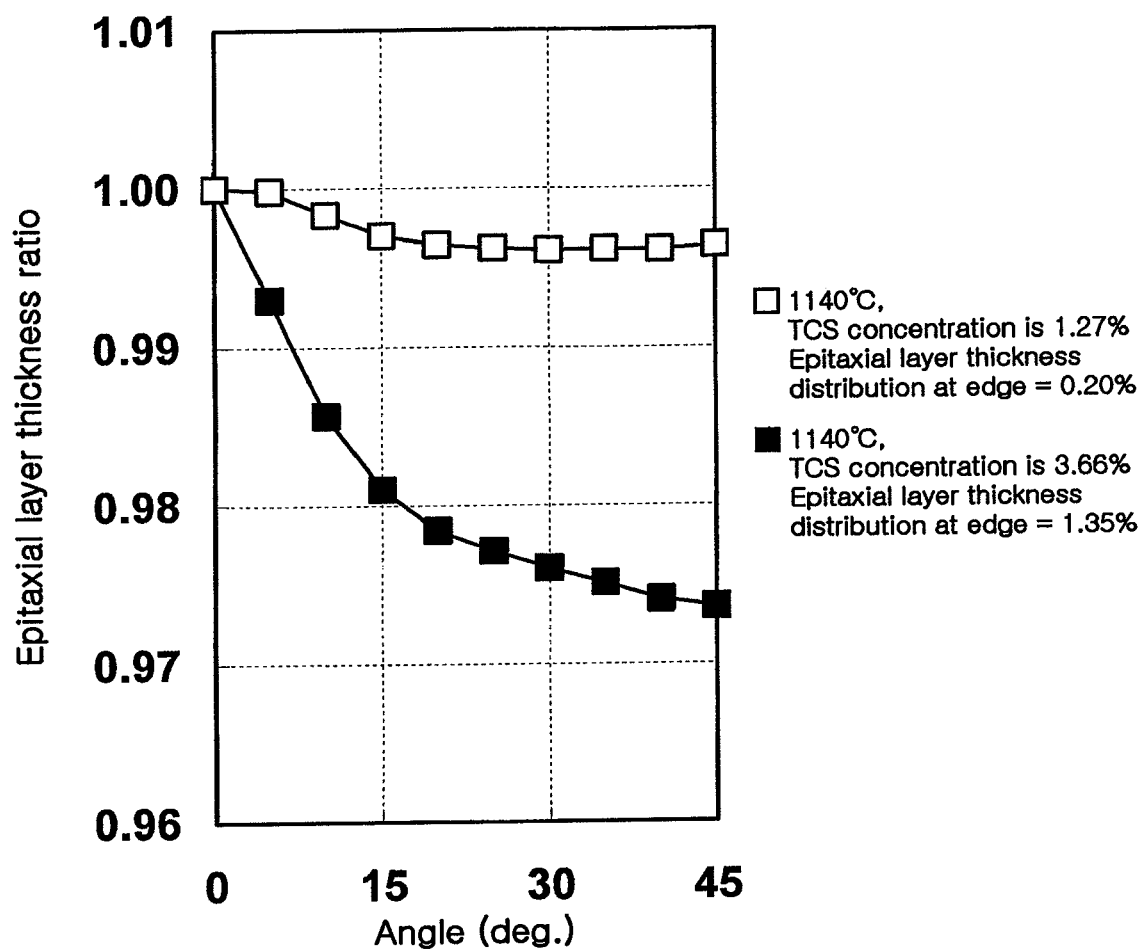
FIG. 30 is a graph in which average distribution of layer thickness shown in FIG. 27 obtained by the folding method of 45-degree.

FIG. 30 shows an average epitaxial layer thickness ratio obtained by the 45-degree fold back method as described in a similar way as in FIG. 4E. This graph shows that the variation in the layer thickness distribution with the angular periodicity is reduced when the special susceptor is used. Further, the angular periodicity is absent, and reduction of this variation means that the difference in the epitaxial formation rate based on crystal orientation can be canceled by using the special susceptor.

As described above, even if the crystal face of epitaxial formation of a silicon wafer substrate is (110), the variation in the thickness distribution with the angular periodicity becomes small if the special susceptor is used, and the difference in the epitaxial formation rate based on the crystal orientation can be canceled with the special susceptor. Thus, no matter what the crystal face of the epitaxial formation of the silicon wafer substrate may be, it is possible to flatten the layer thickness by the special susceptor.

Example 4

Figure 31:
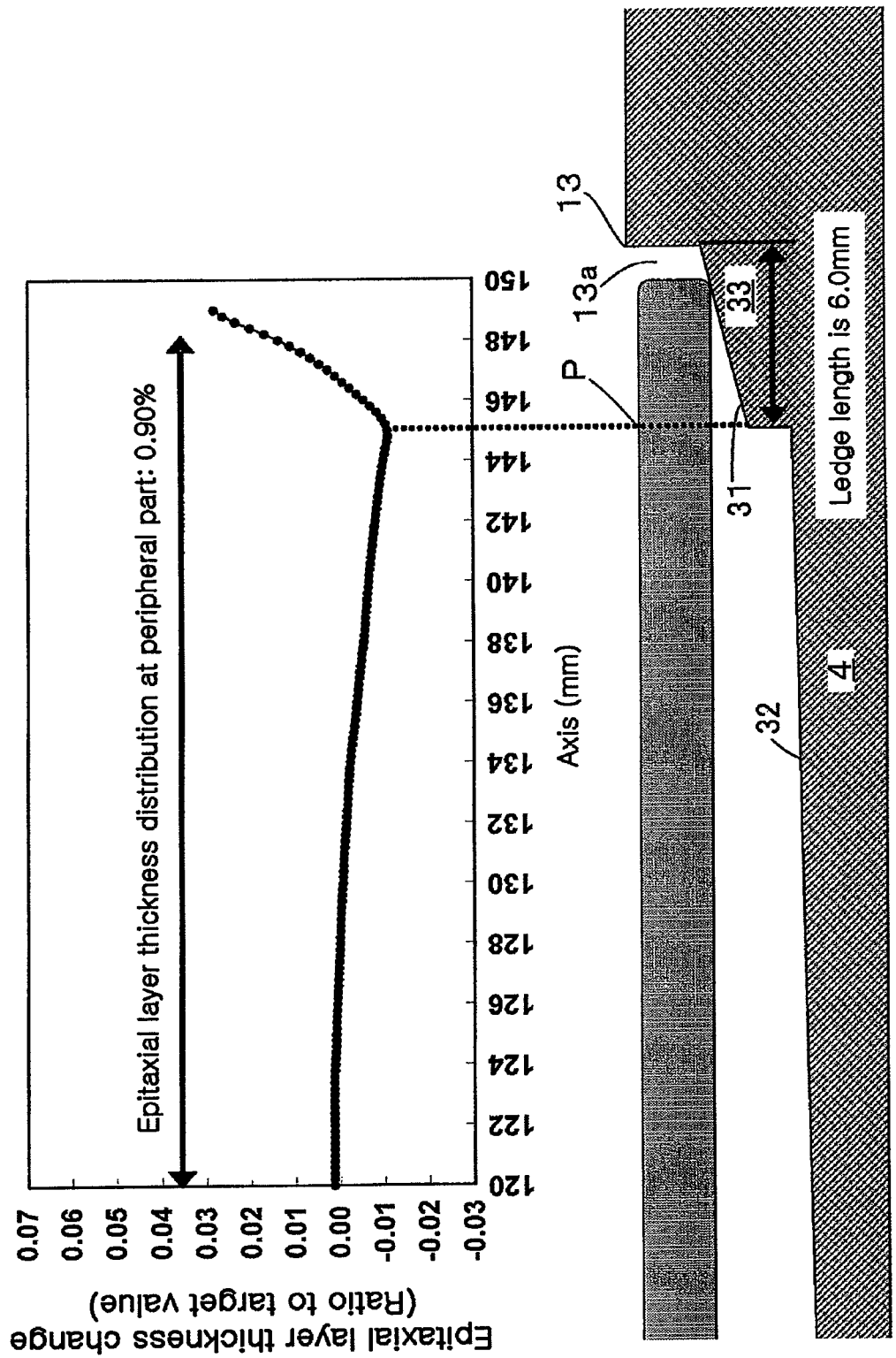
FIG. 31 illustrates a longitudinal cross section view illustrating in general a susceptor of Embodiment 4 and thickness distribution of epitaxial layer formed with the susceptor.

FIG. 31 shows a schematic diagram in which enlargement of the right end part of the susceptor 4 of FIG. 1 is displayed, and further a graph of epitaxial layer thickness distribution formed with the present apparatus. This susceptor 4 has a pocket width of 302 mm. The ledge length L of a ledge ('Ledge') part 33 provided with a tapered face 31 is 6.0 mm. The width of a space 13a defined by the outer circumferential face of a semiconductor wafer 12, the tapered face 31 and the inner circumferential face of a pocket 13 is about 1 mm. The epitaxial layer thickness formed with such an apparatus reaches a minimum at a location about 145 mm from the center of the wafer 12, and then increases rapidly from there. In this case, the thickness distribution of the epitaxial layer of the outer circumferential part in a device use field was 0.90%. Here, the vertical axis of FIG. 3 shows a change from the mean value of epitaxial layer thickness as a relative value with respect to the thickness of an objective epitaxial layer. The vertical axis of similar graphs in the following has the same meaning.

Example 5

Figure 32:
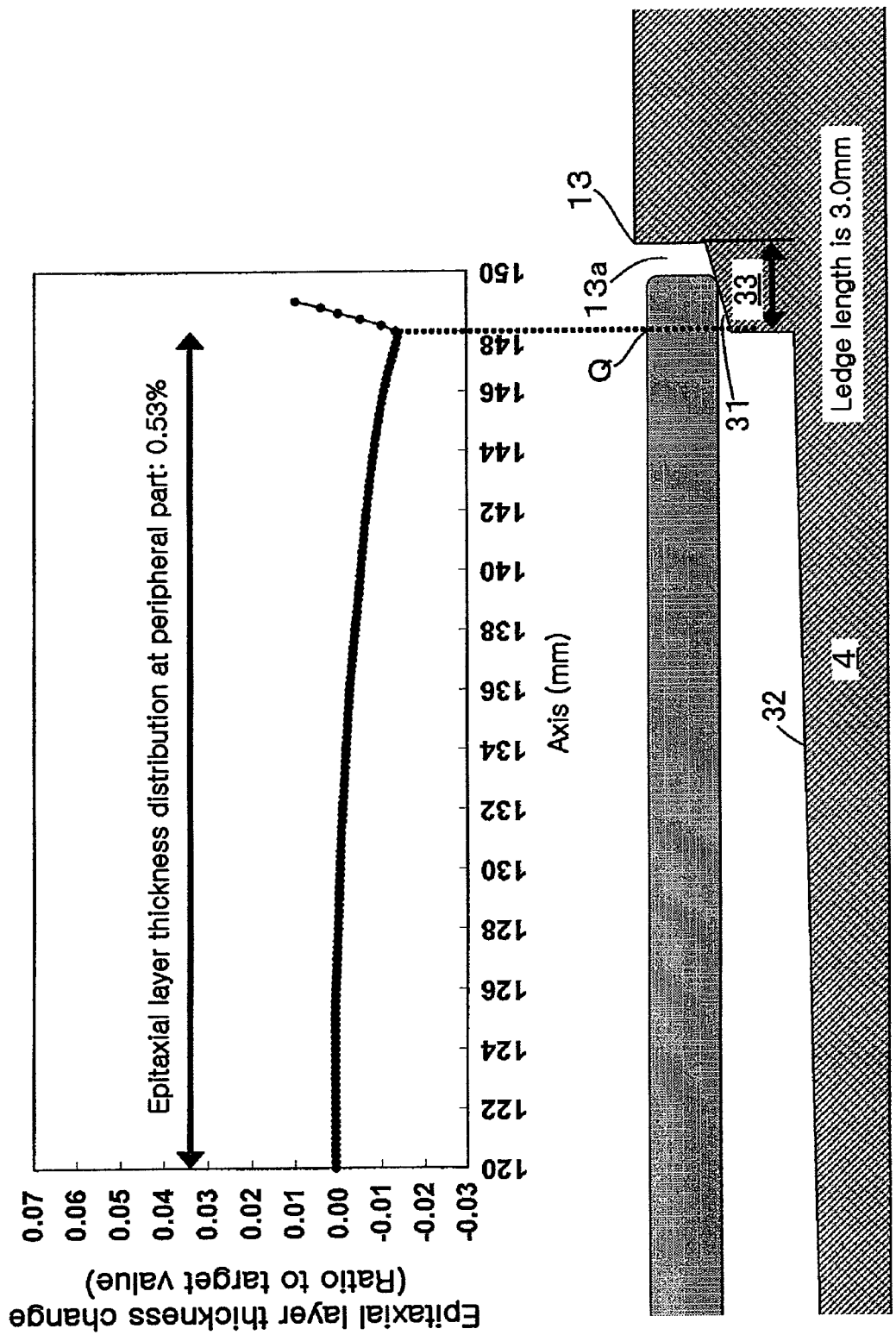
FIG. 32 illustrates a longitudinal cross section view illustrating in general a susceptor of Embodiment 5 and thickness distribution of epitaxial layer formed with the susceptor.

Although FIG. 32 shows basically the same drawing as FIG. 31 does, the ledge length L of a ledge ('Ledge') part 33 provided with a tapered face 31 is made to be 3.0 mm. The width of a space 13a defined by the outer circumferential face of a semiconductor wafer 12, the tapered face 31 and the inner circumferential face of a pocket 13 is about 1 mm. When a several micrometer-thick epitaxial layer was formed with such an apparatus, the thickness of the formed epitaxial layer reached a minimum at a location about 148 mm from the center of the wafer 12, and then increased rapidly from the location.

If the area to be utilized in the prepared epitaxial wafer is an area 2 mm or more inner from the outer circumference of this wafer (that is, an area 2 mm from the edge is cut off), for example, the thickness of the epitaxial layer of Example 2 becomes minimum at the boundary. That is, if the length L of the ledge part 33 is made to be 3.0 mm, a point Q where the thickness shows a minimum will not be included in the area to be utilized for the device. In this case, the thickness distribution of the epitaxial layer in the circumferential part in an area to be utilized for a device has improved from 0.90% of Example 4 to 0.53% of Example 5.

Example 6

Figure 33:
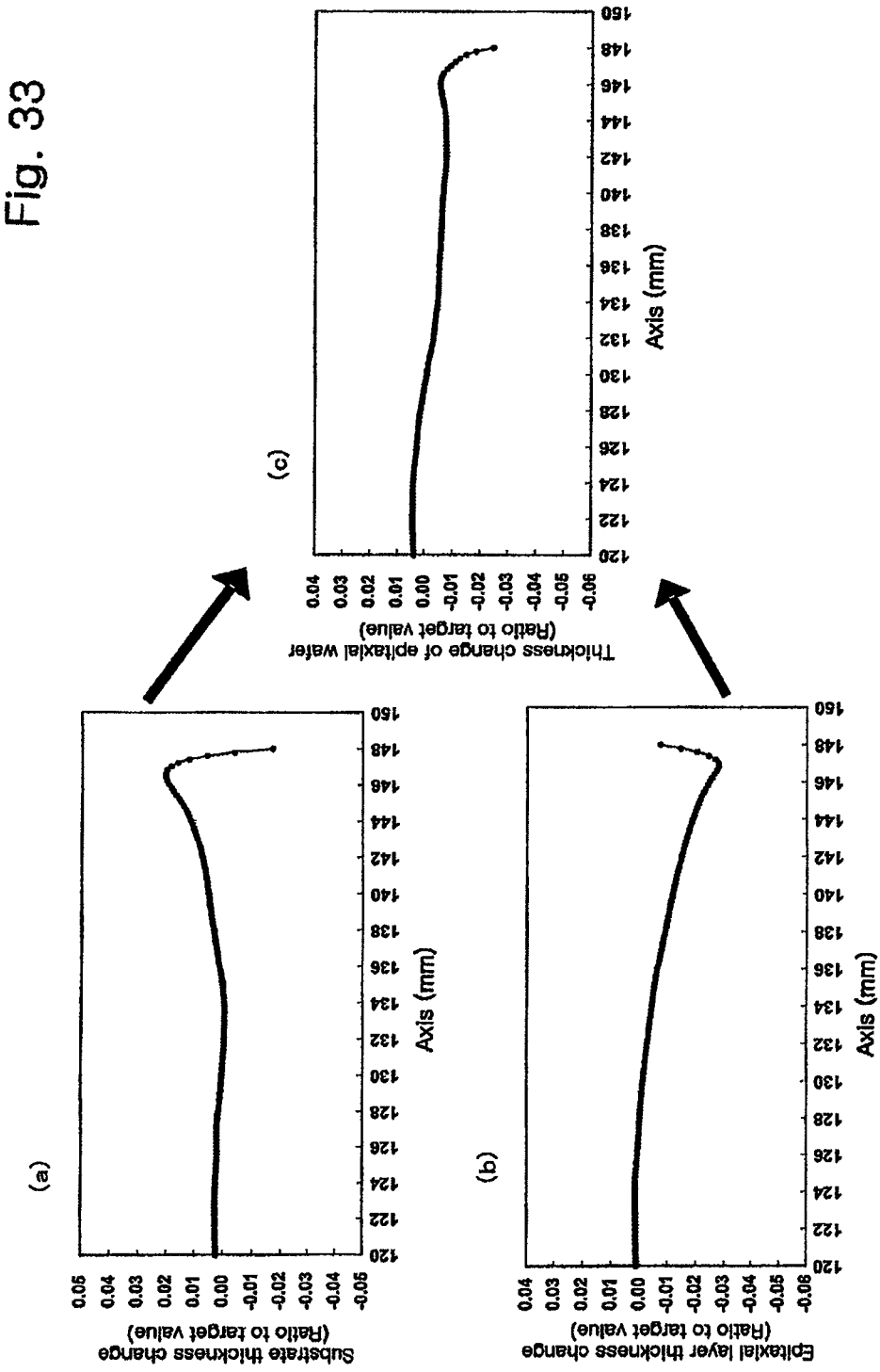
FIG. 33 illustrates height distribution of a surface of a semiconductor wafer serving as a substrate, thickness distribution of the epitaxial layer, and thickness distribution of the obtained epitaxial wafer.

FIG. 33 shows a case where the ledge length L of a ledge ('Ledge') part 33 is made to be 4.0 mm in a susceptor 4 having a pocket width of 302 mm. When an epitaxial layer having a thickness of several microns is formed using this susceptor 4 while keeping other preparation conditions identical with those of the above example, a thickness distribution of an epitaxial layer as shown in (b) of FIG. 33 was obtained. Layer thickness reached a minimum at a location 147 mm from the center (3 mm from the edge). In this example, a semiconductor wafer 12 to serve as a substrate had a thickness as shown in (a) of FIG. 33 on the epitaxial layer formation surface. The surface height of this wafer had the highest point at a location about 147 mm from the center (3 mm inner from the edge). The thickness distribution of the epitaxial wafer formed of a combination of such a substrate and a layer is shown in (c) of FIG. 33. The graph shows that the flatness of the epitaxial wafer resulting from such a combination is high.

As mentioned above, the thickness of the formed epitaxial layer can be changed by changing the length of the ledge part. In particular, it is possible to control the location from which the increase in thickness of the epitaxial layer in the vicinity of the outer circumference of an epitaxial wafer starts, and the extent of the increase. Since the ledge length is freely changeable as far as the function of a ledge part of holding the semiconductor wafer is satisfied, the control is made easy. Further, if a ledge length which fits the substrate shape is selected, it is possible to keep the flatness in the area to be utilized for a device high up to the vicinity of the edge part.

The flatness of the epitaxial wafer to be manufactured can be improved by a combination with thin and thick portions of the epitaxial formation surface of the semiconductor wafer to serve as a substrate. It is also possible to set off the differences in an epitaxial formation rate due to the difference in the crystal orientation by utilizing the difference in the epitaxial formation thickness due to the difference in the length of such a ledge part. Moreover, such techniques may be combined to provide an epitaxial silicon wafer with high flatness.

In addition to the above, the following may be included in the present invention.

(1) An apparatus for manufacturing an epitaxial wafer by growing an epitaxial layer with reaction of a semiconductor wafer and a source gas in a reaction furnace comprising: a pocket having an opening in which the semiconductor wafer is placed; a susceptor for holding the semiconductor wafer; and an orientation-dependent control means dependent on a crystal orientation of the semiconductor wafer and/or an orientation-independent control means independent from the crystal orientation of the semiconductor wafer, wherein the apparatus may increase flatness in a peripheral part of the epitaxial layer.

(2) The apparatus for manufacturing the epitaxial wafer according to the above (1), wherein the orientation-dependent control means comprises the susceptor having a structure and/or shape changing periodically near an inner face of the opening to a change of a crystal orientation of the semiconductor wafer.

(3) The apparatus for manufacturing the epitaxial wafer according to the above (2), wherein the susceptor has a spot facing with a depth thereof changing near the inner face of the opening in synchronization with the change of the crystal orientation of the semiconductor wafer.

(4) The apparatus for manufacturing the epitaxial wafer according to above (2), wherein the pocket has a width changing near the inner face of the opening in synchronization with the change of the crystal orientation of the semiconductor wafer.

(5) The apparatus for manufacturing the epitaxial wafer according to the above (2), wherein the susceptor has a width changing near the inner face of the opening in synchronization with the change of the crystal orientation of the semiconductor wafer.

(6) The apparatus for manufacturing the epitaxial wafer according to any one of the above (1) to (5), wherein the orientation-independent control means comprises a ledge part extending inwardly inside of the opening of the susceptor for a predetermined length, the ledge part provided in a lower part of the opening such that the semiconductor wafer is placed, the ledge part having the predetermined length; and/or a shape in a peripheral part of the semiconductor wafer.

(7) The apparatus for manufacturing the epitaxial wafer according to the above (6), wherein the predetermined length of the ledge part is equal to or more than 2 mm and less than 6 mm.

(8) The apparatus for manufacturing the epitaxial wafer according to any one of the above (1) to (7), wherein the orientation-independent control means comprises a control device capable of controlling a raw material concentration and/or a temperature wherein the raw material concentration is equal to or less than a predetermined concentration and/or the temperature is equal to or more than a predetermined temperature.

Here, the predetermined concentration is, for example, equal to or less than 3.5% if trichlorosilane is utilized and the orientation-dependent control means is not used. And it is more preferable to be 2.5% or less. Further, it is preferably 1.5% or less. Here, in general, as the source gas concentration is lowered, the epitaxial formation rate is also lowered such that it is more preferable to make the concentration higher to increase the productivity in an industrial view point. Also, the predetermined temperature is, for example, preferably 1100 Celsius or higher. More preferably, it is 1110 Celsius or higher. Even more preferably, it is 1120 Celsius or higher. In particular, when the concentration is less than 1.5%, it is preferable to be 1120 Celsius or higher. Here, in general, at higher temperature, the grown epitaxial layer tends to have a rough surface, which is not preferable. Thus, if the orientation-dependent control means is not used, it is possible to determine the preferable condition as a whole in consideration of reduction of variation in the layer thickness distribution of the angle periodicity, industrial productivity, quality of the product, and the like. Also, when the orientation-dependent control means is used, such concentration condition and temperature condition are suitably combined to determine the optimum manufacturing condition.

(9) A method of manufacturing an epitaxial wafer by growing an epitaxial layer with reaction of a semiconductor wafer and a source gas in a reaction furnace comprising the steps of: providing the semiconductor wafer from an opening of a pocket of a susceptor; fixing the semiconductor wafer to the susceptor of an epitaxial wafer manufacturing apparatus, the susceptor comprising: an orientation-dependent control means dependent on a crystal orientation of the semiconductor wafer and/or an orientation-independent control means independent from the crystal orientation of the semiconductor wafer; and forming an epitaxial layer as the susceptor is rotated with the semiconductor wafer.

(10) The method of manufacturing the epitaxial wafer according to the above (7), the orientation-dependent control means comprises the susceptor having a structure and/or shape changing periodically according to the change of the crystal orientation of the semiconductor wafer.

(11) The method of manufacturing the epitaxial wafer according to the above (9) or (10), wherein the epitaxial layer is formed at 1120 Celsius or higher temperature.

(12) The method of manufacturing the epitaxial wafer according to the above (11), wherein the epitaxial layer is formed as a raw material concentration is controlled to be equal to or less than a predetermined concentration.

(13) The method of manufacturing the epitaxial wafer by utilizing a silicon wafer substrate of (110) crystal orientation wherein a variation in an edge part of an epitaxial layer thickness distribution of angle periodicity can be reduced.

(14) An epitaxial wafer manufactured by the method as recited in the above (9), wherein the manufactured epitaxial wafer has higher flatness than the semiconductor serving as a substrate.

(15) An epitaxial wafer manufactured by the method as recited in the above (9), wherein an epitaxial layer thickness distribution in a circumferential direction in a peripheral part of the manufactured epitaxial wafer indicates enough flatness that the epitaxial wafer is suitable for a device process.

(16) An epitaxial wafer characterized in that a variation of an epitaxial layer thickness distribution in a circumferential direction in a peripheral part is equal to or less than 0.5%.

Here, the peripheral part may, for example, be designated to a portion 1 mm inner from the outer edge of the epitaxial wafer. Other than this, if the diameter of the disk-like epitaxial wafer is d, a concentric circle with the diameter of 98% of 'd' and vicinity thereof may be the peripheral part. And since the variation of the layer thickness distribution tends to be larger as the diameter of the peripheral part becomes larger, if the peripheral part is designated to be the concentric circle and vicinity thereof with the diameter thereof 99.5% of 'd', a wider area can have the flatness. Further, if the outside of the concentric circle with the diameter thereof 99.5% of 'd' is designated to the peripheral part, even larger area has the flatness.

(17) A method of determining a manufacturing condition for growing an epitaxial layer with reaction of a semiconductor wafer and a source gas in a reaction furnace to manufacture an epitaxial wafer, the method comprising the steps of: manufacturing an epitaxial wafer in a predetermined initial manufacturing condition; measuring flatness along a circumferential direction in a peripheral part of the manufactured epitaxial wafer in the initial condition; determining an effect on the flatness in the peripheral part of the manufactured epitaxial wafer with respect to the orientation-dependent control means and/or the orientation-independent control means; and determining the manufacturing condition to increase the flatness in the peripheral part of the epitaxial wafer by combining or selecting from the orientation-dependent control means and the orientation-independent control means in accordance with a result of measured flatness in the peripheral part of the manufactured epitaxial wafer in the predetermined initial manufacturing condition.

(18) An apparatus for manufacturing an epitaxial wafer by growing an epitaxial layer with reaction of a semiconductor wafer and a source gas in a reaction furnace comprising: a susceptor having a pocket having an opening in which the semiconductor wafer is positioned, wherein the semiconductor wafer is fixed to the susceptor and the susceptor has a structure and/or shape changing periodically according to the change of the crystal orientation of the semiconductor wafer near an inner face of the opening.

The formation rate of the epitaxial layer may be different depending on the crystal orientation. For example, in the silicon single crystal, as represented by a facet $\{111\}$ and a facet $\{311\}$ on (100) crystal face, it is know that the formation rate in the peripheral part of the wafer shows the dependency of the crystal orientation according to the shape of the chamfered portion.

High or low layer thickness with a cycle of 90 degree occurs in the peripheral part of the epitaxial wafer obtained as a result of the production. In order to prevent this effectively, it is preferable to provide a compensation means in accordance with the crystal orientation near the peripheral part of the semiconductor wafer serving as a substrate.

On the other hand, the semiconductor wafer serving as the substrate is rotated at a predetermined rotational speed in order to obtain the uniform layer thickness in general as the epitaxial layer is formed in the chamber of the epitaxial manufacturing apparatus. Therefore, the crystal orientation always changes relative to the epitaxial manufacturing apparatus. And, if the compensation means is fixed on the epitaxial manufacturing apparatus itself, it is a moveable member in synchronization with the semiconductor wafer rotation. On the other hand, since the semiconductor wafer is fixed to the susceptor having the pocket as described below, the crystal orientation of the semiconductor wafer is fixed to the susceptor. Since the semiconductor wafer is rotated together, it is beneficial if the structure and/or shape and other features are changed according to the crystal orientation, i.e., the susceptor so as to adjust the formation rate. Here, the structure is an integrated body being combined with various elements related with each other and a mutual relationship with each element. For example, the structure includes a combination of materials, members, and so on. Also, the shape is a configuration or figure of things and a state of existence. For example, it includes a triangle, a circle, a box shape, and so on. Big or small dimension may be included as different shapes. Here, the pocket provided in the susceptor basically has a flat bottom face and is in a circular recess (shape capable of accommodating a disk-like wafer). That is, the circular recess of the pocket may be comprised basically of an approximately vertical face (hereinafter referred to as "inner face") and a bottom face.

In general, since the formation rate of the epitaxial layer is dependent on the flow rate of the gas for growth, concentration of silicon constituent, temperature, and so on, it is preferable to provide members capable of changing these near the inner face of the opening of the pocket of the susceptor where the semiconductor wafer is placed. More specifically, details are described below.

(19) The apparatus for manufacturing the epitaxial wafer according to the above (18), wherein the susceptor has a spot facing with a depth thereof changing near the inner face of the opening in synchronization with the change of the crystal orientation of the semiconductor wafer.

Here, the depth of the spot facing may be a distance from the top face of the member defining the pocket of the susceptor to the ledge holding the semiconductor wafer. The thickness of the semiconductor wafer is uniform in the circumferential direction and the height of the ledge which supports the wafer is uniform. Therefore, in order to change the depth of the spot facing, the position of the top face of the member defining the pocket is changed. That is, the top face of the member of the susceptor which defines the pocket repeats up and down along the circumferential direction with a predetermined periodic cycle. The predetermined periodic cycle is synchronized with the periodic cycle of the crystal orientation which may affect the formation rate of the epitaxial layer and more specifically, it may include approximately 90 degrees, approximately 180 degrees, and approximately 270 degrees. Likewise in "predetermined cycle" to be described below.

The up and down may be a curve such as a sine curve and a linear type such as box element or triangle element. For example, in the silicon semiconductor wafer, it is preferable that the depth of spot facing is shallow in the [100] direction and the depth of spot facing is deep in the [110] direction.

(20) The apparatus for manufacturing the epitaxial wafer according to the above (18), wherein the susceptor is characterized in that a pocket width changes near the inner face of the opening in synchronization with the change of the crystal orientation of the semiconductor wafer.

Here, the pocket width of the susceptor may be a pocket width viewed in the top view of the pocket of the susceptor in which the semiconductor wafer is placed. At this time, since the semiconductor wafer shows approximately a circle in the top view, if the pocket width changes with a cycle of approximately 90 degrees, the distance between the outer circumferential face and the inner face of the opening of the pocket changes wide and narrow with a cycle of approximately 90 degrees.

This change of wide-and-narrow could be a curve or curve-like if it is developed in the direction of circumferential direction, and could be linear comprised of a box element or a triangular element. For example, in the case of the silicon semiconductor wafer, it is preferable that the distance in the [100] direction becomes wider and that in the [110] direction is narrower.

Further, the semiconductor does not show an approximately circular in the top view, it is preferable that the gap between the outer face of the semiconductor wafer and the inner face of the opening of the pocket changes with a cycle of 90 degrees rather than the pocket width changes with a cycle of 90 degrees. The way of changing is similar to what mentioned above.

(21) The apparatus for manufacturing the epitaxial wafer according to the above (18), wherein the susceptor has heat capacity changing near the inner face of the opening in synchronization with the change of the crystal orientation of the semiconductor wafer.

Here, the heat capacity change may be a partial heat capacity change with a cycle of 90 degree in the circumferential direction of the opening of the pocket. For example, it may include that the diameter of the susceptor is changed near the opening with a cycle of 90 degree. Although the shape of the susceptor does not change in the circumferential direction, it may include changing the heat capacity by changing the kinds of materials. For example, it is possible to berry a lump of iron in the susceptor made of carbon.

This heat capacity change, if developed in the circumferential direction, may be a curve such as a sine curve and a linear line such as straight line comprised of a box element or a triangular element. For example, in the silicon semiconductor wafer, it is preferable that the heat capacity is big in the direction and the heat capacity is small in the [110] direction.

As mentioned above, although the depth of spot facing, the pocket width, and the heat capacity are treated as separate conditions, these conditions can be combined with any other one or two. For example, the depth of the spot facing and the pocket width; the pocket width and the heat capacity; the heat capacity and the depth of the spot facing; and the depth of spot facing and the heat capacity can be made.

(22) A susceptor to be utilized in the epitaxial wafer manufacturing apparatus in which the epitaxial grows with reaction of the semiconductor wafer and the source gas in the reaction furnace, the susceptor comprising: a pocket having an opening in which the semiconductor wafer is placed; a member having a shape changing near the inner face of the opening with a cycle of a predetermined period along the circumferential direction.

(23) A method of manufacturing an epitaxial wafer by growing an epitaxial layer with reaction of a semiconductor wafer and a source gas in a reaction furnace to manufacture an epitaxial wafer, the method comprising the steps of: providing the semiconductor wafer from an opening of a pocket; changing a structure and/or shape near the inner face of the opening along a circumference with a predetermine periodic cycle, wherein the change of the structure and/or shape is synchronized with the crystal orientation of the semiconductor wafer; fixing the semiconductor wafer to the susceptor; and forming the epitaxial layer as the susceptor is rotated with the semiconductor wafer.

As described above, an example of the epitaxial growth on the (100) face of silicon is explained. However, the present invention is not limited thereto, but it may apply to any kind of epitaxial manufacturing apparatus and the susceptor utilized therein and other equipment. The apparatus can be applied to form the epitaxial layer of any kind of material having the epitaxial forming rate which had dependency on the crystal orientation. Here, the epitaxial wafer having a peripheral part characterized by the uniform thickness without any dependency on the crystal orientation may be manufactured by changing the cyclic period, degree of increase-and-decrease, and other conditions in accordance with the features of the crystal orientation dependency.

(24) A method of manufacturing an epitaxial wafer by growing an epitaxial layer with reaction of a semiconductor wafer and a source gas in a reaction furnace to manufacture an epitaxial wafer, the method comprising the steps of: providing the semiconductor wafer on a ledge part of a susceptor having an opening in which the semiconductor wafer is positioned; providing the ledge part at a lower part of the opening such that the ledge part extends with a predetermined length inside of the opening of the susceptor and the semiconductor wafer is placed thereon; and controlling an epitaxial layer thickness grown by changing the predetermined length of the ledge part.

Here, the semiconductor wafer is held by the ledge ('Ledge') part formed in the pocket having an opening of the susceptor. For example, the pocket may basically have a circular recess (capable of accommodating the disk-like wafer) having a flat bottom face. That is, the circular recess of the pocket is defined by an approximately vertical face (hereinafter referred to as "inner face") and a bottom face. The ledge part may comprise a member provided on a bottom face along the circumferential direction of the opening a top face of a tapered shape (a cup shape with a gently inclined side wall) extending inwardly as far as the predetermined length from the inner face. The ledge part drops to form a so-called shelf if it goes inwardly for the above predetermined length although the top face is tapered to securely support the semiconductor wafer with the minimum contact area. That is, there it is directed to the bottom face of the pocket by the approximately vertical wall. In this way, the ledge part has a shelf shape with a step formed by the drop. This is similar to the shelf shape formed by the fixed washer to the bottom face just like the washer dropped in a circular recess. Since the top face is tapered, the washer could be shaped like a disc spring. The ledge part may not be a separate part, but it may be integrally formed in body with the susceptor. The semiconductor wafer is supported on the ledge part by contacting directly or indirectly with the ledge part on a part of the back face (e.g., a toric ring). Thus, the ledge part is very close to the back face of the semiconductor wafer, but the bottom part of the opening dropping from the ledge part is much far from the back face of the semiconductor wafer.

When the ledge part is in a high temperature by the heat provided from the susceptor, the distance from the back face of the semiconductor is so short that the heat from the ledge part could be transferred with ease and the circumferential part of the semiconductor wafer which overlaps with the ledge part (hereinafter referred to as "ledge area") tends to be in the high temperature. Therefore, it is plausible that the ledge area of the semiconductor wafer causes the forming rate of the epitaxial layer on the top face to increase since the heat transferred from the back face and the side face makes the ledge area hot. Therefore, the thickness of the epitaxial layer increases abruptly as it goes outwardly. Here, the ledge area where the semiconductor wafer overlaps with the ledge part is on the top face of the semiconductor wafer (the opposite face to the back face of the semiconductor wafer where the ledge part touches) and a circumferential part on the top face of the semiconductor wafer at the position corresponding to a position where the ledge is provided.

(25) The method of manufacturing the epitaxial wafer according to the above (24), wherein at least one of both faces of the semiconductor wafer is constituted of a device useable area and the peripheral part surrounding the device useable area; and wherein the predetermined length of the ledge part is adjusted not to reach a position corresponding to a position of the device useable area on the epitaxial wafer.

As mentioned above, the thickness of the epitaxial layer in the ledge area of the semiconductor wafer tends to change drastically and the flatness on the manufactured epitaxial silicon wafer is more demanding. Therefore, it is not easy to maintain high flatness of the manufactured epitaxial silicon wafer only by adjusting the thickness of the semiconductor wafer serving as a substrate. It is also strongly demanded that the flatness in the peripheral part of the epitaxial silicon wafer is to be improved and that the cut-off part in the peripheral part is to be reduced. Here, the flatness generally may mean a degree of being flat. If the flatness is low, it is not flat, but if the flatness is high, it is understood that it is flat.

As mentioned above, if the ledge part does not extend to the device useable area (or the ledge area is made small), the flatness in the useable area of the epitaxial silicon wafer is increased.

(26) The method of manufacturing the epitaxial wafer according to the above (24) or (25), wherein the predetermined length of the ledge part is variable along a circumferential direction on the opening such that it can be modified in accordance with respective shapes of the semiconductor wafer and the opening.

On the other hand, in the outer peripheral area of the semiconductor wafer, a big change in the shape (e.g., a big change in the thickness due to the chamfered edge) may cause a big change such as an abrupt decrease of the thickness of the epitaxial layer from ore near the position. In such a case, it is possible to manufacture the epitaxial wafer with higher flatness as a result by cancelling out with the big change (abrupt increase) in the thickness of the epitaxial layer according to the change of the length of the ledge part as described above. Here, to be variable along the circumferential direction on the opening may mean, for example, that the distance from the inner face on the top face of the ledge part varies clockwise along the circumferential direction of the opening seen in the plan view.

(27) The apparatus for manufacturing the epitaxial wafer according to any one of the above (24) to (26), wherein the predetermined length of the ledge part is equal to or more than 2 mm and less than 6 mm.

For example, if the length of the ledge part is less than 6 mm, it is possible to keep the position of the point of variation equal to or less than 6 mm from the outer periphery of the epitaxial silicon wafer since the big point of variation of the thickness tends to be formed at the border of the ledge area. Therefore, it is rather easy to keep the flatness high in the useable area of the epitaxial silicon wafer inside the border. Therefore, the point of change of the thickness can be moved out of the device useable area. Thus, it is possible to improve the thickness distribution of the epitaxial layer in the outer peripheral part and prevent deterioration of the flatness by the epitaxial growth. If the length of the ledge part is short, for example, less than 4 mm, the high flatness can be maintained up to the peripheral area.

On the other hand, the ledge part has to keep the function to hold the semiconductor wafer such that it is preferable that at least 2 mm of the length is maintained. However, it is possible to make it even shorter than this if the semiconductor wafer can keep the function to hold the semiconductor wafer.

(28) An apparatus for manufacturing an epitaxial wafer by growing an epitaxial layer with reaction of a semiconductor wafer and a source gas in a reaction furnace comprising: a susceptor having an opening in which the semiconductor wafer is positioned; and a ledge part provided along a circumferential direction of the opening and extending inwardly for a predetermined length, the ledge part provided in a lower part of the opening such that the semiconductor wafer is placed, wherein at least one of both faces of the semiconductor wafer is constituted of a device useable area and the peripheral part surrounding the device useable area, and the predetermined length of the ledge part is adjusted not to reach a position corresponding to a position of the device useable area on the epitaxial wafer.

(29) The apparatus for manufacturing the epitaxial wafer according to the above (28), wherein the predetermined length of the ledge part is equal to or more than 2 mm and less than 6 mm.

As mentioned above, according to the present invention, it is possible to move the point of big change of the thickness of the epitaxial layer outside of the device useable area and to contribute to the uniformization of thickness distribution in the device useable area such that the flatness of the epitaxial wafer may be improved. Also, it is possible to increase (improve) the flatness of the epitaxial wafer by combing with the shape of the semiconductor wafer serving as a substrate. Thus, even though the thickness distribution of the epitaxial layer is not so uniform (the degree of unevenness is high), or the flatness of the semiconductor wafer serving as a substrate is not so high, it is possible to yield much better flatness of the epitaxial wafer as a result by combining both.

Further, according to the present invention, it is possible to reduce the variation and make uniformization in the thickness in the circumferential direction in the peripheral part of the epitaxial layer. Conversely, if the thickness change in the circumferential direction in the peripheral part of the epitaxial layer is desired, it is possible to form a desirable thickness distribution in the periphery part of the epitaxial layer by utilizing the above apparatus and method.

In the above, the embodiments of the invention conceived by the present inventor is explained. However, the present invention is not limited to such embodiments, and it should be understood that various alternations and modifications could be made without departing the gist of the present invention.

What is claimed is:

1. A method of manufacturing an epitaxial wafer by growing an epitaxial layer by reaction of a semiconductor wafer and a source gas in a reaction furnace comprising:
   providing the semiconductor wafer from an opening of a pocket of a susceptor of the reaction furnace in which the reaction takes place;
   fixing the semiconductor wafer to the susceptor, the susceptor comprising a physical feature for affecting growth of the epitaxial layer on the semiconductor wafer in accordance with a crystal orientation on the semiconductor wafer such that the physical feature changes along a circumferential direction with a predetermined periodic cycle with which a periodic cycle of the crystal orientation of the semiconductor wafer along a circumferential direction thereof is synchronized;
   rotating the susceptor to which the semiconductor wafer is fixed; and
   forming an epitaxial layer on the semiconductor wafer with the source gas as the susceptor is rotated with the semiconductor wafer such that the periodic cycles of the physical feature of the susceptor and the crystal orientation are synchronized so as to reduce difference in an epitaxial formation rate based on the crystal orientation by the periodic cycle of the physical feature.

2. The method of manufacturing the epitaxial wafer according to claim 1, wherein the physical feature comprises a structure or shape changing periodically near an inner face of the opening in accordance with the crystal orientation on the semiconductor wafer.

3. The method of manufacturing the epitaxial wafer according to claim 1, wherein the epitaxial layer is formed at 1120 Celsius or higher temperature.

4. The method of manufacturing the epitaxial wafer according to claim 3, wherein the epitaxial layer is formed as a raw material gas concentration is controlled to be equal to or less than a predetermined concentration.

5. The method of manufacturing the epitaxial wafer according to claim 1, wherein the epitaxial wafer is formed with a silicon wafer substrate of crystal orientation and a variation of a layer thickness of angle periodicity can be reduced.

6. An epitaxial wafer manufactured by the method as recited in claim 1, wherein the manufactured epitaxial wafer has higher flatness than the semiconductor serving as a substrate.

7. An epitaxial wafer manufactured by the method as recited in claim 1, wherein an epitaxial layer thickness distribution in the circumferential direction in a peripheral part of the manufactured epitaxial wafer indicates enough flatness that the epitaxial wafer is suitable for a device process.

8. An epitaxial wafer manufactured by the method as recited in claim 1, wherein a variation of an epitaxial layer thickness distribution in a circumferential direction in a peripheral part is equal to or less than 0.5%.

9. A method of determining a manufacturing condition for growing an epitaxial layer by reaction of a semiconductor wafer and a source gas in a reaction furnace to manufacture an epitaxial wafer, the method comprising:
   providing the semiconductor wafer from an opening of a pocket of a susceptor of the reaction furnace in which the reaction takes place;
   fixing the semiconductor wafer to the susceptor, the susceptor comprising a physical feature for affecting growth of the epitaxial layer on the semiconductor wafer in accordance with a crystal orientation on the semiconductor wafer such that the physical feature changes along a circumferential direction with a predetermined periodic cycle with which a periodic cycle of the crystal orientation of the semiconductor wafer along a circumferential direction thereof is synchronized;
   rotating the susceptor to which the semiconductor wafer is fixed;
   manufacturing an epitaxial wafer in a predetermined initial manufacturing condition by forming an epitaxial layer on the semiconductor wafer with the source gas as the susceptor is rotated with the semiconductor wafer such that the periodic cycles of the physical feature of the susceptor and the crystal orientation are synchronized so as to reduce difference in an epitaxial formation rate based on the crystal orientation by the periodic cycle of the physical feature;
   measuring flatness along a circumferential direction in a peripheral part of the manufactured epitaxial wafer in the initial condition;
   determining an effect on the flatness in the peripheral part of the manufactured epitaxial wafer with respect to the physical feature; and
   determining the manufacturing condition to increase the flatness in the peripheral part of the epitaxial wafer by adjusting the physical feature in accordance with a result of measured flatness in the peripheral part of the manufactured epitaxial wafer in the predetermined initial manufacturing condition.

10. A method of manufacturing an epitaxial wafer by growing an epitaxial layer with reaction of a semiconductor wafer and a source gas in a reaction furnace to manufacture an epitaxial wafer, the method comprising:
   providing the semiconductor wafer on a ledge part of a susceptor having an opening in which the semiconductor wafer is positioned;
   providing the ledge part at a lower part of the opening such that the ledge part extends with a predetermined length inside of the opening of the susceptor and the semiconductor wafer is placed thereon; and
   controlling an epitaxial layer thickness grown by changing the predetermined length of the ledge part.

11. The method of manufacturing the epitaxial wafer according to claim 10:
   wherein at least one of both faces of the semiconductor wafer is constituted of a device useable area and the peripheral part surrounding the device useable area; and
   wherein the predetermined length of the ledge part is adjusted not to reach a position corresponding to a position of the device useable area on the epitaxial wafer.

12. The method of manufacturing the epitaxial wafer according to claim 10, wherein the predetermined length of the ledge part is variable along a circumferential direction on the opening such that it can be modified in accordance with respective shapes of the semiconductor wafer and the opening.

13. The method of manufacturing the epitaxial wafer according to claim 10, wherein the predetermined length of the ledge part is equal to or more than 2 mm and less than 6 mm.

14. The method of manufacturing the epitaxial wafer according to claim 10, wherein the predetermined length of the ledge part is equal to 3 mm.

15. The method of manufacturing the epitaxial wafer according to claim 1, wherein the physical feature of the susceptor comprises spot facing depth, pocket width, or thermal capacity.

16. The method of manufacturing the epitaxial wafer according to claim 15, wherein the physical feature of the susceptor is the spot facing depth such that the depth changes with a cycle of 90 degree in the circumferential direction.

17. The method of manufacturing the epitaxial wafer according to claim 15, wherein the physical feature of the susceptor is the pocket width such that the width changes with a cycle of 90 degree in the circumferential direction.

18. The method of manufacturing the epitaxial wafer according to claim 15, wherein the physical feature of the susceptor is the thermal capacity such that the thermal capacity changes with a cycle of 90 degree in the circumferential direction.

19. The method of manufacturing the epitaxial wafer according to claim 15, wherein the physical feature of the susceptor is the spot facing depth such that the depth changes with a cycle of 180 degree in the circumferential direction.

20. The method of manufacturing the epitaxial wafer according to claim 15, wherein the physical feature of the susceptor is the pocket width such that the width changes with a cycle of 180 degree in the circumferential direction.

21. The method of manufacturing the epitaxial wafer according to claim 15, wherein the physical feature of the susceptor is the thermal capacity such that the thermal capacity changes with a cycle of 180 degree in the circumferential direction.

* * * * *